United States Patent
Sakata et al.

(10) Patent No.: US 6,407,482 B2
(45) Date of Patent: *Jun. 18, 2002

(54) MICRO-RELAY AND METHOD FOR MANUFACTURING THE SAME

(75) Inventors: Minoru Sakata; Takuya Nakajima; Tomonori Seki; Teruhiko Fujiwara, all of Kyoto (JP)

(73) Assignee: Omron Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/254,030
(22) PCT Filed: Aug. 26, 1997
(86) PCT No.: PCT/JP97/02964

§ 371 (c)(1),
(2), (4) Date: Feb. 26, 1999

(87) PCT Pub. No.: WO98/09312

PCT Pub. Date: Mar. 5, 1998

(30) Foreign Application Priority Data

Aug. 27, 1996 (JP) .............................. 8-224845
Aug. 27, 1996 (JP) .............................. 8-225286
Aug. 27, 1996 (JP) .............................. 8-225288

(51) Int. Cl.$^7$ ............................................. H01L 41/08
(52) U.S. Cl. ................... 310/328; 310/307; 310/348; 310/311
(58) Field of Search ................... 310/306, 307, 310/311, 328, 348

(56) References Cited

U.S. PATENT DOCUMENTS 5,398,011 A * 3/1995 Kimura et al. ................ 335/79
5,489,812 A * 2/1996 Furuhata et al. ............ 310/309
5,666,258 A   9/1997 Gevatter et al. ............ 361/207
5,909,078 A * 6/1999 Wood et al. ................ 310/307
5,955,817 A * 9/1999 Dhuler et al. ............... 310/307
5,994,816 A * 11/1999 Dhuler et al. ............... 310/307
6,023,121 A * 2/2000 Dhuler et al. ............... 310/307
6,057,520 A * 5/2000 Goodwin-Johansson .... 200/181

FOREIGN PATENT DOCUMENTS

| DE | 42 05 340 C1 | 8/1993 | H01H/59/00 |
| DE | 43 05 033 A1 | 10/1993 | H01H/59/00 |
| JP | 58-155743 | 10/1983 | H01H/57/00 |
| JP | 06-338244 | 6/1994 | H01H/61/02 |
| JP | 6-251673 | * 9/1994 | 310/307 |
| JP | 6-267383 | * 9/1994 | 310/307 |
| JP | 07-029473 | 1/1995 | H01H/50/04 |
| JP | 8-506690 | 7/1996 | H01H/59/00 |
| JP | 8-509093 | 9/1996 | H01H/59/00 |
| JP | 09-092116 | 4/1997 | H01H/59/00 |
| JP | 09-147720 | 6/1997 | H01H/57/00 |
| JP | 10-106184 | * 4/1998 | 310/330 |
| JP | 10-312734 | * 11/1998 | 310/309 |
| WO | WO 94/18688 | 8/1994 | H01H/59/00 |
| WO | 94/19819 | 9/1994 | H01H/59/00 |

* cited by examiner

Primary Examiner—Thomas M. Dougherty
(74) Attorney, Agent, or Firm—Morrison & Foerster LLP

(57) ABSTRACT

A thin plate-shaped substrate 21 comprised of a monocrystal is provided with a piezoelectric element 24, and both ends of a movable piece 20 whose one surface is provided with a movable contact 25 are fixed and supported to a base 11. Then, by curving the movable piece 20 via the piezoelectric element 24, the movable contact 25 is brought in and out of contact with a pair of fixed contacts 38 and 39 that face the movable contact. With this arrangement, a subminiature micro-relay having a mechanical contact mechanism that has a small resistance in turning on the contact and the desired vibration resistance, frequency characteristic and insulating property can be obtained.

27 Claims, 47 Drawing Sheets

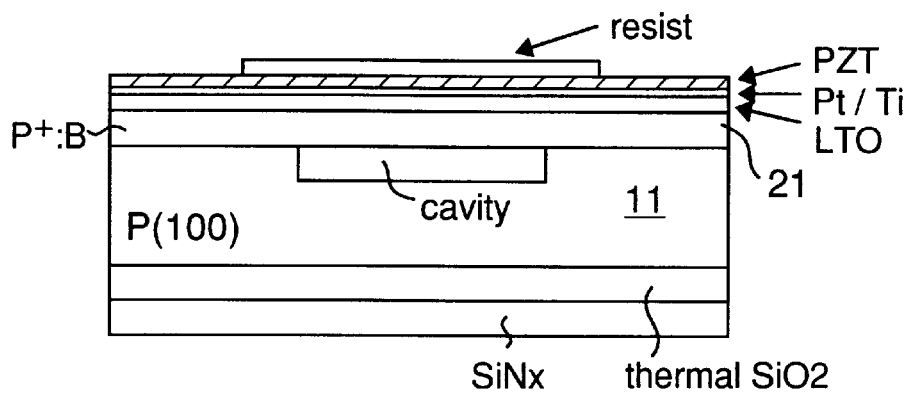
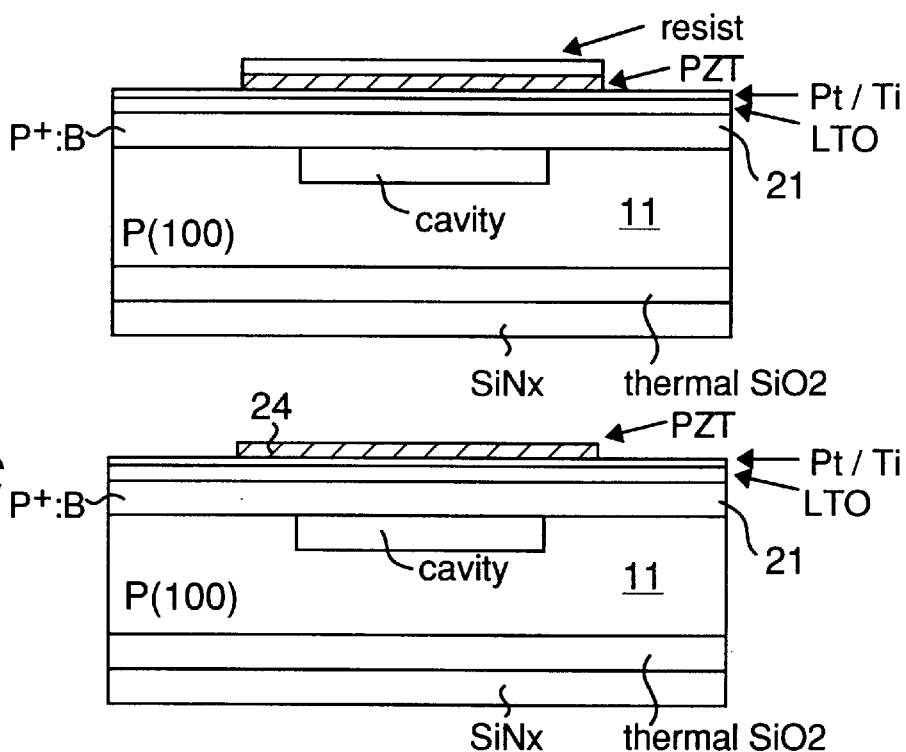
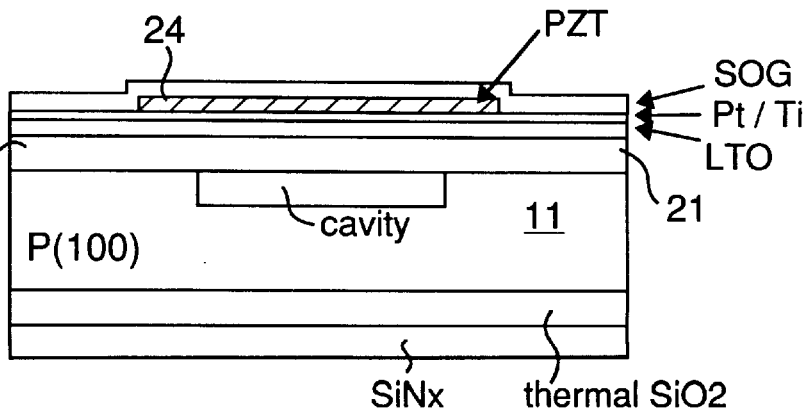

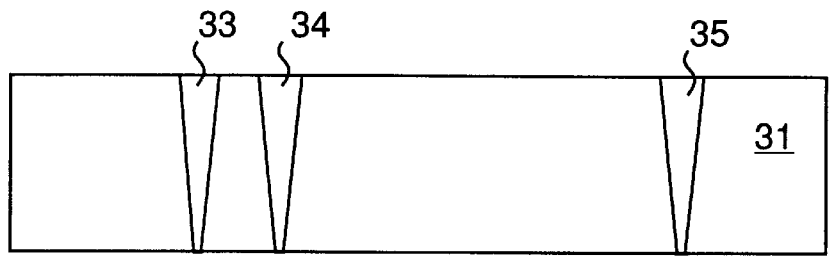
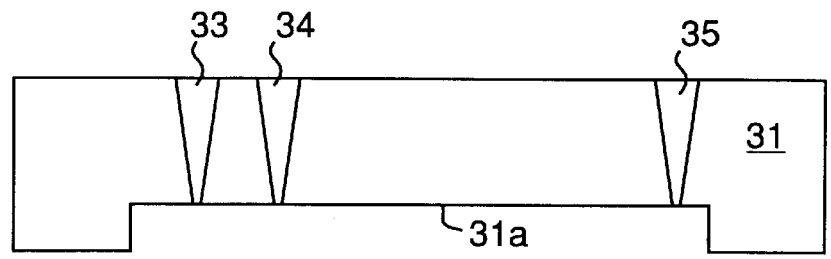
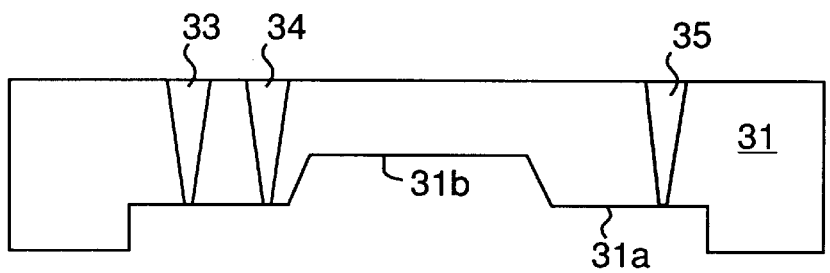
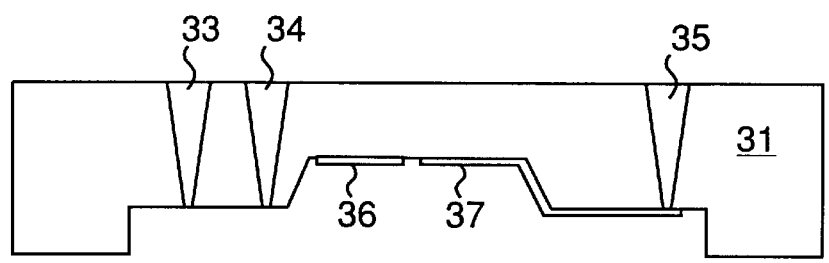
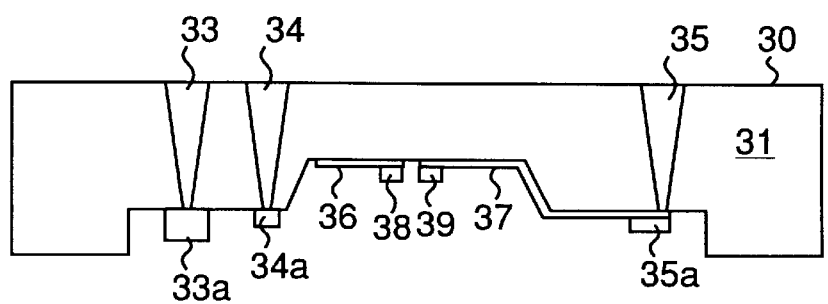

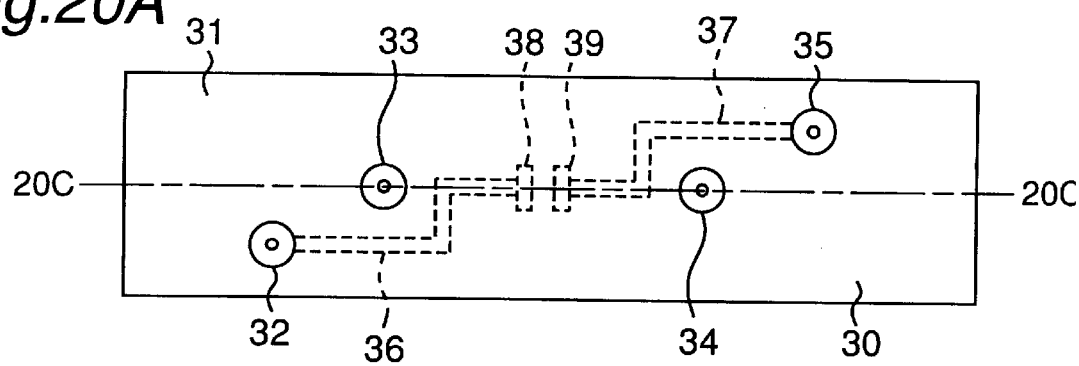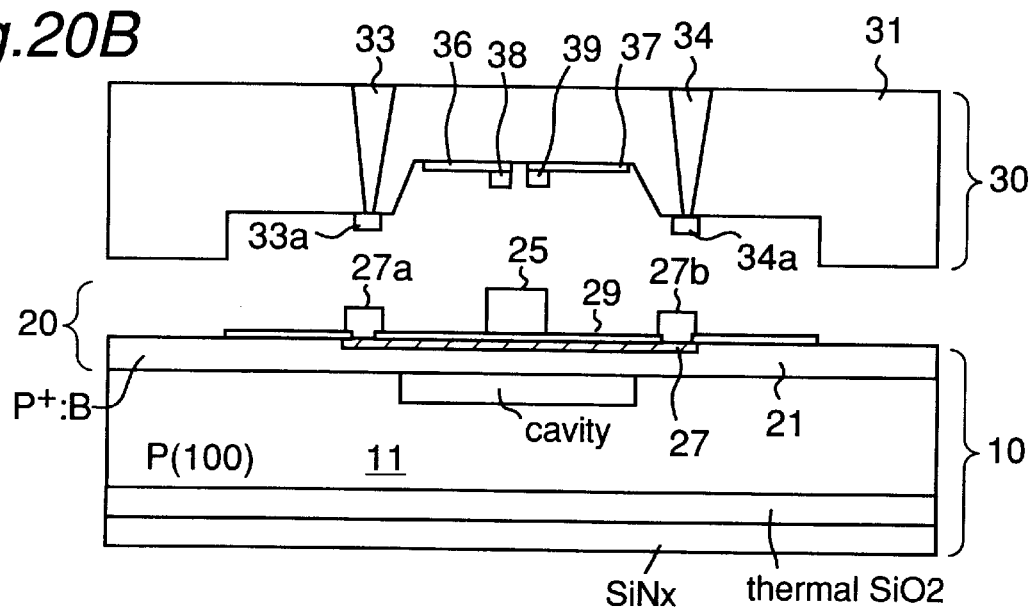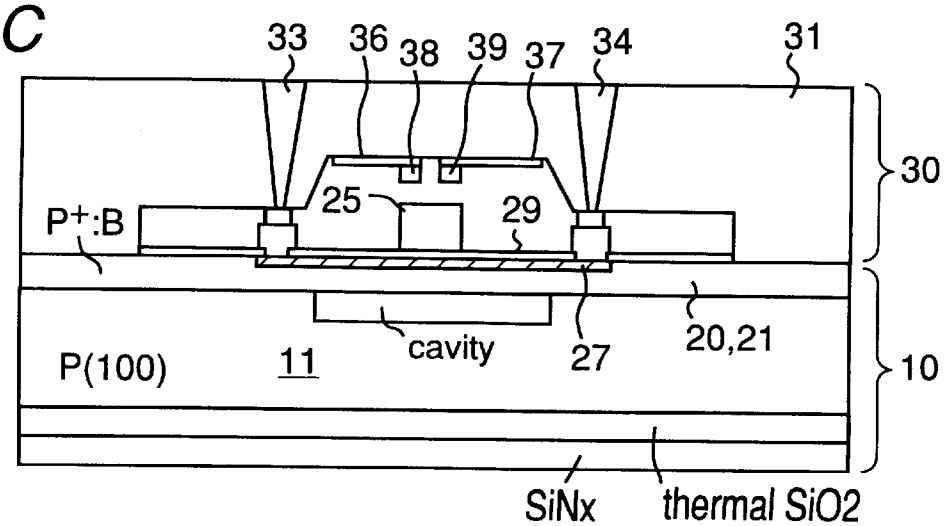

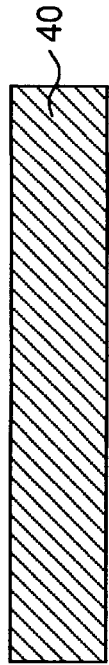
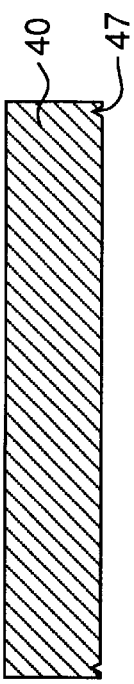
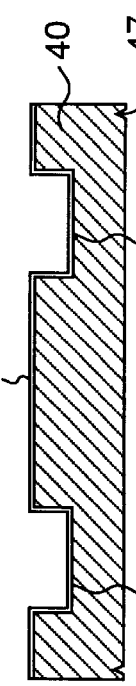
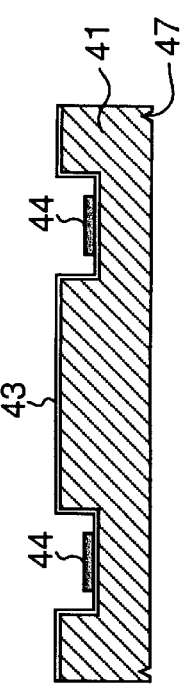
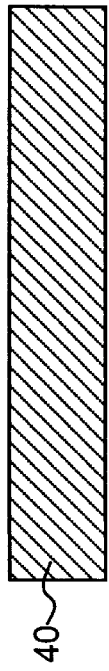
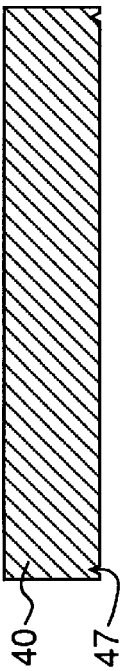
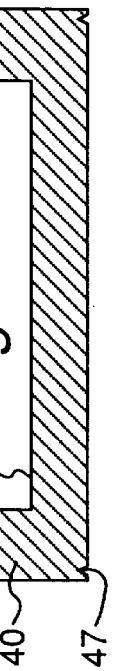
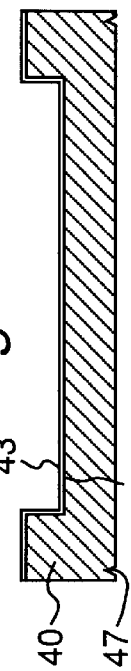
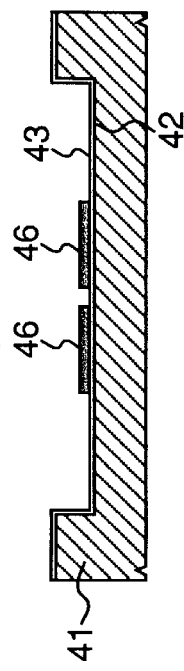

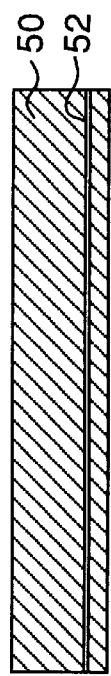
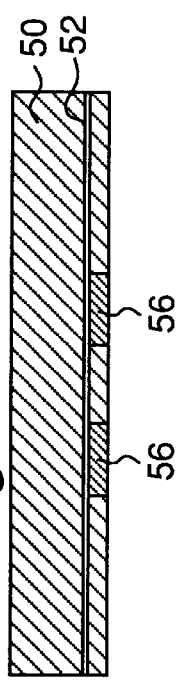
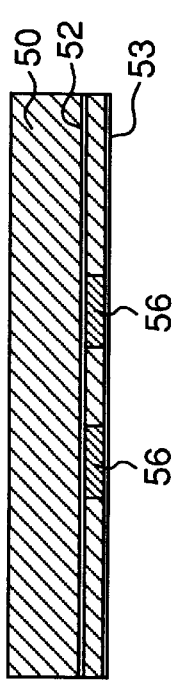
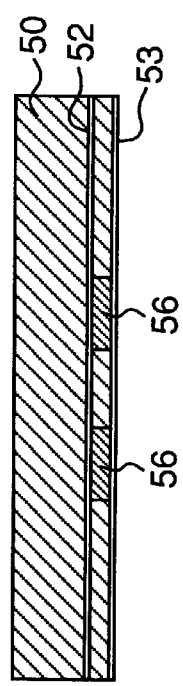
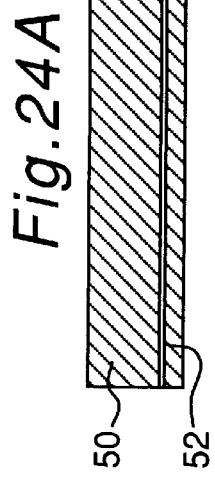
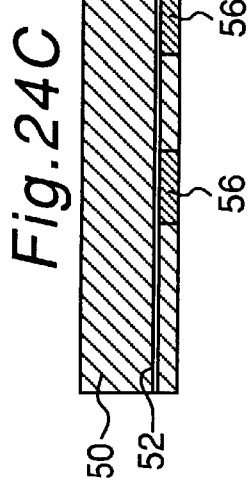
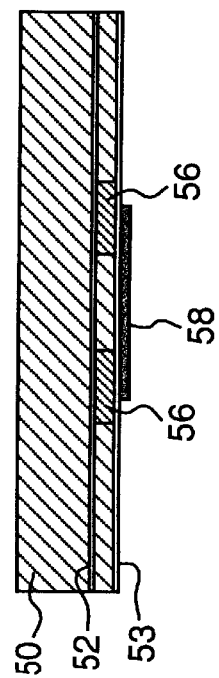

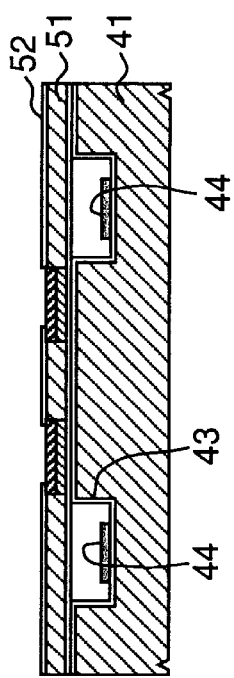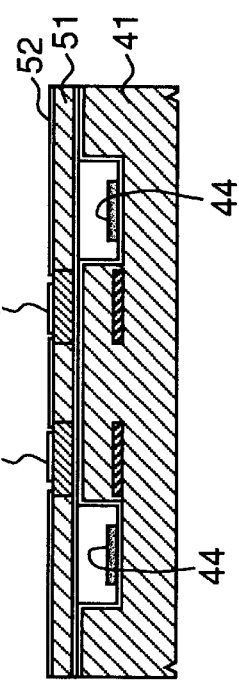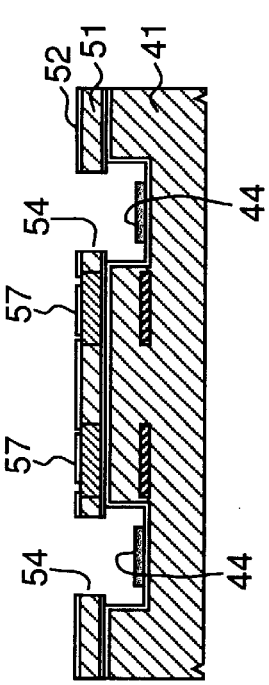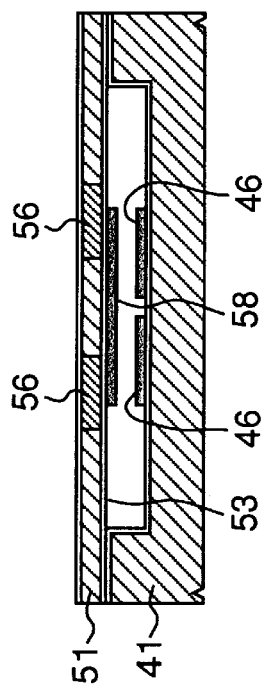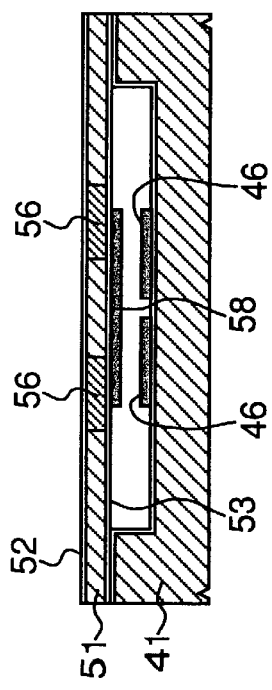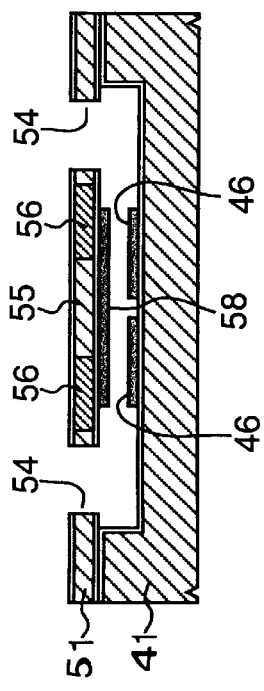

MICRO-RELAY AND METHOD FOR MANUFACTURING THE SAME

TECHNICAL FIELD

The present invention relates to electronic components such as micro-relays, and in particular micro-relays, matrix relays and micro-relay chips having contacts which are opened and closed by curving a movable piece constructed of a monocrystal thin plate-shaped substrate.

BACKGROUND ART

Conventionally, as a relay, there has been, for example, an electromagnetic relay utilizing an electromagnet. However, the relay, which necessitates mechanical components, is hard to be reduced in size. Furthermore, the movable components of the mechanical components, which have great inertial forces, tend to disadvantageously cause fatigue failure and lack in durability.

There is otherwise existing a semiconductor switching device as a sort of small-sized relay, however, the device disadvantageously has a great resistance in turning on its contact, degraded frequency characteristics and a low insulating property between its input and output and between its terminals of an identical polarity.

In view of the aforementioned problems, the present invention has a first object to provide a subminiature micro-relay that has a small resistance in turning on its contact as well as the desired vibration resistance, frequency characteristics and insulating property.

Conventionally, as a matrix relay, there has been, for example, the one disclosed in the prior art reference of Japanese Patent Laid-Open Publication No. HEI 7-29473. The matrix relay is an electromagnet array comprised of a required number of electromagnets obtained by winding a solenoid around a fixed contact core, where the contacts are opened and closed by driving a movable spring contact provided on a strip.

However, the above-mentioned matrix relay has the electromagnet obtained by winding the solenoid around the fixed contact core as a component, and this puts a limit on compacting the device, and in particular, reduction in thickness.

Most of the components are not flat, meaning that they cannot be stacked in one direction, and this poses the problem that the assembling is troublesome and the productivity is low.

In view of the aforementioned problems, the present invention has a second object to provide a subminiature matrix relay that can be easily assembled.

Further, conventionally, as an electronic component of the micro-relay chip, there has been the one proposed in FIG. 27 and FIG. 28 of Japanese Patent Laid-Open Publication No. HEI 7-299765. That is, the electronic component is a micro-relay obtained by wire-bonding the connecting electrodes of a micro-relay chip to the external terminals of a lead frame and molding them with resin.

However, according to the above-mentioned electronic component, the whole body of the micro-relay chip has been molded with resin, and therefore, heat radiation is hard to be achieved. Therefore, due to the heat generation of the internal components, a malfunction tends to occur and the operating characteristics tend to vary.

The above-mentioned electronic component is required to individually connect by wire bonding each connecting electrode of the micro-relay chip to each external terminal formed on the lead frame. For this reason, there is a great number of working processes, and the productivity is low. Furthermore, wire disconnection tends to be caused by vibration or the like, and this poses the problem that the reliability is low.

In view of the aforementioned problems, the present invention has a third object to provide an electronic component that can prevent the malfunction and the variation in operating characteristics due to heat and has high productivity and reliability.

DISCLOSURE OF THE INVENTION

In order to achieve the aforementioned first object, the first feature of the present invention is a micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit.

According to the first feature of the present invention, the contacts can be opened and closed by curving the thin plate-shaped substrate constructed of the monocrystal, and therefore, the device can be easily compacted. Furthermore, the inertial force of the movable piece constructed of the thin plate-shaped substrate is small, and therefore, fatigue failure is hard to occur, so that a micro-relay having an excellent durability can be obtained.

The movable piece has its both ends supported, and therefore, a micro-relay that is hard to receive the influence of external vibration or the like and has stable operating characteristics can be obtained.

Furthermore, there can be obtained a micro-relay that has a very small resistance in turning on the contact as compared with the semiconductor switching element, high frequency characteristics and insulating properties between its input and output and between its terminals of an identical polarity.

A second feature is a micro-relay in which a device wafer is connected and integrated with an opening edge portion of a box-shaped base comprised of a handle wafer via an insulating film, and the movable piece is formed by cutting a pair of slits through the device wafer.

According to the second feature, the movable piece is formed on the device wafer connected and integrated with the box-shaped base of the handle wafer. This arrangement allows the manufacturing processes to be wholly achieved by the semiconductor manufacturing techniques.

The handle wafer and the device wafer are connected and integrated with each other via the insulating film, and therefore, the wafers can be connected and integrated with each other at a temperature lower than in directly connecting and integrating silicon objects. For this reason, a material having a low melting point can be used for the fixed contact and the movable contact, allowing the degree of freedom of design to be expanded.

A third feature is a micro-relay in which the device wafer is formed with a connecting use opening portion in a position opposite to a connecting pad of the fixed contact provided on a bottom surface of the handle wafer.

According to the third feature, connection to the outside can be achieved by utilizing wire bonding via the connecting use opening portion provided at the device wafer. This allows the wiring structure of the micro-relay itself to be simplified for easy manufacturing.

A fourth feature is a micro-relay in which the inside surface of the connecting use opening portion is covered with an insulating film.

According to the fourth feature, the inside surface of the connecting use opening portion is covered with an insulating film. Therefore, even when wire bonding is performed, the wire is not brought in contact with the silicon layer, and it is not interfered by the driving use power source.

A fifth feature is a micro-relay in which a cooling fin is formed on the upper surface of the device wafer.

According to the fifth feature, heat generated from the movable piece speedily dissipates to the outside via the cooling fin formed on the upper surface of the device wafer. This improves the operating characteristics in the restoration stage.

Even when micro-relays are integrated with each other, the cooling fin efficiently radiates heat, so that malfunction due to overheat can be prevented.

A sixth feature is a micro-relay in which the movable piece is previously curved and urged so as to bring a movable contact provided on its one surface in contact with a fixed contact that faces the movable contact.

According to the sixth feature, the thin plate-shaped substrate is previously curved to bring the movable contact in contact with the fixed contact, and therefore, a self-retaining type micro-relay can be obtained, allowing the power consumption to be remarkably reduced.

A seventh feature is a micro-relay in which a pair of pivot axes that are coaxially provided projecting roughly from a center portion between both side edge portions of the movable contact are supported on the base, one side half of the thin plate-shaped substrate is previously curved and urged upward, the remaining side half is previously curved and urged downward and the one side halves are simultaneously reversely buckled via the driving means, thereby alternately making and breaking two electric circuits.

According to the seventh feature, the one side half of the thin plate-shaped substrate can be simultaneously reversely buckled for opening and closing the contacts, and this allows the simultaneous making and breaking of a plurality of electric circuits.

An eighth feature is a micro-relay in which the driving means is a piezoelectric element laminated on one surface of the thin plate-shaped substrate.

According to the eighth feature, the movable piece is curved by the piezoelectric element, and this allows the obtainment of a micro-relay that can save the power consumption attributed to heat generation and has good energy efficiency.

A ninth feature is a micro-relay in which the driving means is a heater layer formed on one surface of the thin plate-shaped substrate.

According to the ninth feature, the movable piece is curved by only the heater layer, and this allows the obtainment of a micro-relay that necessitates a reduced number of manufacturing processes and has a high productivity.

A tenth feature is a micro-relay in which the driving means is comprised of a heater layer formed on one surface of the thin plate-shaped substrate and a driving layer formed by laminating a metal material on the heater layer via an insulating film.

According to the tenth feature, the driving layer is formed by laminating the metal material having a high coefficient of thermal expansion, and this allows the obtainment of a micro-relay that has an excellent response characteristic and a great contact pressure.

An eleventh feature is a micro-relay in which the heater layer of the driving means is comprised of a metal material such as platinum or titanium or a polysilicon laminated on the one surface of the thin plate-shaped substrate via an insulating film.

According to the eleventh feature, the heater layer is formed by laminating the metal material or polysilicon on the one surface of the thin plate-shaped substrate, and this allows the obtainment of a heater layer that has a high dimensional accuracy. Therefore, a micro-relay having uniform operating characteristics can be obtained.

A twelfth feature is a micro-relay in which the driving means is a heater section comprised of a diffused resistor formed inside the thin plate-shaped substrate.

According to the twelfth feature, the driving means is the diffused resistor formed inside the thin plate-shaped substrate made of the monocrystal. Therefore, the generated heat can be effectively utilized, allowing the obtainment of a micro-relay having a small heat loss.

A thirteenth feature is a micro-relay in which an insulating film is formed on at least one of the front surface or the rear surface of the movable piece, the surface being formed with the movable contact.

According to the thirteenth feature, the insulating film ensures the insulating property and prevents the leak of heat generated from the driving means.

A fourteenth feature is a micro-relay in which silicon compound films that are made of a silicon oxide film, a silicon nitride film or the like and have different thickness values are formed on the front and rear surfaces of the movable piece.

According to the fourteenth feature, the silicon compound film is formed on the front and rear surfaces of the movable piece, and this prevents the leak of heat generated from the movable piece, allowing the obtainment of a micro-relay having a good thermal efficiency.

A fifteenth feature is a micro-relay in which a silicon compound film comprised of a silicon oxide film, a silicon nitride film or the like for giving at least one side of the movable piece a compressive stress in proximity to a critical value at which driving starts.

According to the fifteenth feature, the compressive stress in proximity to the critical value at which driving starts can be obtained from the silicon compound film, and this allows the obtainment of a micro-relay having a good response characteristic.

A sixteenth feature is a micro-relay in which at least one adiabatic slit is formed near both end portions of the movable piece.

According to the sixteenth feature, the adiabatic slit is formed near both the end portions of the movable piece. Therefore, the heat conducting area becomes small to allow the prevention of heat conduction from both the end portions of the movable piece. As a result, the energy can be effectively utilized, thereby allowing the response characteristic to be improved.

A seventeenth feature is a micro-relay in which the adiabatic slit is filled with a polymer material having low heat conductivity.

According to the seventeenth feature, the adiabatic slit is filled with the polymer material having low heat conductivity. With this arrangement, the energy can be more effectively utilized, thereby allowing the response characteristic to be improved.

An eighteenth feature is a micro-relay in which the movable piece is extended across the base via an adiabatic silicon compound portion formed in both end portions of the movable piece.

According to the eighteenth feature, heat is hard to be conducted to the base from both the end portions of the movable piece, so that the utilization of energy and the improvement of the operating characteristics can be achieved.

A nineteenth feature is a micro-relay in which the movable piece is provided with a slit in the vicinity of the movable contact, and a pair of hinge portions for pivotally supporting the movable contact are coaxially formed.

According to the nineteenth feature, the movable contact is pivotally supported, and this eliminates the one-side hitting of the movable contact against the fixed contact and improves the contact reliability.

A twentieth feature is a micro-relay in which a root portion of the movable piece is provided with a radius for alleviating stress concentration.

According to the twentieth feature, by providing the root portion of the movable piece with the radius, the fatigue failure due to stress concentration is hard to occur, so that the operating life is prolonged.

A twenty-first feature is a micro-relay manufacturing method characterized by connecting and integrating via an insulating film a device wafer with an opening edge portion of a box-shaped base comprised of a handle wafer and thereafter cutting a pair of parallel slits through the device wafer, thereby forming a movable piece.

According to the twenty-first feature, there is the effect that a micro-relay which can be processed wholly through the semiconductor manufacturing processes and has a high dimensional accuracy can be obtained.

Furthermore, in order to achieve the aforementioned second object, a twenty-second feature of the present invention is a matrix relay characterized by providing a thin plate-shaped substrate comprised of a monocrystal with a driving means, arranging in parallel a plurality of movable pieces whose one surface is provided with a movable contact in an insulated state, fixing and supporting on a base both ends of the movable pieces, individually curving the movable pieces via the driving means, and thereby bringing the movable contact in and out of contact with a fixed contact formed on a ceiling surface of a cover positioned above the base, for making and breaking an electric circuit.

A twenty-third feature is a micro-relay in which the driving means is a piezoelectric element laminated on one surface of the thin plate-shaped substrate.

A twenty-fourth feature is a micro-relay in which the driving means is comprised of a heater layer formed on one surface of the thin plate-shaped substrate.

A twenty-fifth feature is a micro-relay in which the driving means is comprised of a heater layer formed on one surface of the thin plate-shaped substrate and a driving layer formed by laminating a metal material on the heater layer via an insulating film.

According to the twenty-second, twenty-third, twenty-fourth and twenty-fifth features of the present invention, the contacts can be opened and closed by curving the movable piece constructed of the monocrystal thin plate-shaped substrate, and this allows the easy compacting of the device.

Furthermore, since the inertial force of the movable piece is small, the fatigue failure is hard to occur and the operating life is prolonged.

Furthermore, the movable piece has its both ends fixed and supported, and this allows the obtainment of a micro-relay that is hard to receive the influence of external vibration or the like and has stable operating characteristics.

In particular, according to the twenty-fifth feature, the driving layer made of the metal material is provided, and therefore, the operating characteristics become quick, and this improves the response characteristic.

A twenty-sixth feature is a matrix relay in which the driving means is made electrically connectable on a surface of the cover via a through hole provided at the cover.

A twenty-seventh feature is a matrix relay in which the fixed contact is made electrically connectable on a front surface of the cover via a through hole provided at the cover.

According to the twenty-sixth and twenty-seventh features, the electrical connection of the internal components can be performed on the surface of the cover, and this allows the connecting work to be easy.

A twenty-eighth feature is a matrix relay in which an upper end portion of the through hole exposed to the surface of the cover is electrically connected to a connecting pad provided on the surface of the cover via a printed wiring line formed on the surface of the cover.

According to the twenty-eighth feature, the connection to the external device can be performed in the desired position via the connecting pad provided on the surface of the cover, and this has the effect of convenience.

In order to achieve the aforementioned third object, a twenty-ninth feature of the present invention is an electronic component characterized by connecting and integrating a cover made of a glass material with a base made of a silicon material and resin-molding an electronic component chip assembled with an internal component on a substructure so that the cover is coated with the mold and the bottom surface of the base is exposed.

According to the twenty-ninth feature, the bottom surface of the base made of the silicon material having a heat conductivity higher than that of the glass material is exposed to the outside of the substructure. This allows the obtainment of an electronic component that is easy to radiate heat and able to prevent the occurrence of malfunction and a variation in operating characteristics.

A thirtieth feature is an electronic component in which the internal component is electrically connected to an external terminal of the substructure via a through hole provided at the cover.

According to the thirtieth feature, there is no need for performing the individual electrical connection by wire-bonding in contrast to the prior art example, and the internal components are electrically connected to the external terminal of the substructure via the through hole provided at the cover. This arrangement makes simple connecting work, improves the productivity and improves the connection reliability. In particular, if the external terminal is formed of a lead frame, the working processes are further reduced in number, and the productivity is improved.

A thirty-first feature is an electronic component in which a heat sink is provided on the bottom surface of the base exposed to the outside of the substructure.

According to the thirty-first feature, the heat radiation efficiency via the heat sink for radiating heat is improved. This arrangement has the effect of more effectively preventing the malfunction due to heat and the variation in operating characteristics.

BRIEF DESCRIPTION OF THE DRAWINGS

FIG. 6A through FIG. 6D are sectional views showing the manufacturing processes of the movable contact block shown in FIG. 1;

FIG. 11A through FIG. 11E are sectional views showing the manufacturing processes of the movable contact block shown in FIG. 1;

FIG. 20A is a plan view showing a micro-relay according to a third embodiment of the present invention;

FIG. 20B is a sectional view of the micro-relay bisected;

FIG. 20C is a sectional view taken along the line 20C—20C in FIG. 20A, showing an integrated state;

FIG. 23A through FIG. 23J are sectional views showing the manufacturing processes of the handle wafer of the micro-relay shown in FIG. 21;

FIG. 24A through FIG. 24H are sectional views showing the manufacturing processes of the device wafer of the micro-relay shown in FIG. 21;

FIG. 26A through FIG. 26F are sectional views showing the manufacturing processes after the connection of the wafer shown in FIG. 23A through FIG. 24J;

BEST MODE FOR CARRYING OUT THE INVENTION

Embodiments of the present invention will be described next with reference to the accompanying drawings of FIG. 1 through FIG. 47.

Figure 1:
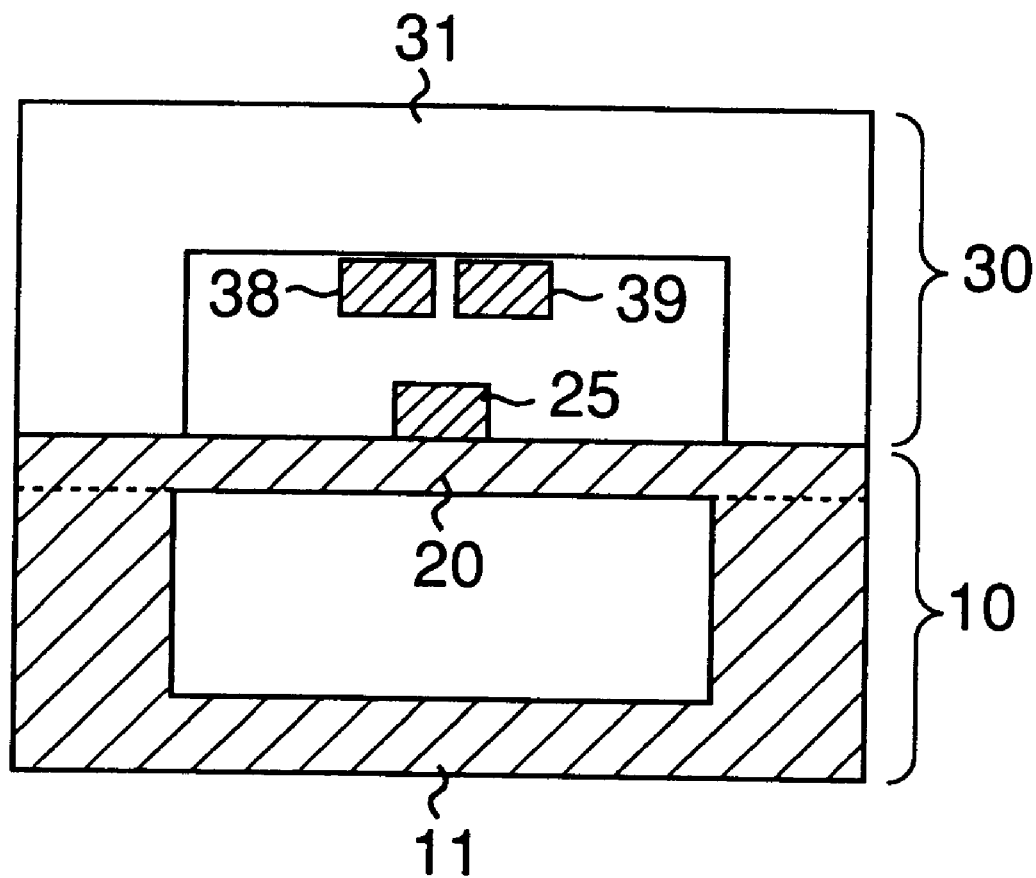
FIG. 1 is a schematic sectional view showing a micro-relay according to a first embodiment of the present invention.

As shown in FIG. 1, a micro-relay according to the first embodiment of the present invention is formed of a movable contact block 10 on the upper surface of which both ends of a movable piece 20 are fixed and supported and a fixed contact block 30 that is anodically bonded to this movable contact block 10. Then, a movable contact 25 provided on the upper surface of the movable piece 20 faces a pair of fixed contacts 38 and 39 formed on the ceiling surface of the fixed contact block 30 while being able to come in and out of contact with the fixed contacts.

Figure 2A:
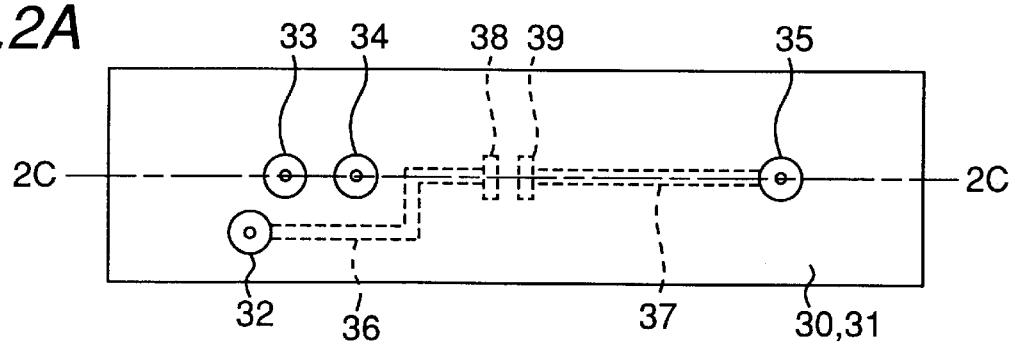
FIG. 2A is a detailed plan view of the micro-relay shown in FIG. 1.
Figure 2B:
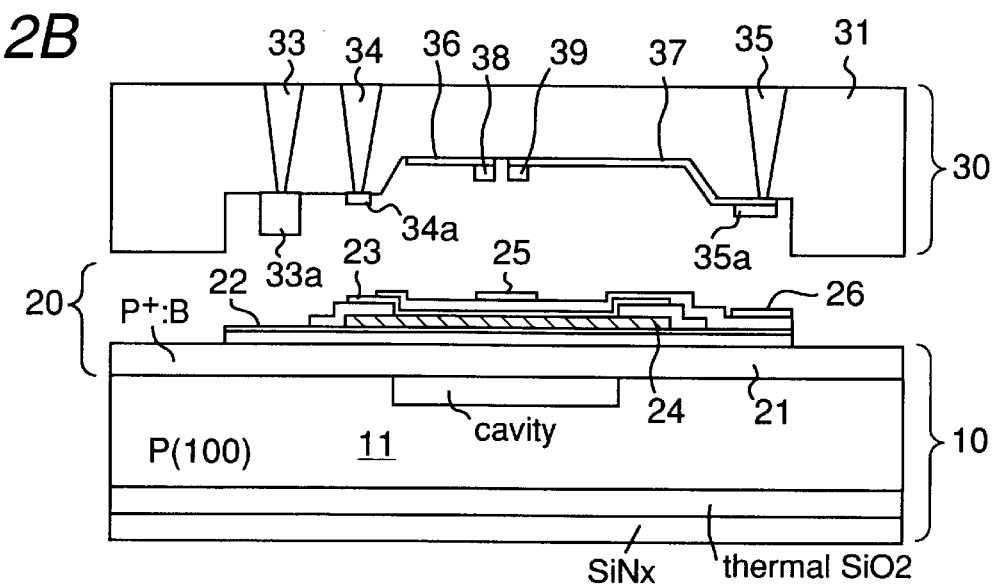
FIG. 2B is a sectional view of the micro-relay bisected.
Figure 2C:
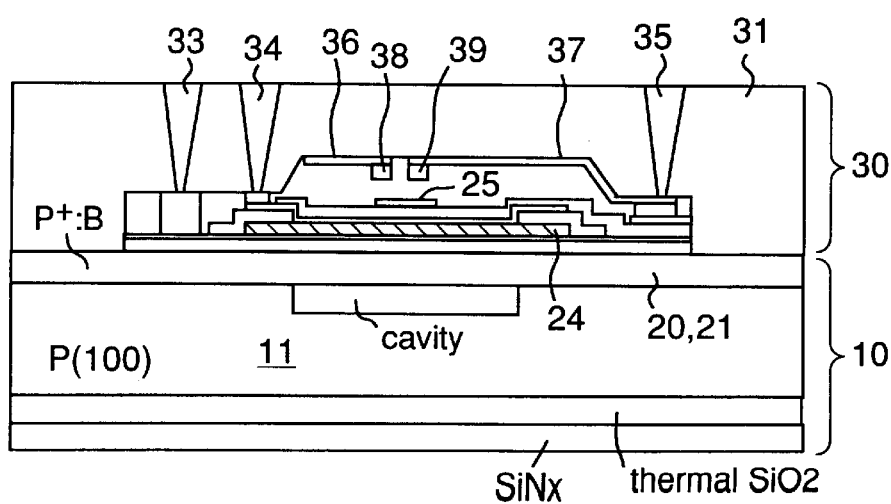
FIG. 2C is a sectional view taken along the line 2C—2C in FIG. 2A, showing an integrated state.
Figure 3A:
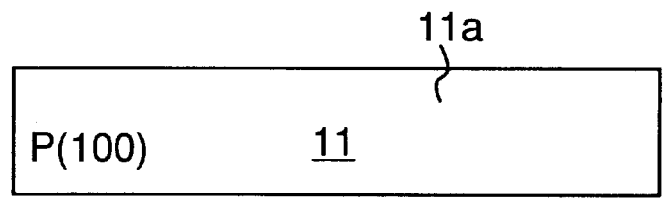
FIG. 3A through FIG. 3E are sectional views showing the manufacturing processes of the movable contact block shown in FIG. 1.
Figure 3B:
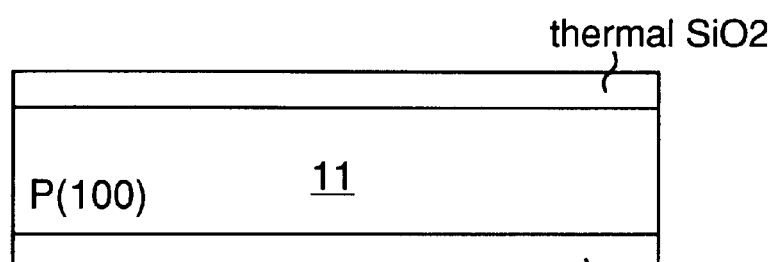
Figure 3C:
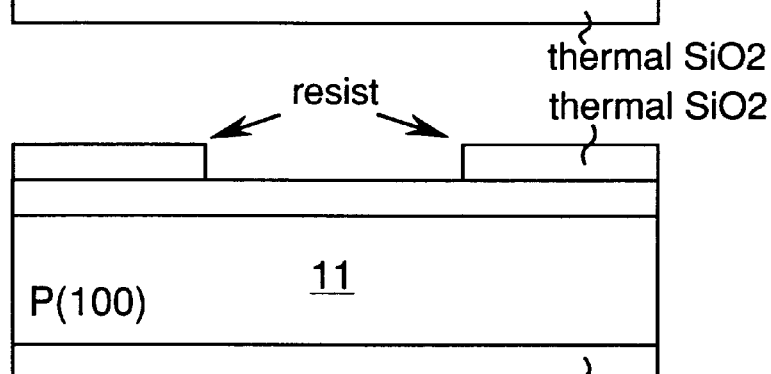
Figure 3D:
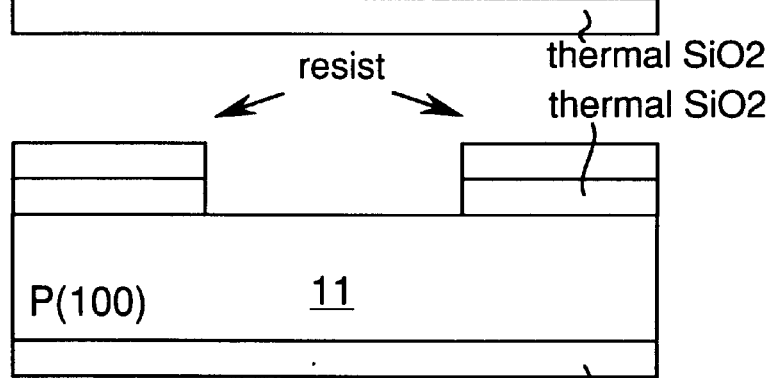
Figure 3E:
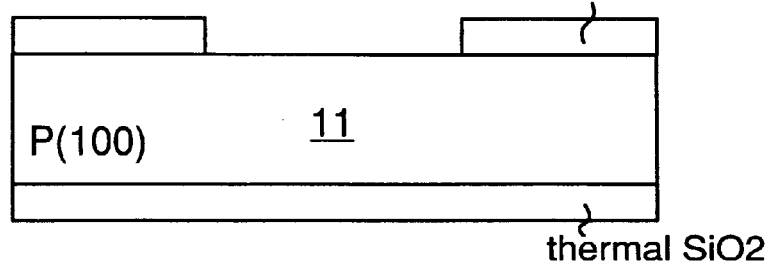

That is, as shown in FIG. 2A through FIG. 2C, a base 11 constituting the movable contact block 10 is made of a wafer of silicon, glass or the like.

The movable piece 20 is provided by integrating a driving means for curving the movable piece in the direction of thickness with the upper surface of a thin plate-shaped substrate 21 made of a monocrystal of silicon or the like via an insulating film. Then, this driving means is constructed by laminating a driving use lower electrode and upper electrodes 22 and 23 on the front and rear surfaces of a piezoelectric element 24.

The fixed contact block 30 is constructed of a wafer 31 of glass, silicon or the like and formed with input and output use through holes 32 and 35 and driving use through holes 33 and 34.

The input and output use through holes 32 and 35 are electrically connected to the fixed contacts 38 and 39, respectively, via printed wiring lines 36 and 37 formed on the lower surface of the wafer 31. Further, the input and output use through holes 32 and 35 are provided with connecting pads 32a (not shown) and 35a, which are constructed of a conductive material and located at their lower end portions, in order to increase the reliability of connection to the printed wiring lines 36 and 37.

On the other hand, the driving use through holes 33 and 34 are provided with connecting pads 33a and 34a, which are constructed of a conductive material and located at their lower end portions, so that the through holes can be connected to the driving use lower and upper electrodes 22 and 23.

According to the present embodiment, the connecting points are aligned in an identical plane via the through holes 32 and 35, and this provides the advantage that the connection is made easy.

A manufacturing method of the above-mentioned micro-relay will be described next.

As shown in FIG. 2A through FIG. 2C, the present embodiment adopts the assembling method of manufacturing the movable contact block 10 and the fixed contact block 30 through different processes and thereafter integrating them with each other by anodic bonding.

It is to be noted that FIG. 3A through FIG. 10C show local sectional views showing only the important parts for the sake of convenience of explanation.

First, for the movable contact block 10 as shown in FIG. 3A through FIG. 3E, a thermal oxidation film (thermal $SiO_2$) that becomes a mask material for TMAH (tetramethyl ammonium hydroxide) etching is formed on the front and rear surfaces of a first silicon wafer 11a that serves as the base 11 and has a thickness of 400 $\mu$m and a crystal orientation of 100. Then, a resist is coated, and a pattern for performing the TMAH etching is formed by photolithography. Next, the thermal oxidation film is etched and thereafter the resist is removed.

Figure 4A:
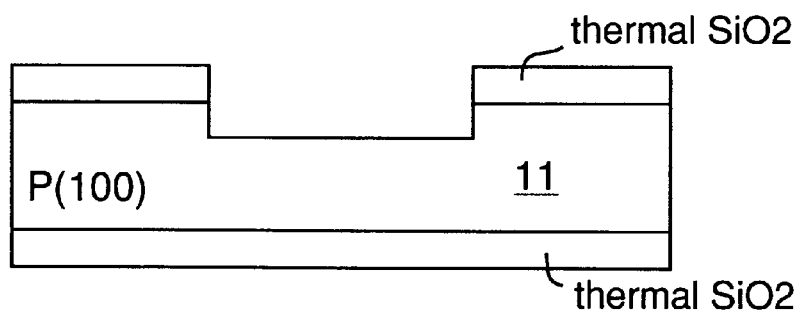
FIG. 4A through FIG. 4D are sectional views showing the manufacturing processes of the movable contact block shown in FIG. 1.
Figure 4B:
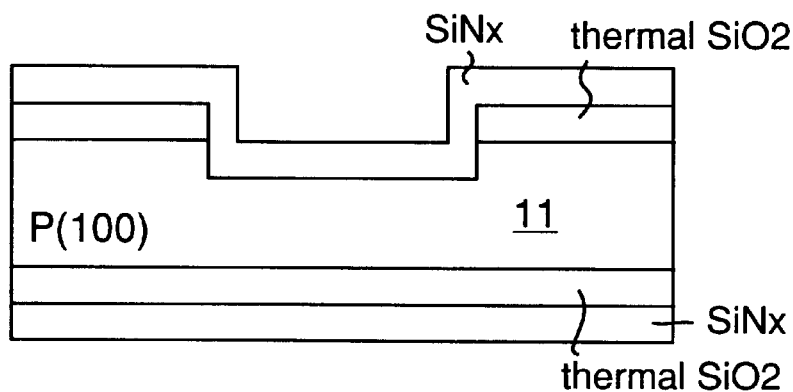
Figure 4C:
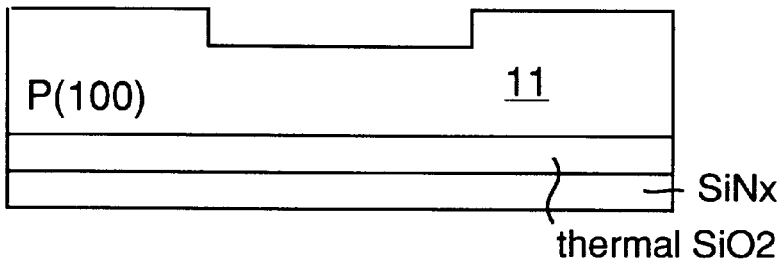
Figure 4D:
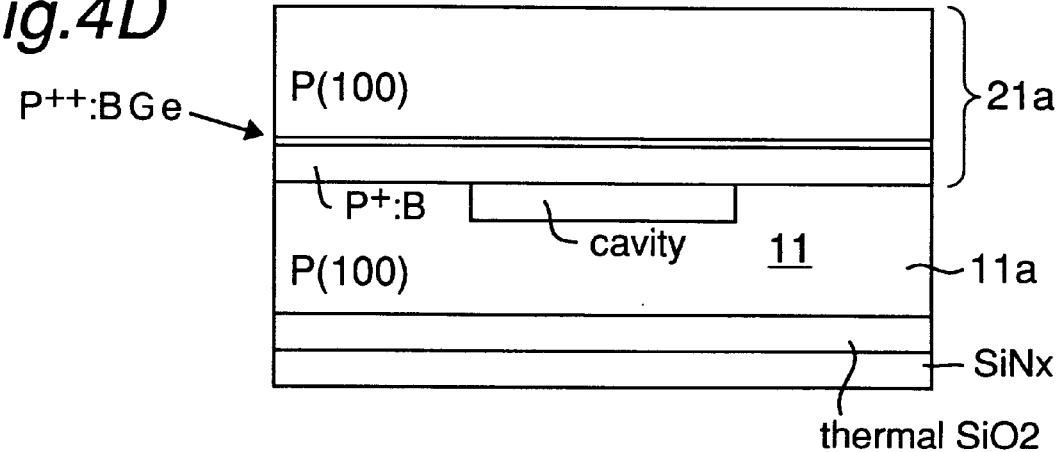
Figure 5A:
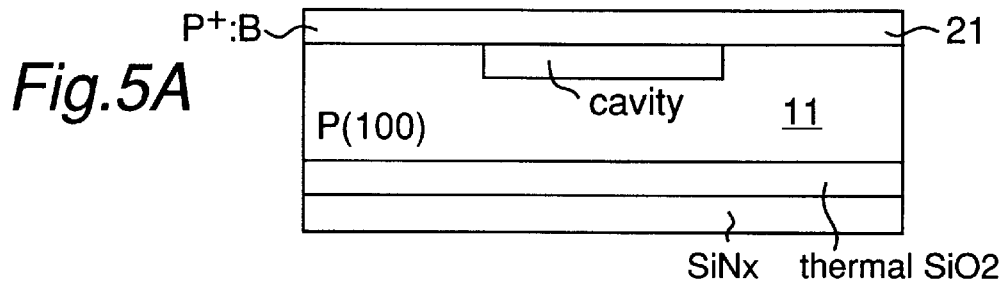
FIG. 5A through FIG. 5D are sectional views showing the manufacturing processes of the movable contact block shown in FIG. 1.
Figure 5B:
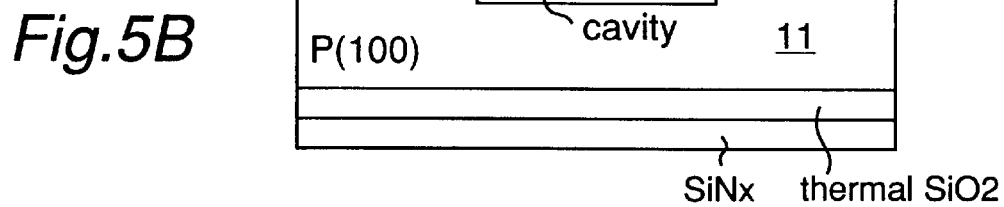
Figure 5C:
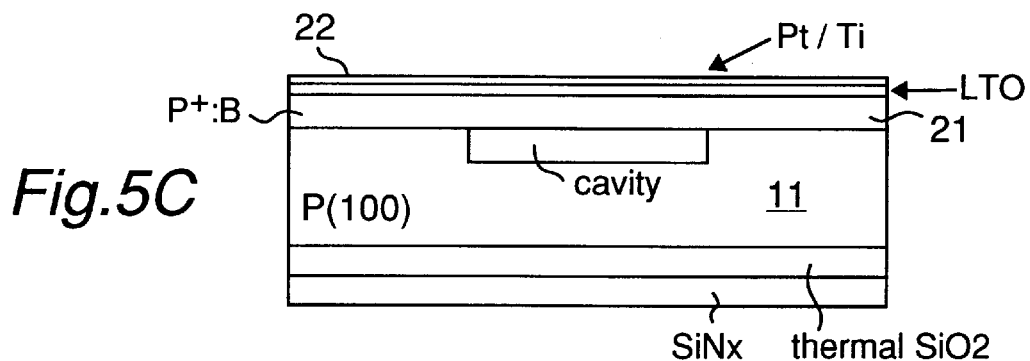
Figure 5D:
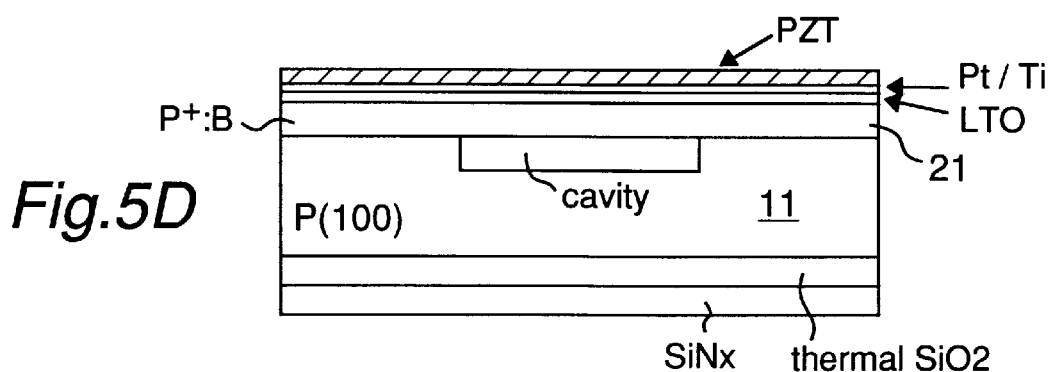
Figure 7A:
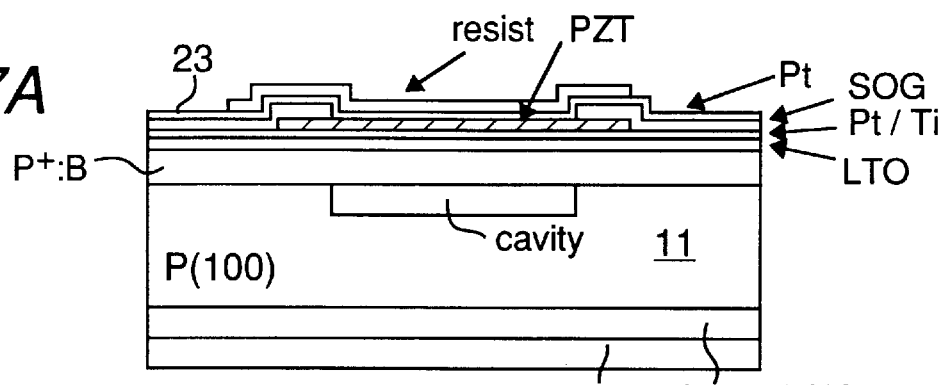
FIG. 7A through FIG. 7D are sectional views showing the manufacturing processes of the movable contact block shown in FIG. 1.
Figure 7B:
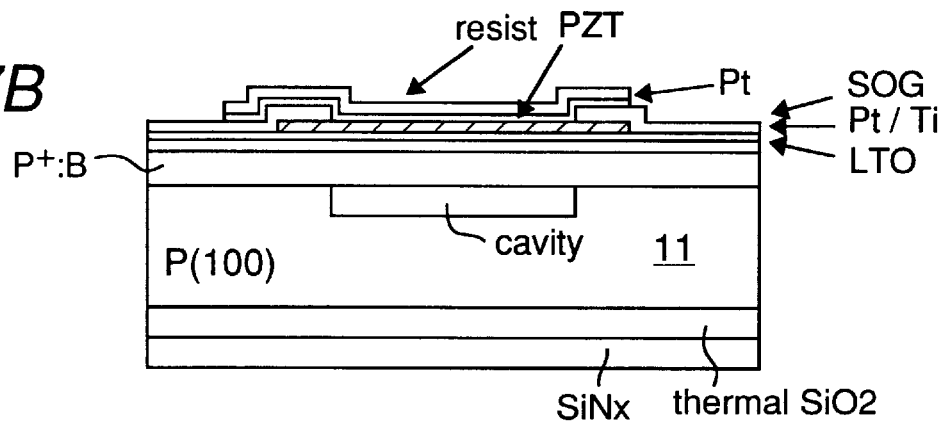
Figure 7C:
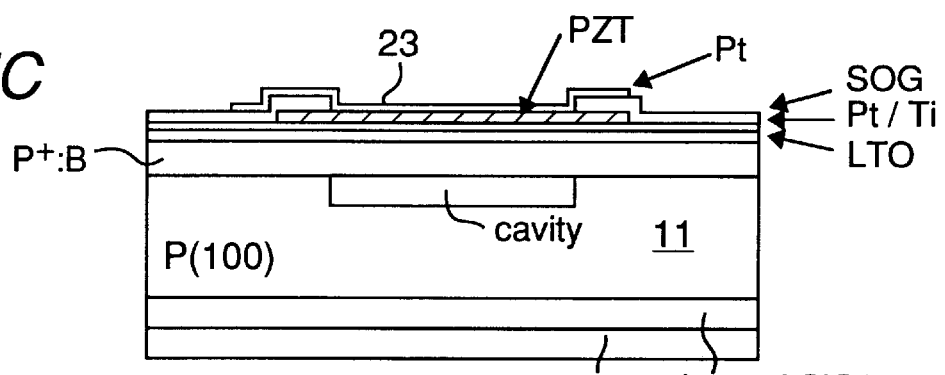
Figure 7D:
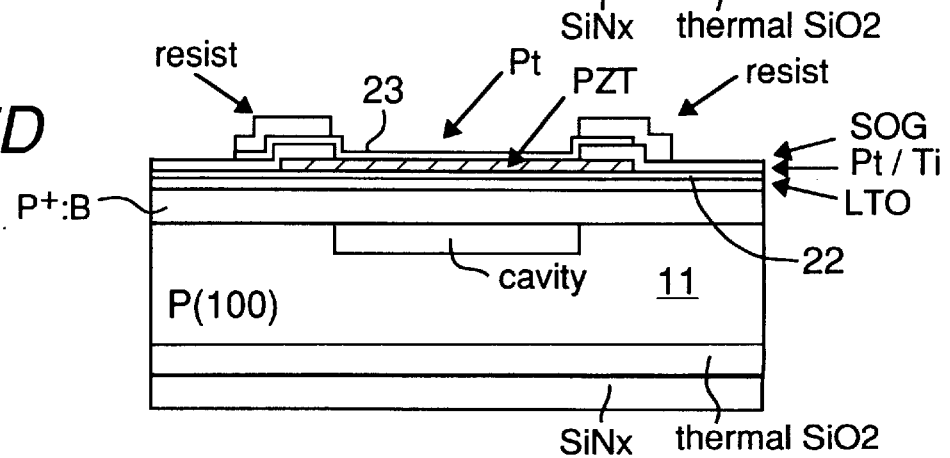
Figure 8A:
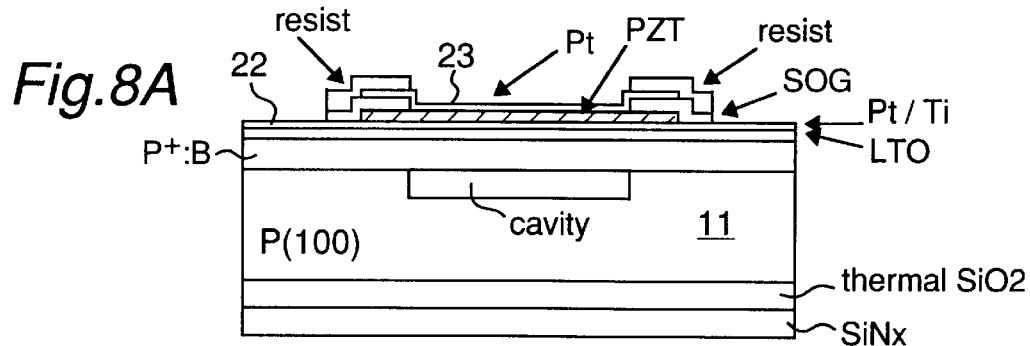
FIG. 8A through FIG. 8D are sectional views showing the manufacturing processes of the movable contact block shown in FIG. 1.
Figure 8B:
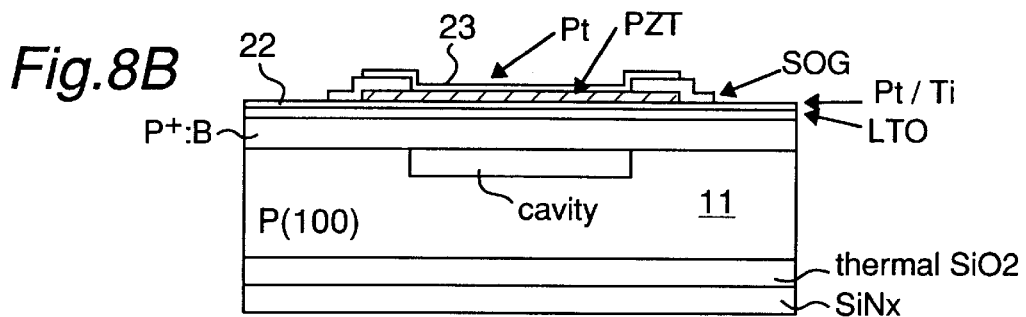
Figure 8C:
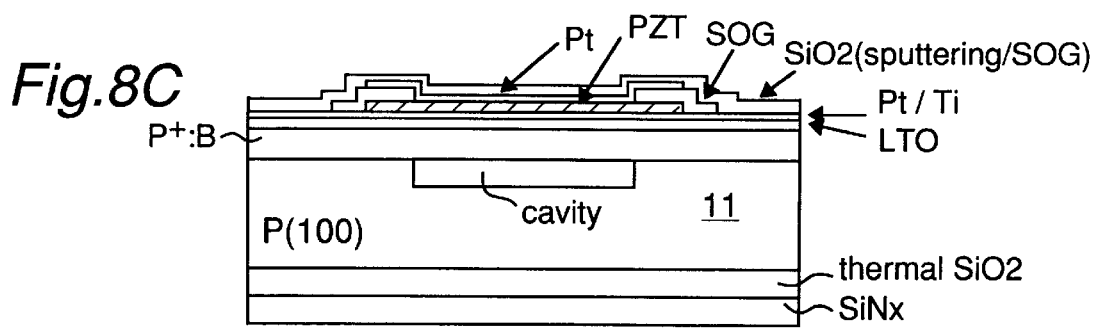
Figure 8D:
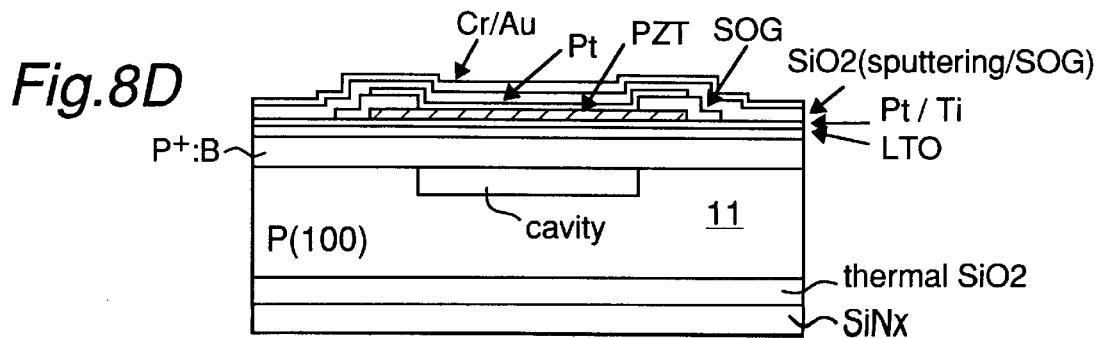

Next, as shown in FIGS. 4A through 4C, the silicon wafer 11 is etched by TMAH so as to form a cavity, and thereafter a silicon nitride film that becomes a mask material is laminated on the front and rear surfaces thereof. Then, the silicon nitride film and the thermal oxidation film on the front surface side are removed by dry etching and oxide film etching.

On the other hand, a high-concentration B (boron) and Ge (germanium) layer is made to epitaxially grow to a thickness of 2 $\mu$m on one surface of the silicon wafer having the thickness of 400 $\mu$m and the crystal orientation of 100. Further, a normal-concentration B layer is made to epitaxially grow to a thickness of 20 $\mu$m on its surface, thereby obtaining a second silicon wafer 21a for forming the thin plate-shaped substrate 21. Then, the B layer of this second silicon wafer 21a is placed on the upper surface of the first silicon wafer 11a and integrated with the same by direct bonding (see FIG. 4D).

Then, as shown in FIG. 5A through FIG. 5D, the surface of the second silicon wafer 21a is etched by TMAH for thinning. Through this process, the etching stops in the high-concentration B and Ge layer that has epitaxially grown, and the normal-concentration B layer that has epitaxially grown is exposed, thereby forming the thin plate-shaped substrate 21. Next, LTO (low-temperature oxide film) that serves as a protecting film for the lower electrode 22, which will be described later, is formed on the front surface of the exposed B layer. Then, by successively laminating titanium (Ti) and platinum (Pt) by sputtering, the lower electrode 22 is formed. Further, a piezoelectric film (PZT) of lead zirconate titanate or the like is formed by sputtering.

Subsequently, as shown in FIG. 6A through FIG. 6D, a resist is coated and a pattern of the piezoelectric film is formed by photolithography. Then, after etching by RIE (Reactive Ion Etching), the resist is removed, thereby forming the piezoelectric element 24. Subsequently, an insulating film is formed by SOG (Spin On Glass) coating. The reason why SOG is used is that the piezoelectric film possibly changes its characteristics when heated and intended to form an insulating film without heating. Then, a resist is coated and a pattern is formed by photolithography. Further, after exposing the piezoelectric element 24 by removing the center portion of the insulating film, a platinum (Pt) thin film that becomes an upper electrode 23 is deposited by sputtering.

Subsequently, as shown in FIGS. 7A through 7D, a resist is coated on the platinum thin film, and the pattern of the upper electrode 23 is formed by photolithography. Then, the unnecessary platinum is etched away to form the upper electrode 23, and the resist is removed. Further, a resist is coated, and a pattern for etching the insulating film of SOG located between the lower electrode 22 and the upper electrode 23 is formed by photolithography.

Subsequently, as shown in FIGS. 8A through 8D, the insulating film of SOG is etched by photolithography for the formation of a pattern of the insulating film between the lower electrode 22 and the upper electrode 23 and thereafter the photoresist is removed. Then, an insulating film $SiO_2$ for insulating between the upper electrode 23 and the movable contact 25, which will be described later, is formed by sputtering or a method with LTO. Further, a movable contact materials Cr and Au are successively laminated by sputtering.

Figure 9A:
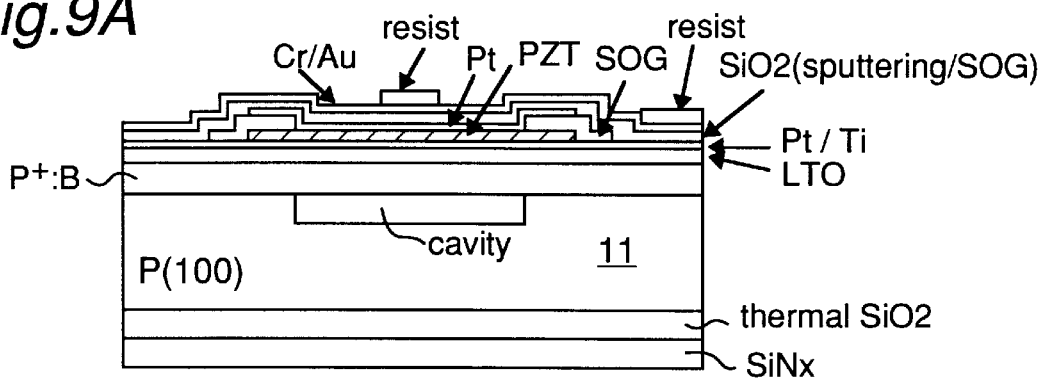
FIG. 9A through FIG. 9C are sectional views showing the manufacturing processes of the movable contact block shown in FIG. 1.
Figure 9B:
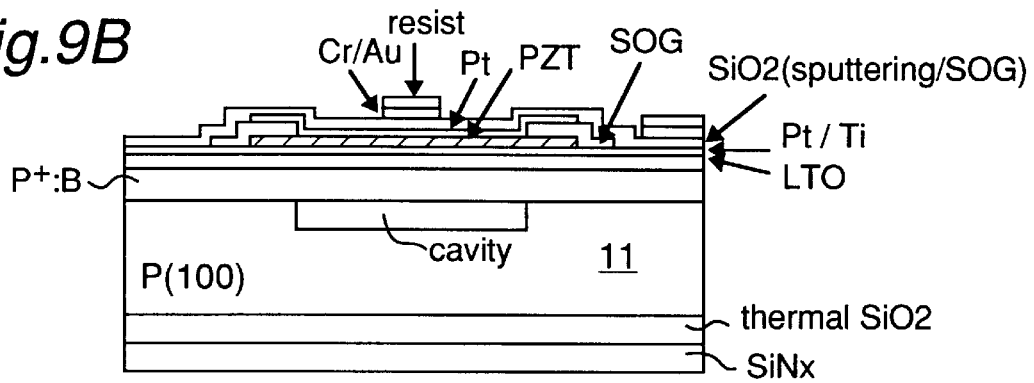
Figure 9C:
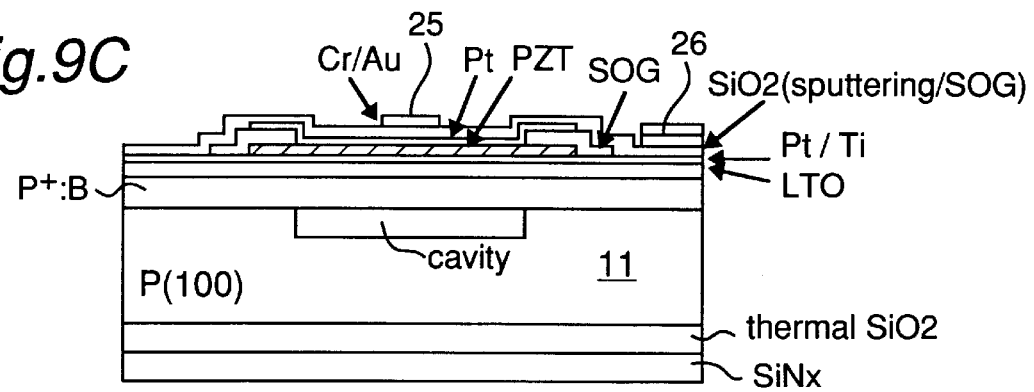

Then, as shown in FIG. 9A through FIG. 9C, a resist is coated, and a pattern is formed by photolithography. Subsequently, the unnecessary movable contact material is removed by etching for the formation of a movable contact 25 and a connecting base 26, and thereafter the resist is removed.

Figure 10A:
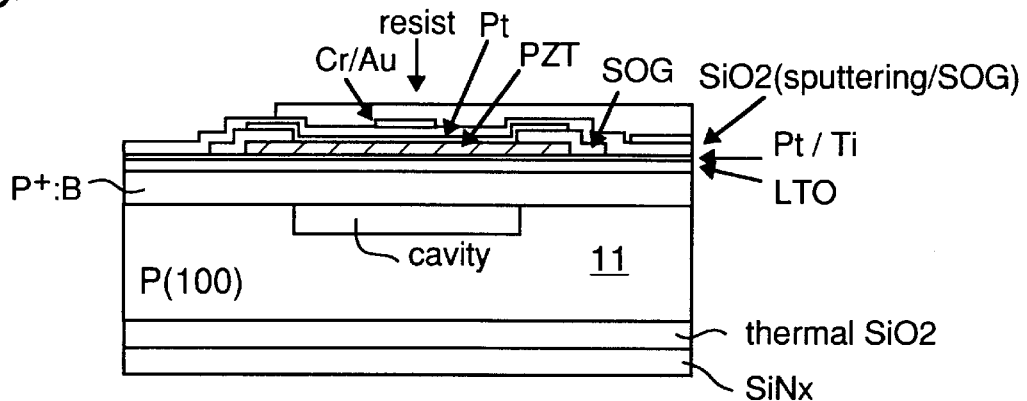
FIG. 10A through FIG. 10C are sectional views showing the manufacturing processes of the movable contact block shown in FIG. 1.
Figure 10B:
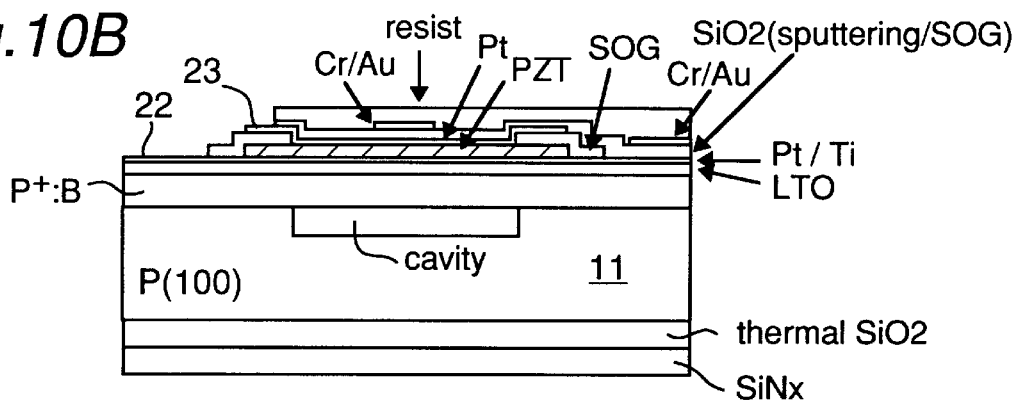
Figure 10C:
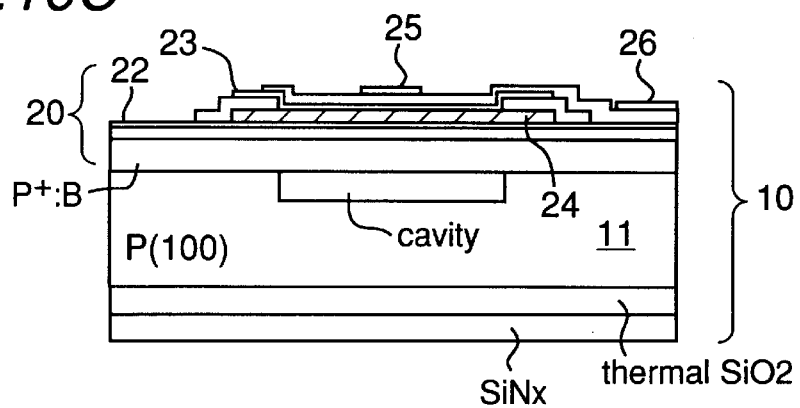

Further, as shown in FIG. 10A through FIG. 10C, a resist is coated and a pattern is formed by photolithography. Then, the insulating film is removed to expose one end of the lower electrode 22 and the upper electrode 23, and thereafter the resist is removed, thereby completing a movable contact block 10 provided with the movable piece 20.

For the fixed contact block 30 as shown in FIG. 11A through FIG. 11E, the output and input use through holes 32 and 35 and the driving use through holes 33 and 34 are formed through a glass wafer 31. Then, a recess portion 31a for ensuring an operation space and a recess portion 31b for arranging the fixed contacts 38 and 39 are successively formed. Then, a conductive material is deposited on the recess portions 31a and 31b of the glass wafer 31, and the unnecessary conductive material is etched by photolithography, thereby forming the printed wiring lines 36 and 37. Further, by depositing a conductive material and etching the same by photolithography, the fixed contacts 38 and 39 and the connecting pads 32a (not shown), 33a, 34a and 35a are formed, thereby completing the fixed contact block 30. It is to be noted that the connecting pad 33a has a great film thickness for electrical connection to the lower electrode 22.

Finally, as shown in FIG. 2A through FIG. 2C, by placing the fixed contact block 30 on the movable contact block 10 and anodically bonding the same, the assembling is completed.

According to the present embodiment, the connecting pad 35a of the through hole 35 provided on the fixed contact block 30 is brought in pressure contact with the connecting base 26 provided on the movable contact block 10. With this arrangement, the connection between the through hole 35 and the connecting pad 35a is ensured, providing the advantage that the connection reliability improves. It is to be noted that the through hole 32 has a similar structure.

The operation of the micro-relay of this first embodiment will be described.

First, if no voltage is applied to the piezoelectric element 24, then the movable piece 20 remains flat, and the movable contact 25 is separated from the pair of fixed contacts 38 and 39.

Subsequently, if a voltage is applied to the piezoelectric element 24 via the lower electrode 22 and the upper electrode 23, then the piezoelectric element 24 is curved upward.

By this operation, the movable piece 20 is curved to push up the movable contact 25, and this movable contact 25 comes in contact with the pair of fixed contacts 38 and 39, thereby making an electric circuit.

Then, if the voltage application to the piezoelectric element 24 is released, then the movable piece 20 is restored into the original state by the spring force of the thin plate-shaped substrate 21, and the movable contact 25 is separated from the fixed contacts 38 and 39.

It is to be noted that the piezoelectric element is not limited to the above-mentioned one, and it is acceptable to utilize a shape memory piezoelectric element that is deformed in the direction of thickness upon the application of voltage and retains its deformed state even when the voltage application is released.

Furthermore, with a design for obtaining the compressive stress in proximity to the critical value at which the driving starts from a silicon compound film such as a silicon oxide film or a silicon nitride film in the above embodiment, there can be provided the advantage that a large displacement can be obtained by a small input. It is to be noted that the position in which the silicon compound film is formed is not limited to the case of direct formation on the thin plate-shaped substrate, and the film may be formed in an arbitrary position.

As shown in FIGS. 12A through 19, the second embodiment is constructed so that the movable piece 20 is curved by taking advantage of the difference between the coefficient of thermal expansion of the thin plate-shaped substrate 21 and the coefficient of thermal expansion of a driving layer 28 formed on its upper surface by laminating a metal material, thereby opening and closing contacts. Therefore, the second embodiment differs from the first embodiment in that the contacts are opened and closed by taking advantage of the curving in the direction of thickness of the piezoelectric element 24 in the first embodiment.

It is to be noted that the second embodiment is assembled by anodically bonding the movable contact block 10 whose both ends are supported by the movable piece 20 with the fixed contact block 30, similar to the first embodiment.

The base 11 constituting the movable contact block 10 is similar to the aforementioned first embodiment, and therefore, no description is provided therefor.

The movable piece 20 is provided by forming a driving layer 28 by laminating a metal material via an insulating film on a heater layer 27 formed inside the surface layer of a thin plate-shaped substrate 21 and further forming a movable contact 25 via an insulating film. Then, connecting pads 27a and 27b are exposed at both end portions of the heater layer 27.

The fixed contact block 30 is provided by forming input and output use through holes 32 and 35 and driving use through holes 33 and 34 on a glass wafer 31, similar to the aforementioned first embodiment. Then, the input and output use through holes 32 and 35 are electrically connected to fixed contacts 38 and 39 via printed wiring lines 36 and 37. Further, at the lower end portions of the through holes 32, 33, 34 and 35 are formed connecting pads 32a, 33a, 34a and 35a, respectively, which are formed of a conductive material. It is to be noted that the connecting pads 32a and 35a are not shown.

Next, a manufacturing method of the micro-relay having the above construction will be described next.

It is to be noted that FIG. 13A through FIG. 19 show local sectional views showing only the important parts for the sake of convenience of explanation. Furthermore, as shown in FIG. 13A through FIG. 14D, the processes to the formation of the thin plate-shaped substrate 21 on the base 11 are similar to those of the first embodiment, and therefore, no description is provided for them.

Therefore, as shown in FIG. 15A through FIG. 15D, a resist is coated on the thin plate-shaped substrate 21 and a pattern of a portion that becomes the heater layer 27 is formed by photolithography. Further, B (Boron) ions are injected into the surface layer of the exposed thin plate-shaped substrate 21. Subsequently, the photoresist is removed, and heating is performed for activating the injected B ions and increasing the electrical resistance.

Then, as shown in FIG. 16A through FIG. 16D, LTO (low-temperature oxide film) is laminated so as to insulate the heater layer 27. Further, a resist is coated, and a pattern for a contact hole is formed by photolithography. Subsequently, the unnecessary oxide film is removed to form the contact hole of the heater layer 27, and thereafter the resist is removed. Subsequently, a metal thin film for forming the driving layer 28 and the connecting portions 27a and 27b is laminated on its surface by sputtering.

Further, as shown in FIG. 17A through FIG. 17D, a resist is coated, and a pattern for forming the driving layer 28 and the connecting portions 27a and 27b is formed by photolithography. Then, the unnecessary metal thin film is removed by etching to form the driving layer 28 and the connecting portions 27a and 27b, and the resist is removed. Subsequently, an insulating film constructed of a low-temperature oxide film and a metal thin film formed by sputtering are successively laminated.

Subsequently, as shown in FIG. 18A through FIG. 18D, a photoresist is coated and a pattern for the movable contact 25 and the connecting base 26 is formed by photolithography. After removing the unnecessary portion of the metal thin film by etching, the resist is removed. Further, the photoresist is coated, and a pattern of a contact hole for connection to the heater layer 27 is formed by photolithography. Then, the insulating film positioned on the contact hole is removed by patterning the insulating film, thereby exposing the connecting portions 27a and 27b.

Figure 19:
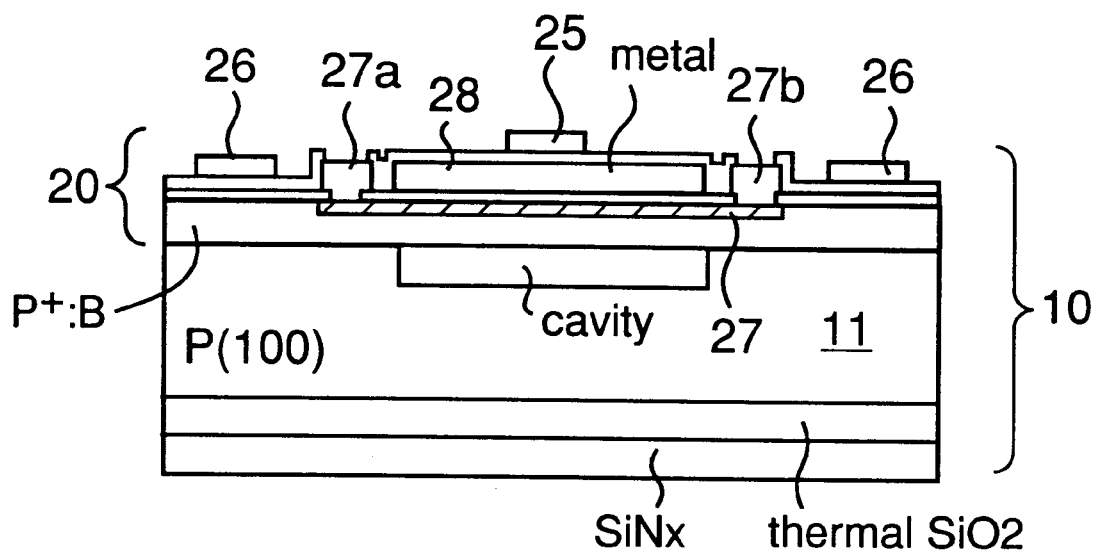
FIG. 19 is a sectional view showing the manufacturing process of the movable contact block shown in FIG. 12A through FIG. 12C.

Then, by removing the photoresist as shown in FIG. 19, the movable contact block 10 that supports both ends of the movable piece 20 is completed.

On the other hand, the fixed contact block 30 is formed almost similar to the aforementioned first embodiment, and therefore, no description is provided therefor.

Figure 12A:
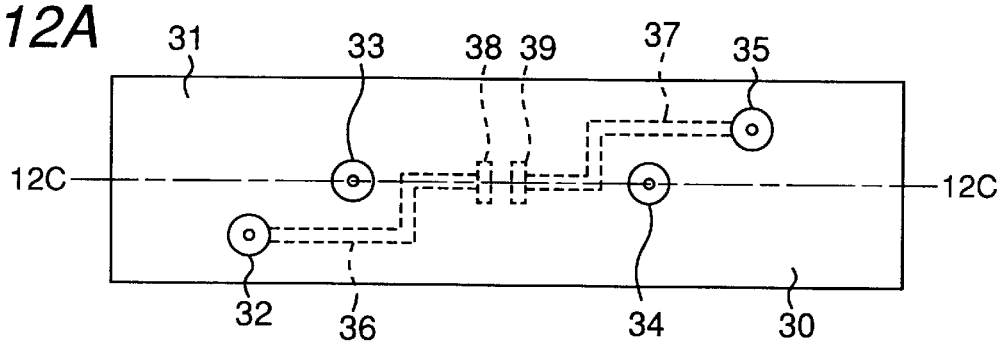
FIG. 12A is a plan view showing a micro-relay according to a second embodiment of the present invention.
Figure 12B:
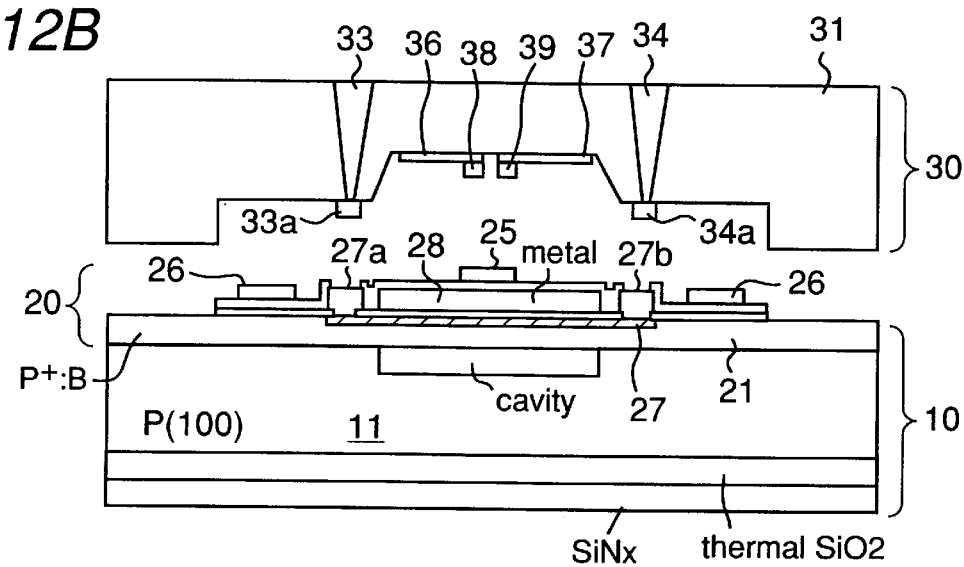
FIG. 12B is a sectional view of the micro-relay bisected.
Figure 12C:
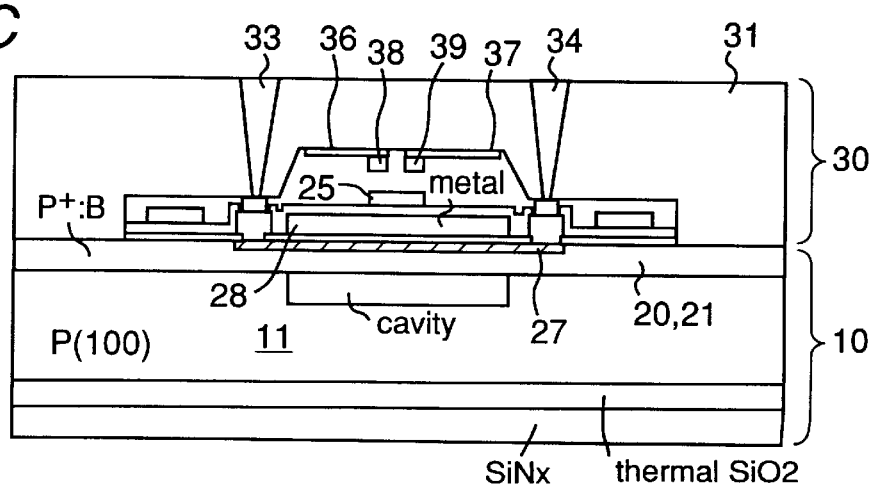
FIG. 12C is a sectional view taken along the line 12C—12C in FIG. 12A, showing an integrated state.
Figure 13A:
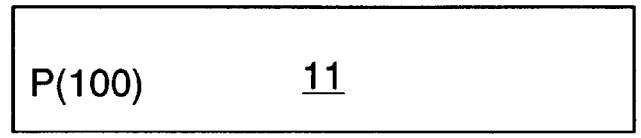
FIG. 13A through FIG. 13E are sectional views showing the manufacturing processes of the movable contact block shown in FIG. 12A through FIG. 12C.
Figure 13B:
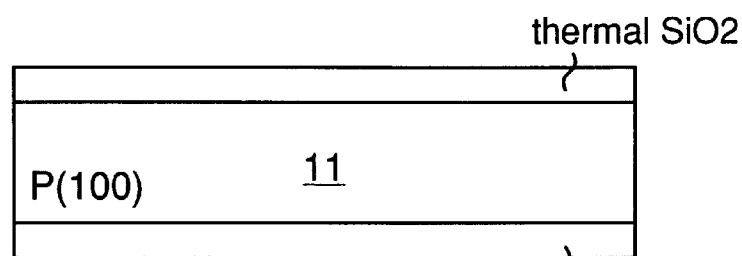
Figure 13C:
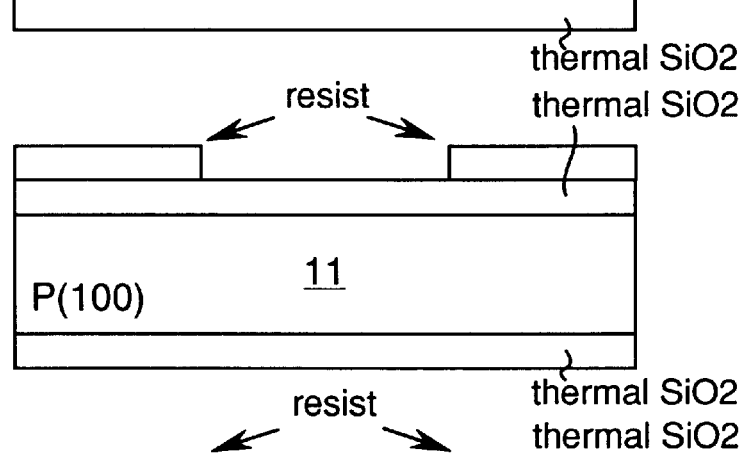
Figure 13D:
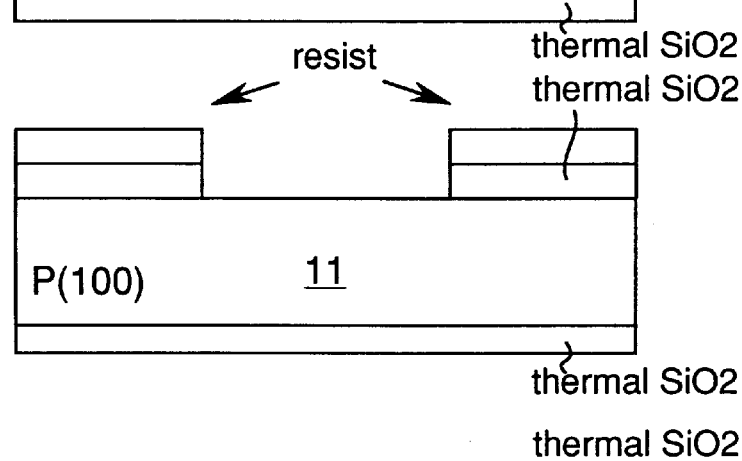
Figure 13E:
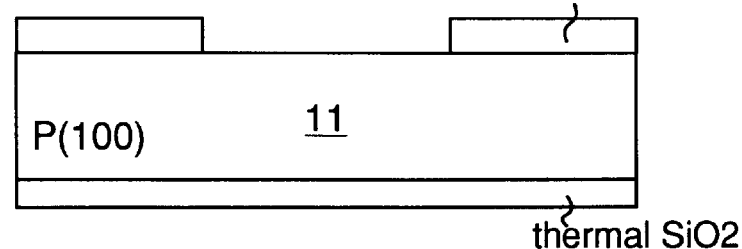
Figure 14A:
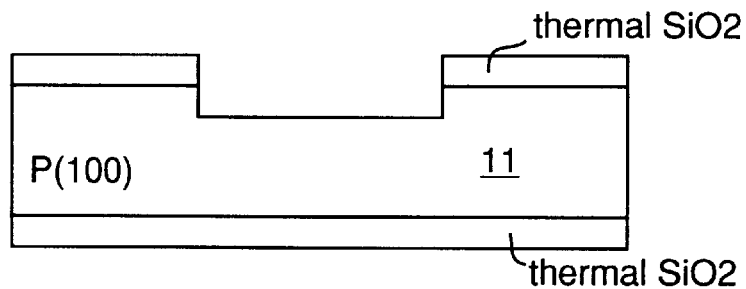
FIG. 14A through FIG. 14D are sectional views showing the manufacturing processes of the movable contact is block shown in FIG. 12A through FIG. 12C.
Figure 14B:
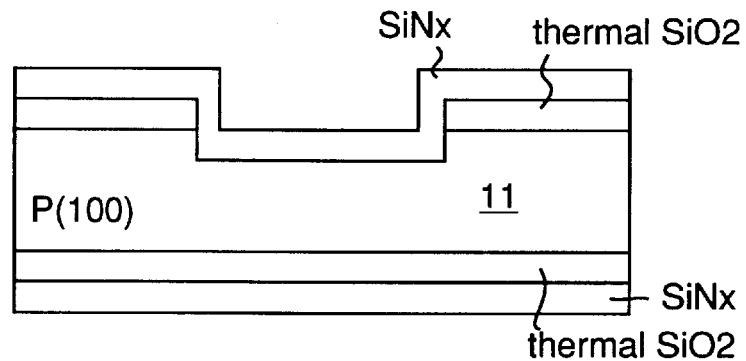
Figure 14C:
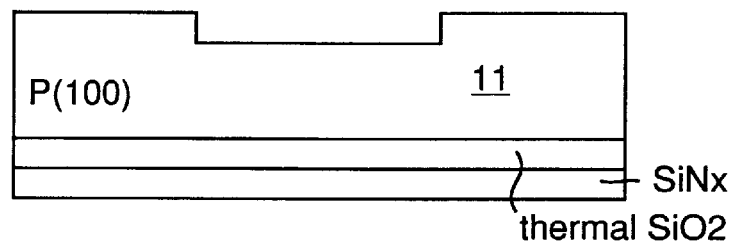
Figure 14D:
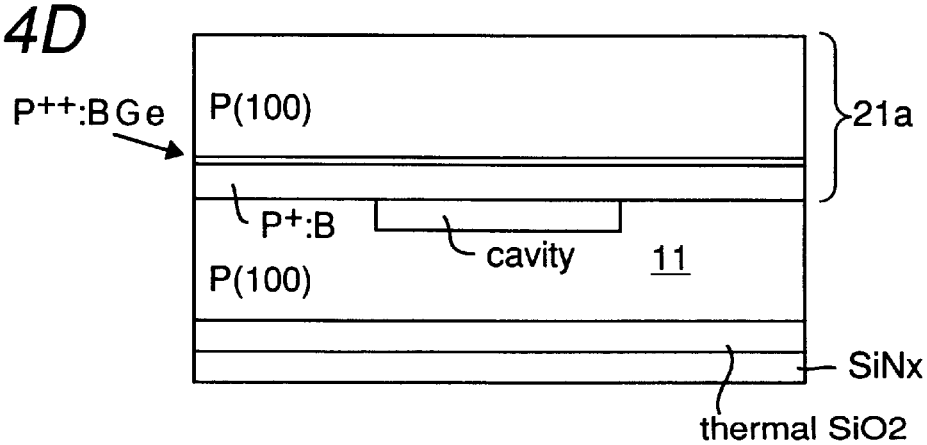
Figure 15A:
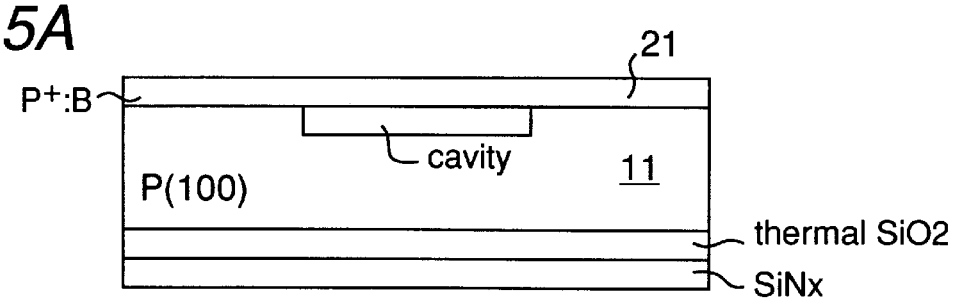
FIG. 15A through FIG. 15D are sectional views showing the manufacturing processes of the movable contact block shown in FIG. 12A through FIG. 12C.
Figure 15B:
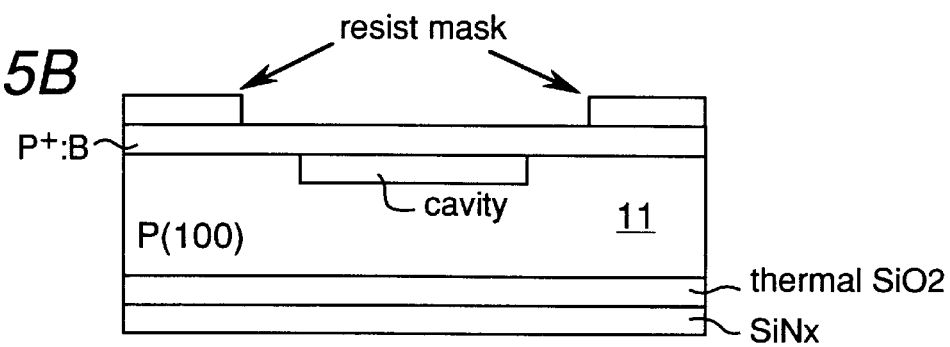
Figure 15C:
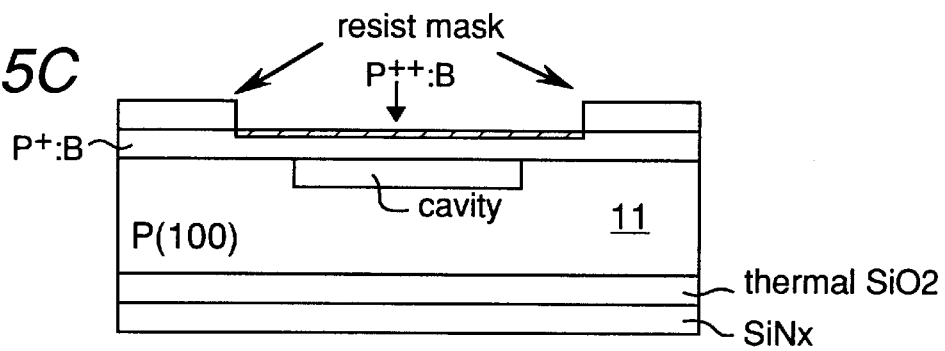
Figure 15D:
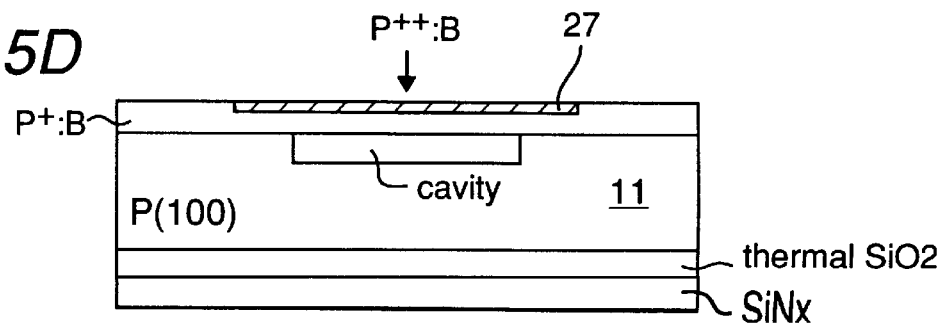
Figure 16A:
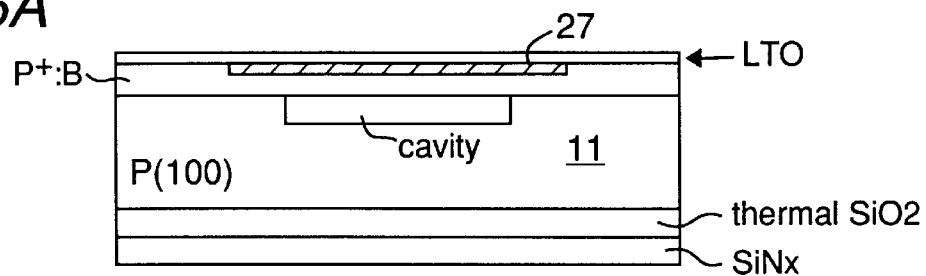
FIG. 16A through FIG. 16D are sectional views showing the manufacturing processes of the movable contact block shown in FIG. 12A through FIG. 12C.
Figure 16B:
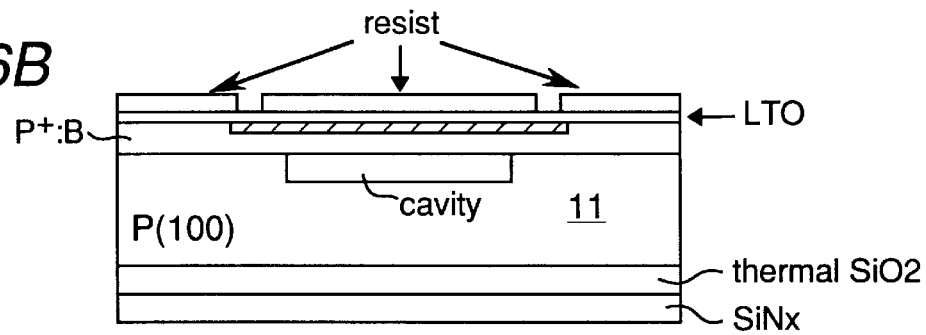
Figure 16C:
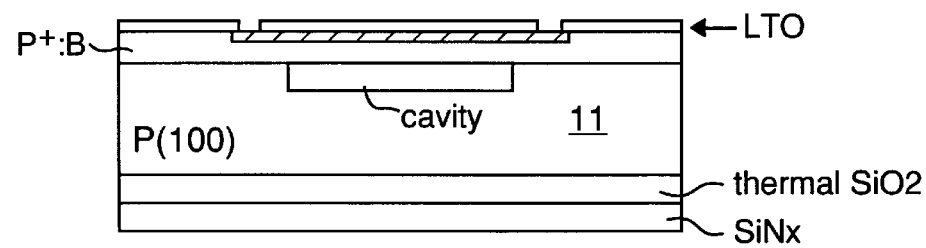
Figure 16D:
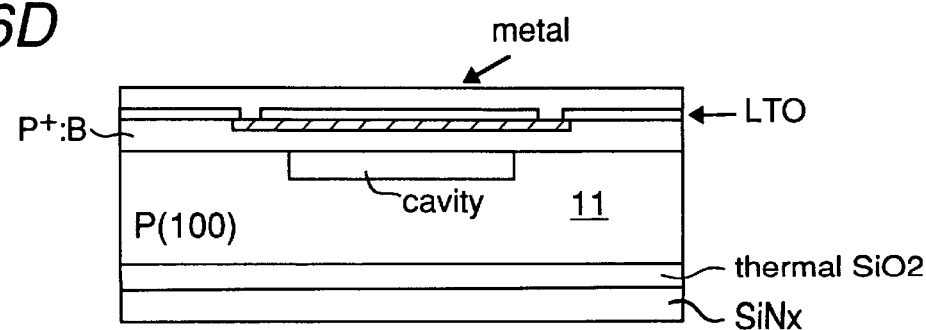
Figure 17A:
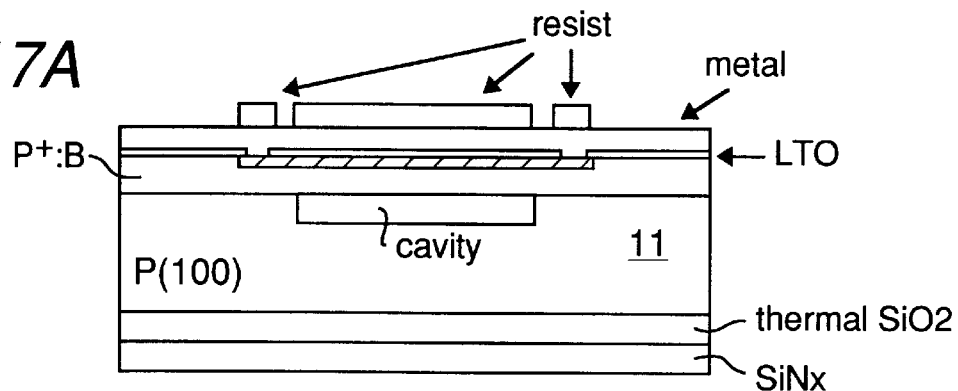
FIG. 17A through FIG. 17D are sectional views showing the manufacturing processes of the movable contact block shown in FIG. 12A through FIG. 12C.
Figure 17B:
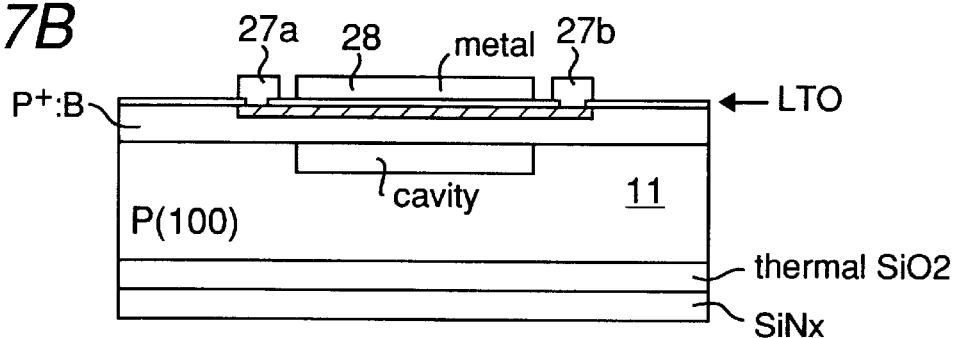
Figure 17C:
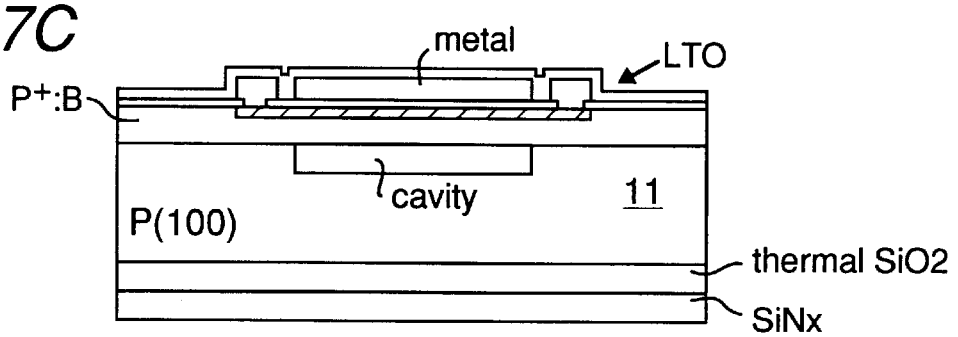
Figure 17D:
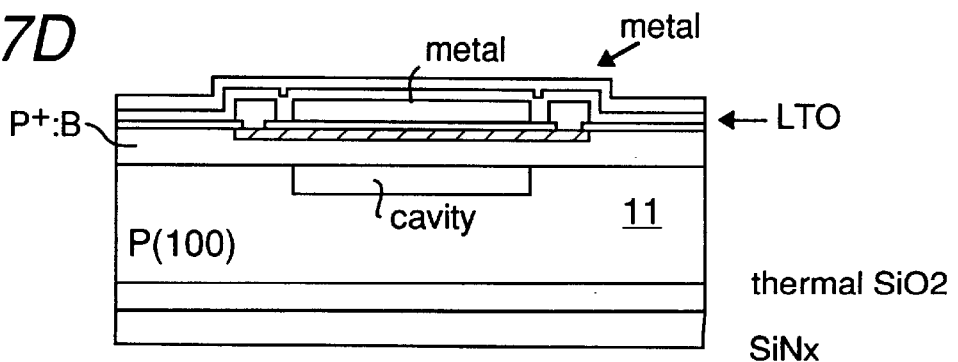
Figure 18A:
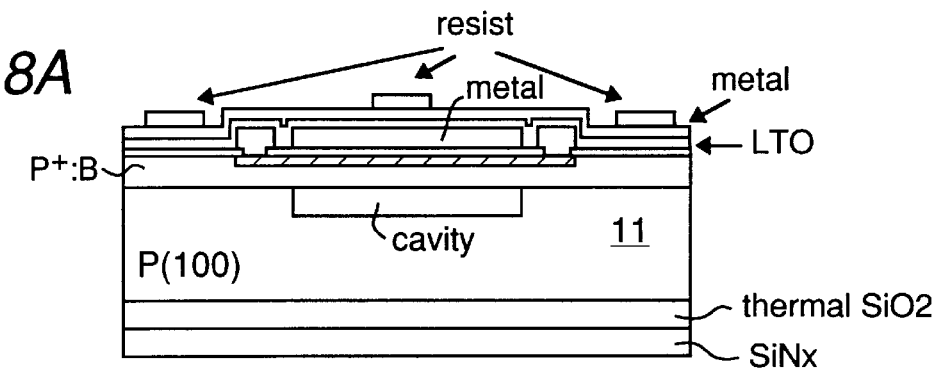
FIG. 18A through FIG. 18D are sectional views showing the manufacturing processes of the movable contact block shown in FIG. 12A through FIG. 12C.
Figure 18B:
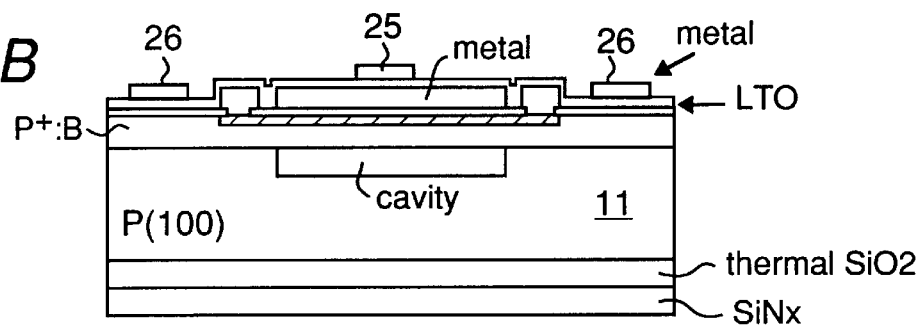
Figure 18C:
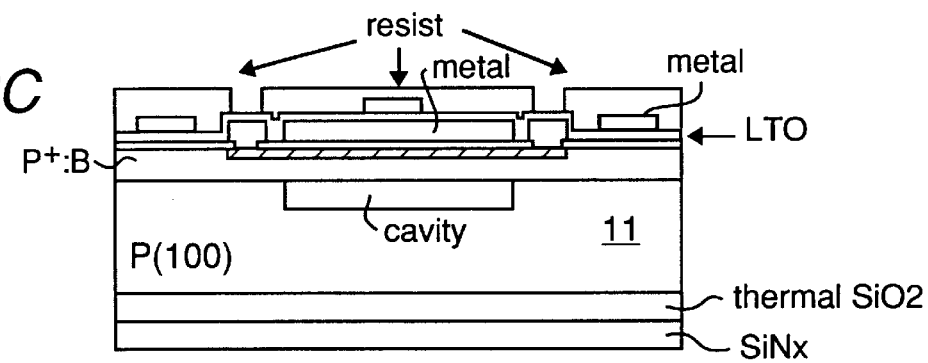
Figure 18D:
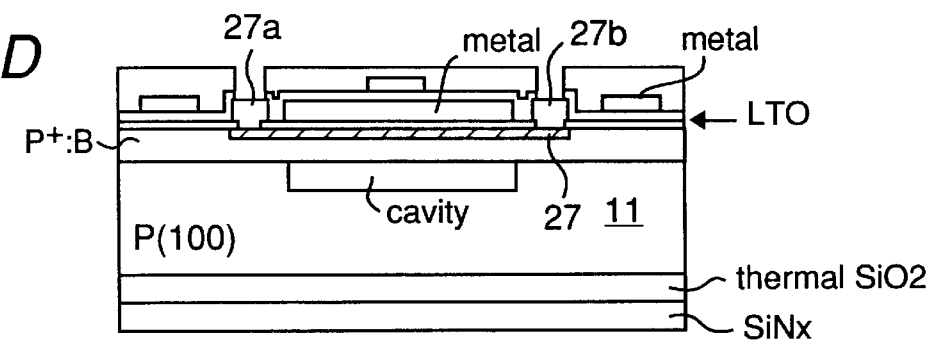

Finally, as shown in FIG. 12B, by placing the fixed contact block 30 on the movable contact block 10 and connecting and integrating them with each other by anodic bonding, the assembling work is completed.

According to the present embodiment, the connecting pad 35a provided at the lower end portion of the through hole 35 (not shown) comes in pressure contact with the connecting base portion 26 provided for the movable contact block 10. This arrangement ensures the connection of the through hole 35 to the printed wiring line 37 and provides the advantage that the connection reliability improves. It is to be noted that a through hole 33 has the same structure.

The operation of this second embodiment will be described.

First, if no voltage is applied to the heater layer 27, then the heater layer 27 does not generate heat. For this reason, the movable piece 20 remains flat, and the movable contact 25 is separated from the pair of fixed contacts 38 and 39.

Subsequently, if a voltage is applied to the heater layer 27 via the connecting portions 27a and 27b so as to heat the same, the driving layer 28 is heated by the heat generation of the heater layer 27 so as to expand. This driving layer 28 has a coefficient of thermal expansion greater than that of the thin plate-shaped substrate 21. For this reason, the movable piece 20 is curved so that its upper surface becomes convex, and the movable contact 25 comes in contact with the pair of fixed contacts 38 and 39, thereby making an electric circuit.

Then, if the voltage application to the heater layer 27 is released so as to stop the heat generation, then the driving layer 28 contracts. By this operation, the movable piece 20 is restored into the original state by the spring force of the thin plate-shaped substrate 21, and the movable contact 25 separates from the fixed contacts 38 and 39.

According to the present embodiment, the coefficient of thermal expansion of the driving layer 28 that expands on the basis of the heat generation of the heater layer 27 is much larger than the coefficient of thermal expansion of the thin plate-shaped substrate 21. For this reason, the present embodiment has the advantage that the response characteristic is good and a great contact pressure force can be obtained.

As shown in FIGS. 20A through 20C, the third embodiment is constructed so that a difference between the coefficient of thermal expansion of the thin plate-shaped substrate 21 and the coefficient of thermal expansion of the heater layer 27 formed inside the surface layer portion of the thin plate-shaped substrate 21 is utilized. For this reason, the third embodiment differs from the aforementioned second embodiment in that the difference between the coefficient of thermal expansion of the thin plate-shaped substrate 21 and the coefficient of thermal expansion of the driving layer 28 made of a metal material is utilized in the second embodiment. It is to be noted that an insulating film 29 is for insulating the movable contact 25 from the heater layer 27.

The manufacturing of the present embodiment is almost similar to that of the aforementioned second embodiment except for the point that the driving layer 28 made of the metal material is not provided, and therefore, no description is provided therefor.

The operation of this third embodiment will be described.

First, if no voltage is applied to the heater layer 27, then the heater layer 27 does not generate heat. Therefore, the movable piece 20 remains flat, and the movable contact 25 is separated from the pair of fixed contacts 38 and 39.

Subsequently, if a voltage is applied to the heater layer 27 via the connecting portions 27a and 27b, then the heater layer 27 generates heat. For this reason, the heater layer 27 itself expands, and the thin plate-shaped substrate 21 is expanded by being heated by this heater layer 27. However, the heater layer 27 has a coefficient of thermal expansion greater than that of the thin plate-shaped substrate 21, and therefore, the movable piece 20 is deformed so that its upper surface becomes convex. For this reason, the movable contact 25 comes in contact with the pair of fixed contacts 38 and 39, thereby making an electric circuit.

Then, if the voltage application to the heater layer 27 is released so as to stop the heat generation of the heater layer 27, then the heater layer 27 contracts. By this operation, the movable piece 20 is restored into the original state by the spring force of the thin plate-shaped substrate 21, and the movable contact 25 separates from the fixed contacts 38 and 39.

According to the present embodiment, there is no need for providing the driving layer 28 made of the metal material in contrast to the second embodiment, and the heater layer 27 can be concurrently used as the driving layer. This arrangement has the advantage that a micro-relay having a smaller number of manufacturing processes than the second embodiment and a high productivity can be obtained.

Although the aforementioned embodiment has been described on the basis of the formation of the heater layer 27 inside the surface layer portion of the thin plate-shaped substrate 21, the present invention is not always limited to this, and it is acceptable to laminate a metal material of platinum, titanium or the like or a polysilicon on the surface of the thin plate-shaped substrate 21 for the formation of the layer.

Figure 21:
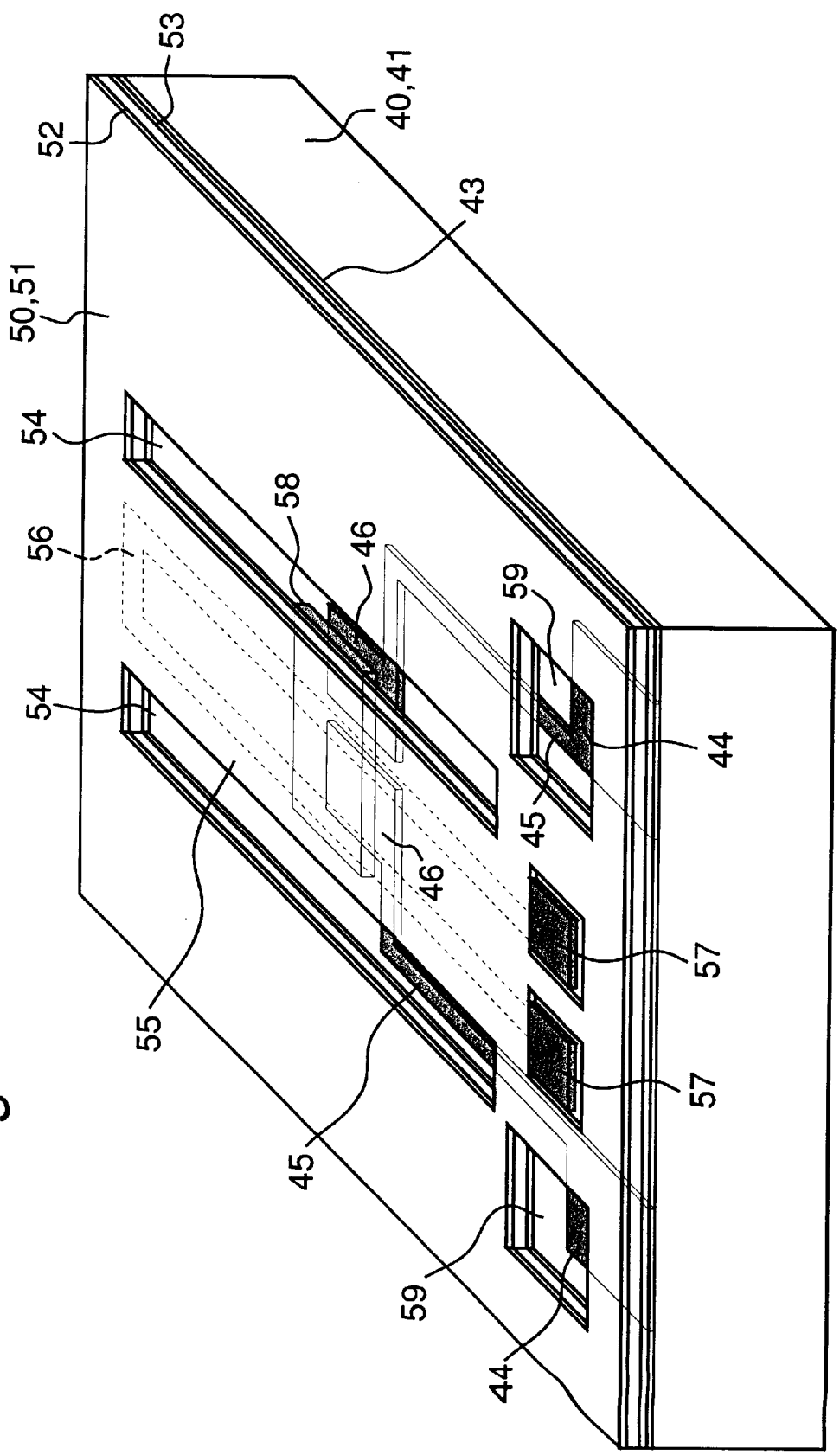
FIG. 21 is a perspective view showing a micro-relay according to a fourth embodiment of the present invention.

As shown in FIG. 21, the fourth embodiment is constructed so that a cover 51 comprised of a silicon device wafer 50 is connected and integrated with the opening edge portion of a box-shaped base 41 comprised of a silicon handle wafer 40.

The aforementioned box-shaped base 41 is provided by laterally symmetrically forming connecting pads 44, printed wiring lines 45 and fixed contacts 46 on the bottom surface of a recess portion 42 in which a thermal oxidation film 43 is formed.

On the other hand, the cover 51 whose front and rear surfaces are formed with oxide films 52 and 53 are processed to have a movable piece 55 by cutting a pair of parallel slits 54 and 54. This movable piece 55 is formed with a heater section 56 constructed of a diffused resistor having a roughly bracket-like planar shape. Both ends of the heater section 56 are connected to connecting pads 57 and 57 exposed from the aforementioned oxide film 52. Further, a movable contact 58 that comes in and out of contact with the fixed contacts 46 and 46 is provided on the lower surface of the movable piece 55. Further, the cover 51 is formed with connecting use opening portions 59 and 59 in positions corresponding to the connecting pads 44 and 44.

Next, a manufacturing method of the micro-relay according to the fourth embodiment will be described with reference to FIG. 23A through FIG. 26F.

Figure 22:
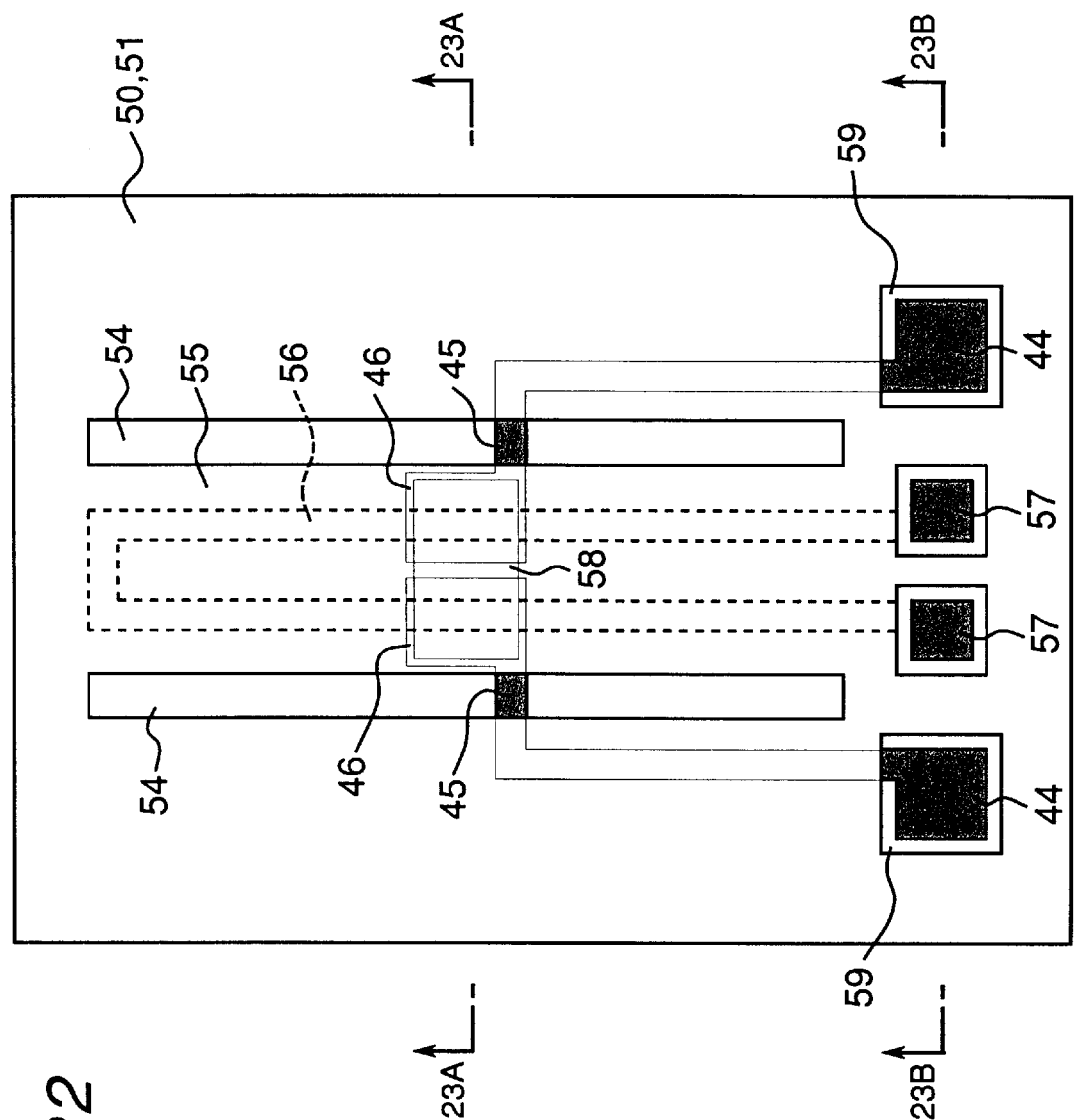
FIG. 22 is a plan view of the micro-relay shown in FIG. 21.

It is to be noted that the sectional views shown on the left-hand side of FIG. 23A through FIG. 26F are sectional views taken along the line 23A—23A in FIG. 22, while the sectional views shown on the right-hand side are sectional views taken along the line 23B—23B in FIG. 22.

As shown in FIG. 23A through FIG. 23J, the handle wafer 40 that becomes the box-shaped base 41 is an impurity type and has an arbitrary orientation. An alignment mark 47 is formed on the lower surface of this handle wafer 40 by wet etching or dry etching (FIGS. 23C and 23D). Subsequently, the alignment mark 47 is positioned with respect to the etching mask, and the recess portion 42 is formed on the upper surface of the handle wafer 40 by wet etching or the dry etching (FIGS. 23E and 23F). Further, the wafer is thermally oxidized to form an oxide film, and thereafter the thermal oxidation film located on the outer side surface and the lower surface is removed (FIGS. 23G and 23H). The remaining oxide film 43 is for insulating the fixed contact 46 and facilitating the low-temperature bonding as described later. Then, the connecting pads 44, the printed wiring lines 45 and the fixed contacts 46 are formed on the upper surface of the oxide film 43 located on the bottom surface of the recess portion 42, thereby obtaining the box-shaped base 41 (FIGS. 23I and 23J).

As a method for forming the fixed contact 46 and so on, it is also acceptable to use a screen printing method and a plating method other than the semiconductor processes of sputtering, deposition and so on. It is to be noted that the above-mentioned screen printing method can form a relatively thick metal film (to a thickness of about 10 μm), and this arrangement is advantageous for the formation of the fixed contact 46 and so on. It is to be noted that the screen printing method necessitates a sintering process at a temperature of about 900° C.

As a material of the fixed contact 46 and so on, there can be enumerated, for example, the single substance of Au, Ag, Cu, Pt, Pd or Cd and the compound of these substances.

On the other hand, as shown in FIG. 24A through FIG. 24H, a p-type SOI wafer is used as the device wafer 50 for the formation of the movable piece 55. First, by injecting phosphorus ions into a thin silicon layer located on the lower surface side of the device wafer 50 and diffusing the ions until they reach the embedded insulating film 52, a heater section 56 is formed (FIGS. 24C and 24D) Further, a thermal oxidation film is formed on the whole body of the device wafer 50, and therefore, the other thermal oxidation film is removed while leaving only the thermal oxidation film 53 on the lower surface (FIGS. 24E and 24F). The thermal oxidation film 53 left on the lower surface is for insulating the movable contact 58 and facilitating the low-temperature bonding as described later. Then, similar to the aforementioned fixed contacts 46 and 46, a movable contact 58 is formed on the lower surface of the thermal oxidation film 53 by sputtering, deposition and so on (FIG. 24G and 24H).

Figure 25A:
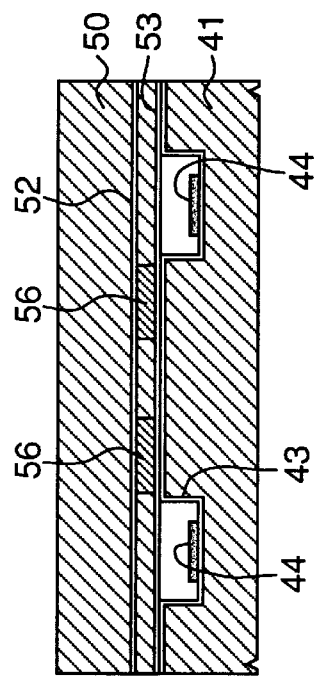
FIG. 25A through FIG. 25F are sectional views showing the manufacturing processes after the connection of the wafer shown in FIG. 23A through FIG. 24J.
Figure 25C:
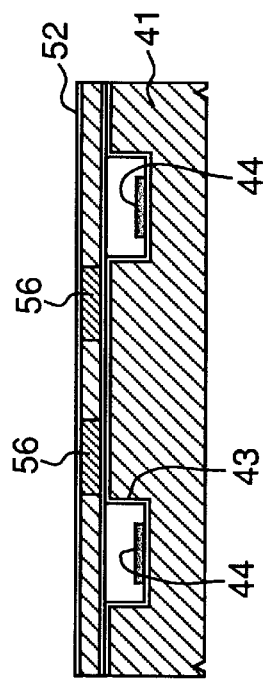
Figure 25E:
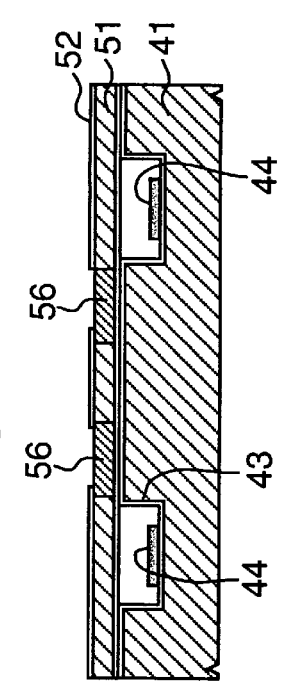
Figure 25B:
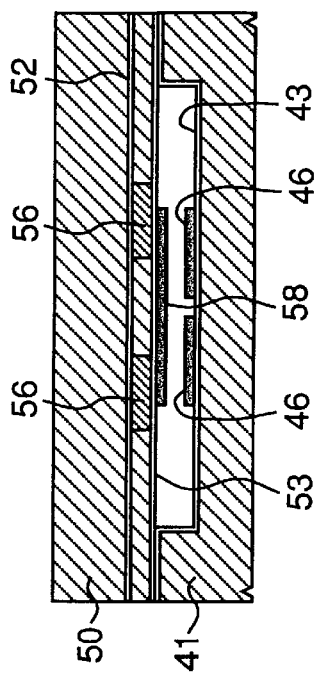

Then, as shown in FIG. 25A and FIG. 25B, the device wafer 50 is connected and integrated with the box-shaped base 41.

Conventionally, the silicon objects have been directly connected and integrated with each other at a junction temperature of about 1000° C. In contrast to this, according to the present embodiment, they are connected and integrated with each other via the thermal oxidation films 43 and 53. Therefore, they can be connected and integrated with each other at a low temperature of not higher than 450° C. For this reason, for example, the metal of Au, Ag, Pt, Pd or the like having a low melting point can be used for the contact material, and this provides the advantage that the degree of freedom of design expands.

Figure 25D:
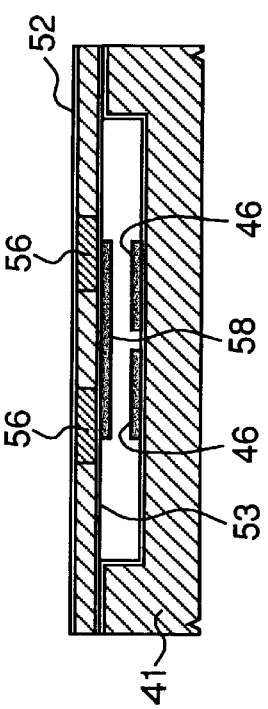

Subsequently, the silicon located on the upper surface of the device wafer 50 is removed by an alkali etching solution of TMAH, KOH or the like. This alkali etching solution has an oxide film etching rate much smaller than the silicon etching rate. For this reason, a sandwich structure of oxide film/silicon/oxide film having high film thickness accuracy can be obtained (FIGS. 25C and 25D).

Figure 25F:
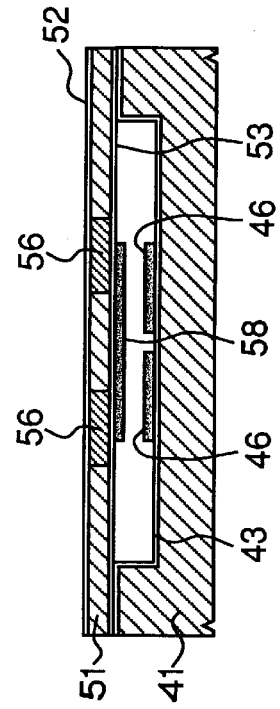

Furthermore, the portion that is belonging to the insulating film 52 and is forming the connecting pads 57 and 57 is removed, thereby exposing the edge portion of the heater section 56 (FIGS. 25E and 25F). Then, as shown in FIG. 26A and FIG. 26B, phosphorus is injected into the edge portion of the exposed heater section in order to obtain an ohmic contact between the heater section 56 and the connecting pads 57. Subsequently, the connecting pads 57 and 57 are formed of Al, Au or the like (FIGS. 26C and 26D). Finally, the oxide film/silicon/oxide film is partially removed, and a pair of parallel slits 54 and 54 are cut, thereby forming the movable piece 55 (FIGS. 26E and 26F) and forming the connecting use opening portions 59 and 59 (FIG. 21). The connecting pads 44 and 44 can be connected to the outside by wire bonding via the connecting use opening portions 59.

The operation of the micro-relay having the above-mentioned structure will be described next.

If no current is inputted to the driving use connecting pads 57 and 57, then the heater section 56 does not generate heat. Since the movable piece 55 is straight, the movable contact 58 is separated from the fixed contacts 46 and 46.

If a current is inputted to the driving use connecting pads 57 and 57, then the heater section 56 generates heat to expand the movable piece 55 by heating. By this operation, the movable piece 55 buckles to curve, and the movable contact 58 comes in contact with the fixed contacts 46 and 46.

Subsequently, if the aforementioned current input is removed, then the temperature of the movable piece 55 reduces to contract. By this operation, the movable piece 55 is restored into the original state, and the movable contact 58 separates from the fixed contacts 46 and 46.

According to the present embodiment, the heater section 56 is formed inside the movable piece 55, and the front and rear surfaces thereof are further coated with the oxide films 52 and 53, and therefore, heat loss is small. For this reason, a micro-relay having a high response characteristic and small power consumption can be obtained.

Figure 27:
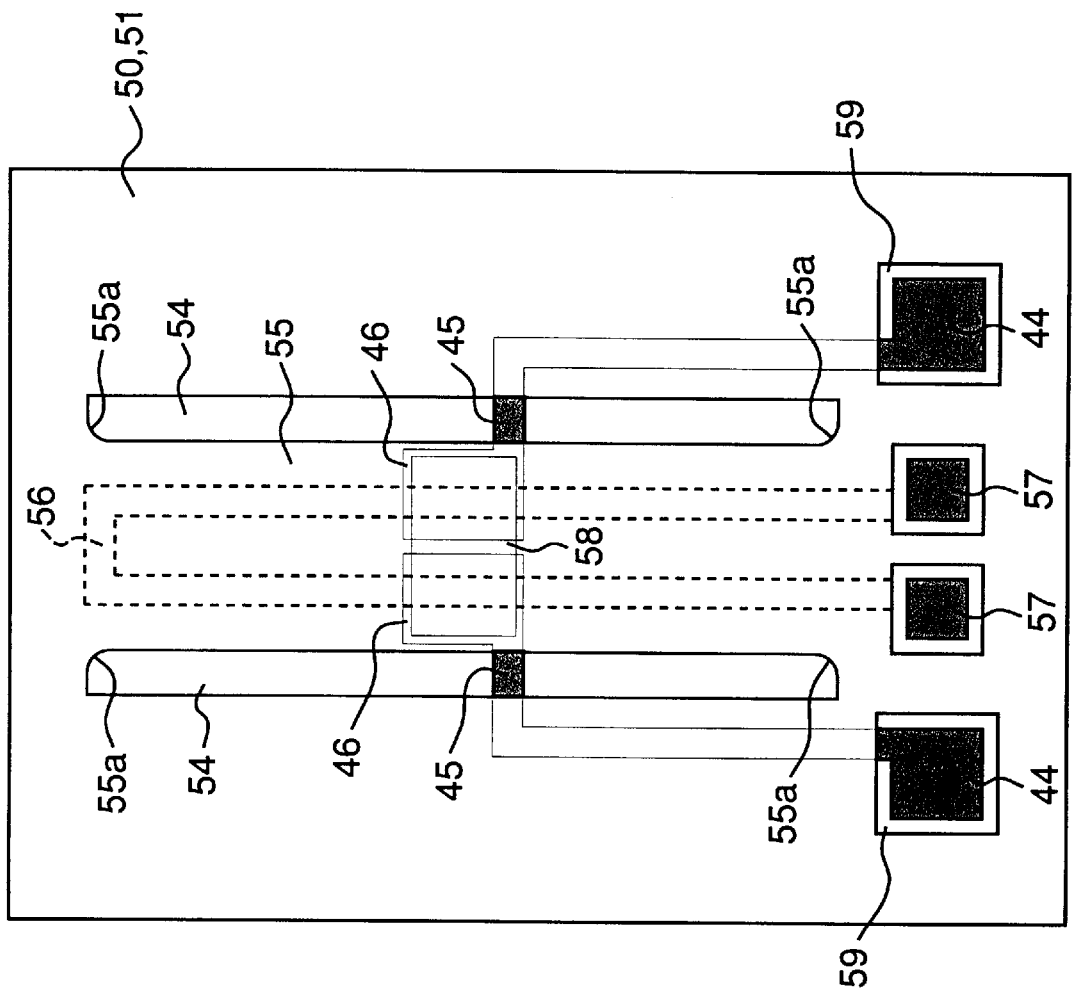
FIG. 27 is a plan view showing a micro-relay according to a fifth embodiment of the present invention.

As shown in FIG. 27, the fifth embodiment of the present invention is constructed so that the movable piece 55 has its root portion provided with a radius 55a. This arrangement has the advantage that the stress concentration is alleviated and the durability is improved.

Figure 28:
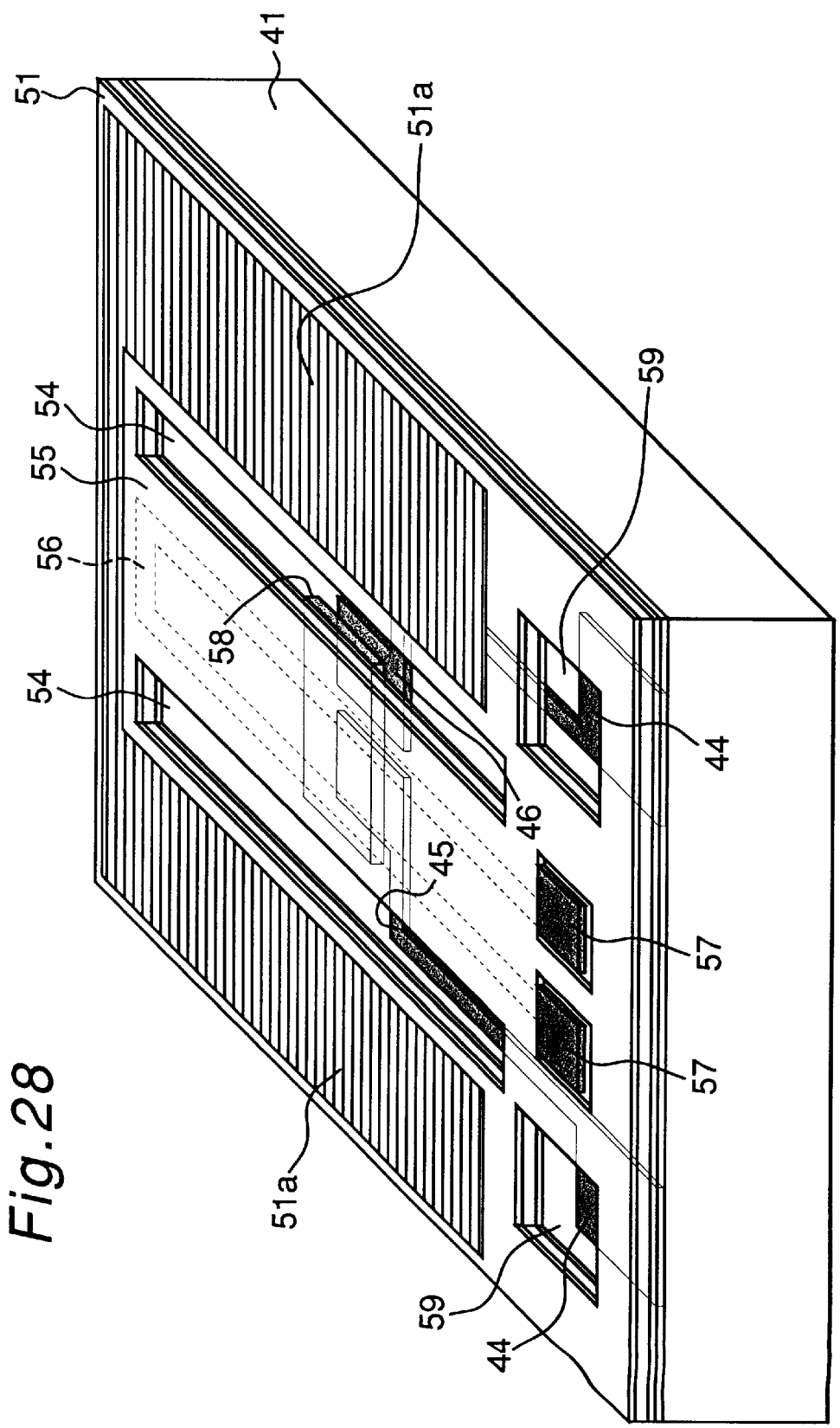
FIG. 28 is a perspective view showing a micro-relay according to a sixth embodiment of the present invention.
Figure 29:
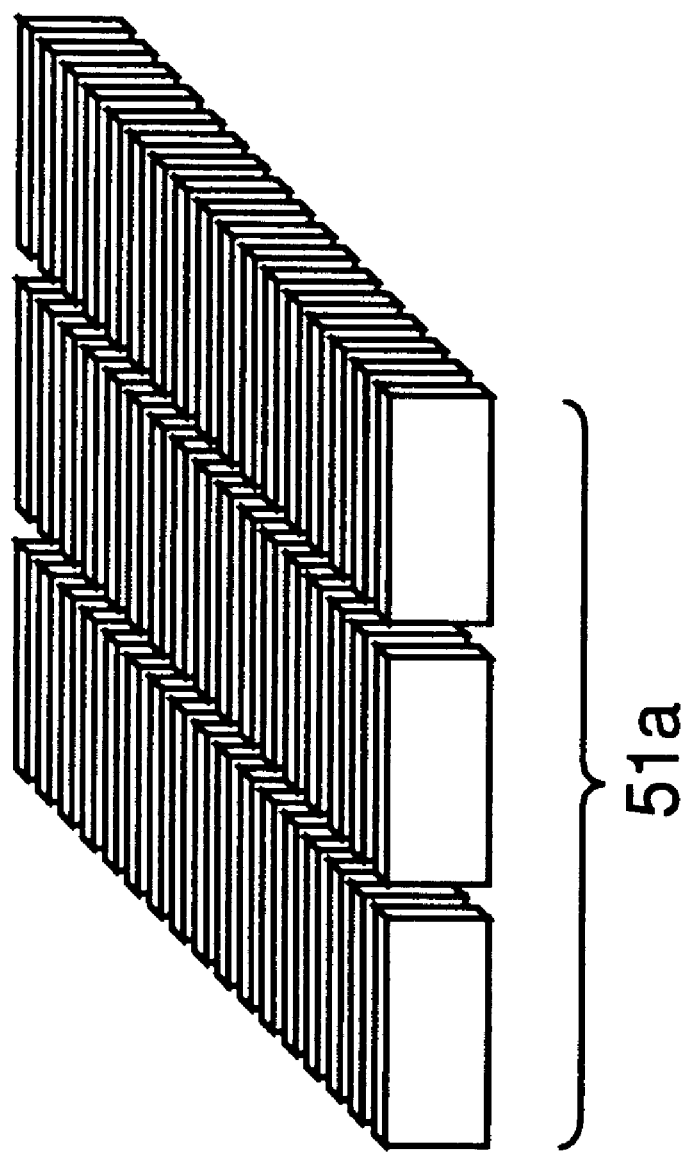
FIG. 29 is an enlarged perspective view of the fin shown in FIG. 28.

As shown in FIG. 28 and FIG. 29, the sixth embodiment is constructed so that a cooling fin 51a is formed by dry etching on the upper surface of the cover 51 except for the movable piece 55. This arrangement provides, for example, the advantage that the interference of heat from the outside is prevented for the prevention of the occurrence of a variation in operating characteristics in the case where a number of micro-relays are arranged parallel.

It is also acceptable to provide the cooling fin 51a only on the upper surface of the movable piece 55 or provide the cooling fin 51a on the whole surface of the cover 51.

Figure 30:
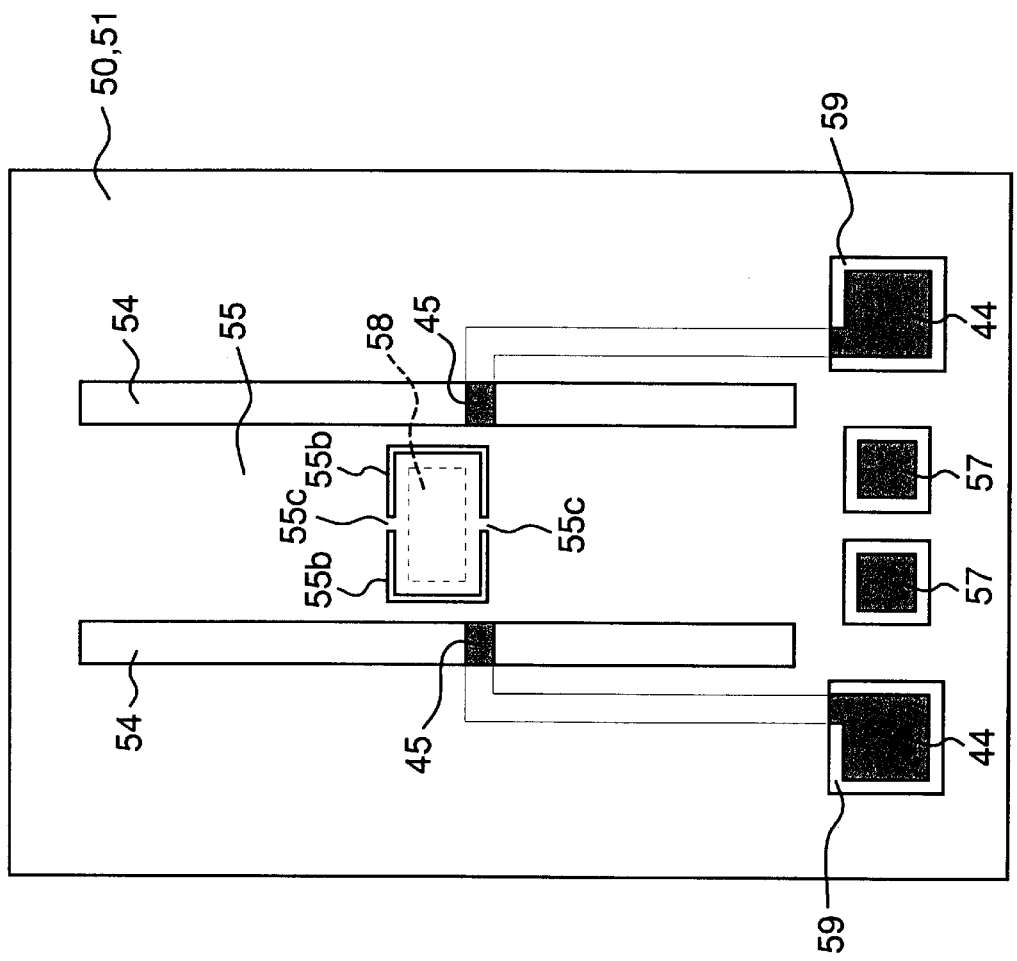
FIG. 30 is a plan view showing a micro-relay according to a seventh embodiment of the present invention.

As shown in FIG. 30, the seventh embodiment is constructed so that a pair of roughly bracket-shaped slits 55b and 55b surrounding the movable contact 58 is provided for the movable piece 55 for the formation of a pair of hinge portions 55c and 55c, thereby pivotally supporting the movable contact 58.

According to the present embodiment, the movable contact 58 pivots via the hinge portions 55c and 55c when the movable contact 58 comes in contact with the fixed contacts 46 and 46. This arrangement has the advantage that the one-side hitting of the movable contact 58 against the fixed contacts 46 and 46 is eliminated, thereby improving the contact reliability.

Figure 31:
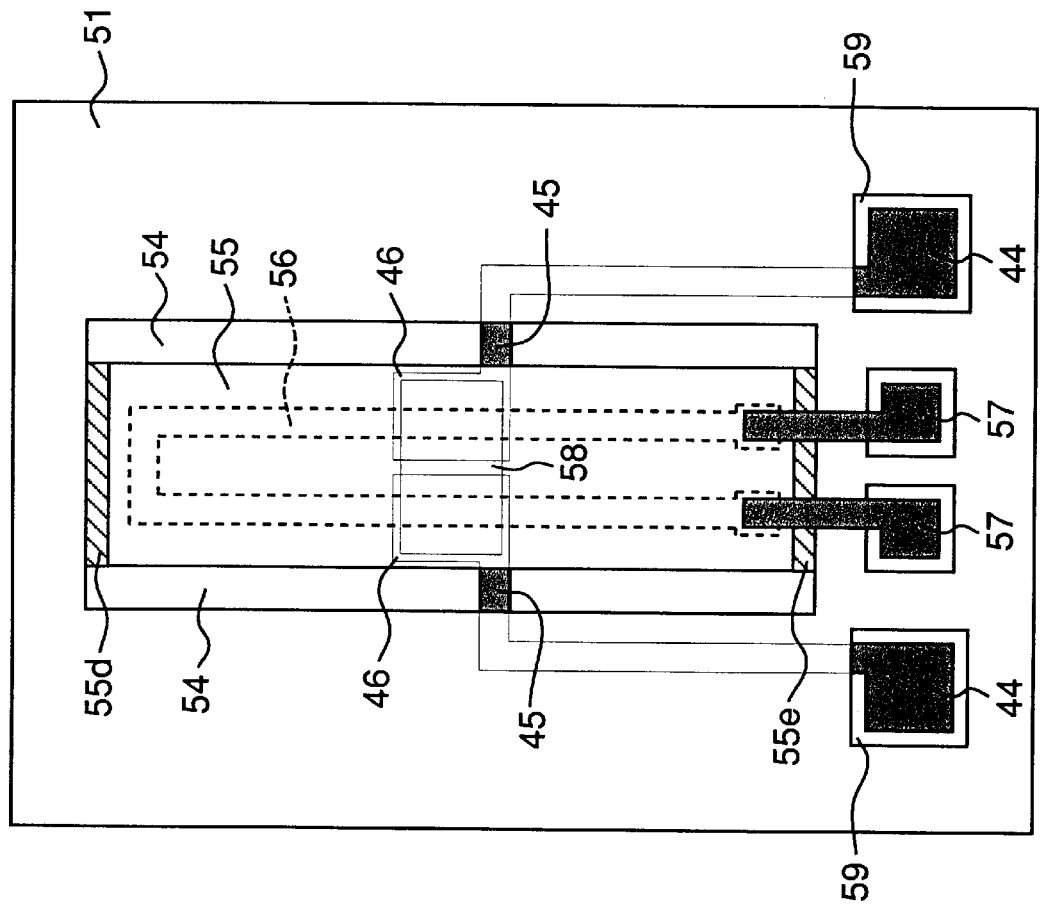
FIG. 31 is a plan view showing a micro-relay according to an eighth embodiment of the present invention.

According to the eighth embodiment, as shown in FIG. 31, the base portion of the movable piece 55 is partitioned by silicon compound portions 55d and 55e made of silicon oxide or silicon nitride. With this arrangement, according to the present embodiment, the connecting pads 57 and 57 extend over the upper surface of the silicon compound portion 55e far to the heater section 56.

In general, the heat conductivities of the silicon, silicon oxide film and silicon nitride film are 1.412 W/(cmK), 0.014 W/(cmK), respectively. The heat conductivities of the silicon oxide film and the silicon nitride film are much smaller than the heat conductivity of silicon. For this reason, even if the heater section 56 of the movable piece 55 generates heats, the silicon compound portions 55d and 55e prevent heat dissipation attributed to heat conduction to the outside, so the silicon compound portions 55d and 55e serve as adiabatic slits. As a result, there is the advantage that an energy-saving type micro-relay having an excellent response characteristic can be obtained.

Figure 32:
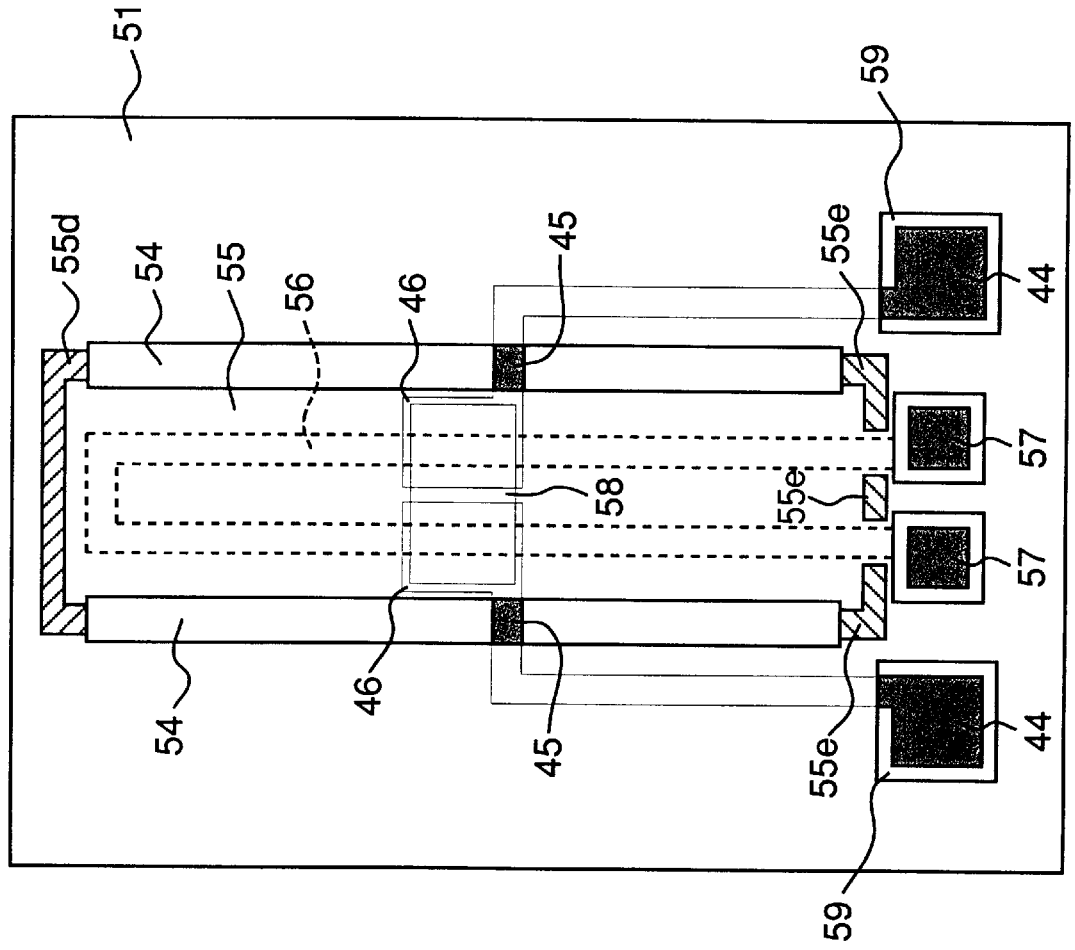
FIG. 32 is a plan view showing a micro-relay according to a ninth embodiment of the present invention.

As shown in FIG. 32, the ninth embodiment is constructed so that the silicon compound portions 55d and 55e are formed near the base portion of the movable piece 55. In particular, the silicon compound portion 55e located near the connecting pad 57 is discontinuous.

Figure 33:
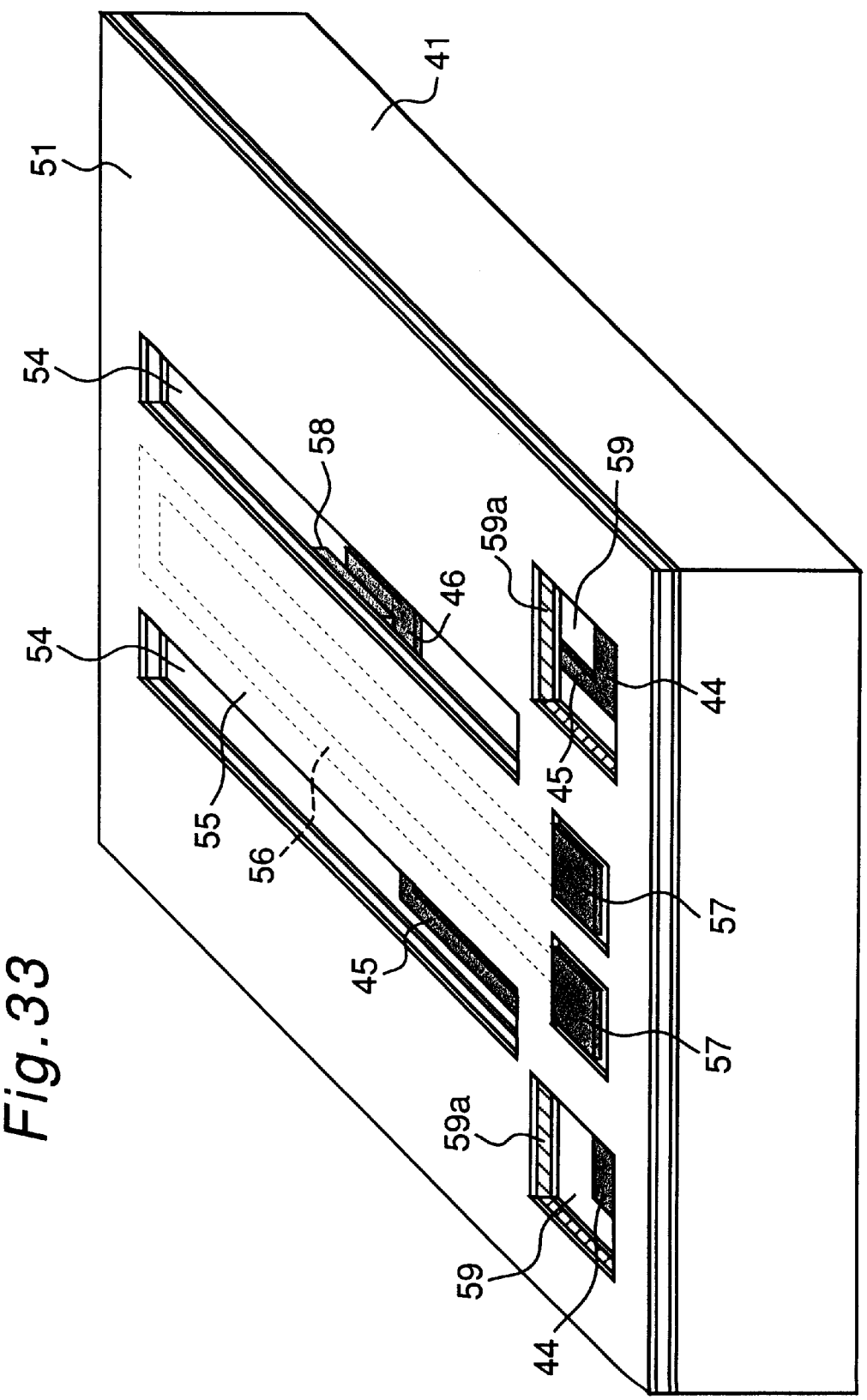
FIG. 33 is a perspective view showing a micro-relay according to a tenth embodiment of the present invention.

As shown in FIG. 33, the tenth embodiment is constructed so that the silicon layer exposed to the outside of the inside surfaces of the connecting use opening portions 59 and 59 are each coated with an insulating film 59a.

According to the present embodiment, there is the advantage that the wires bonded to the signal connecting pads 44 and 44 do not come in contact with the silicon layer of the cover 51 and are not interfered by the driving use power source.

Figure 34:
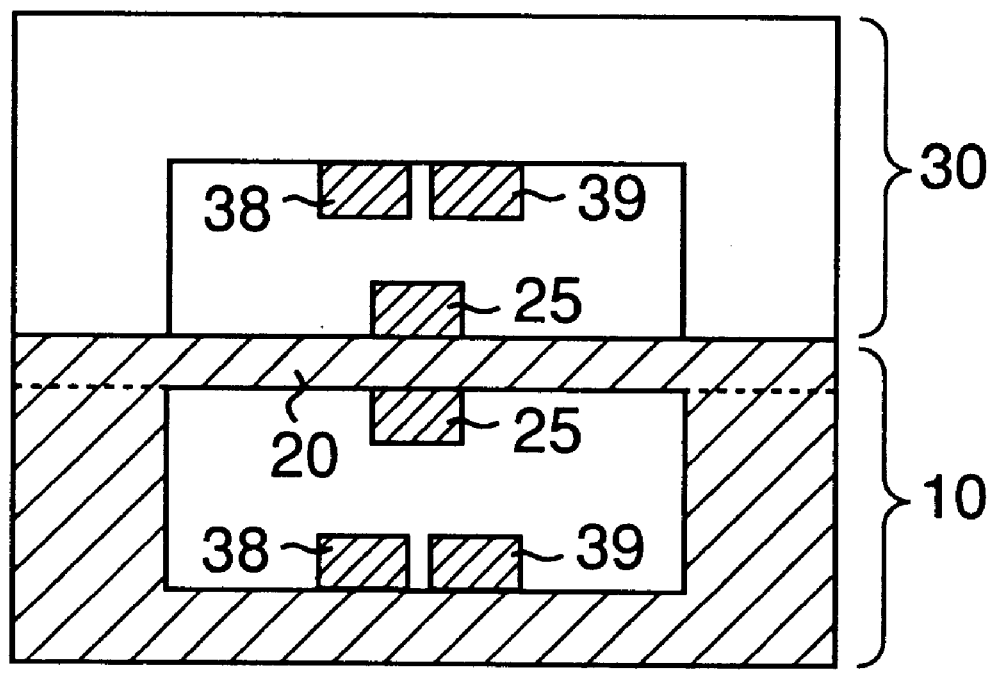
FIG. 34 is a sectional view showing a micro-relay according to an eleventh embodiment of the present invention.

As shown in FIG. 34, the eleventh embodiment is almost similar to the aforementioned first embodiment, and a point of difference is that the movable contacts 25 and 25 are provided on the front and rear surfaces of the movable piece 20. The other portions are almost similar to the aforementioned embodiment, and therefore, no description is provided therefor.

Figure 35:
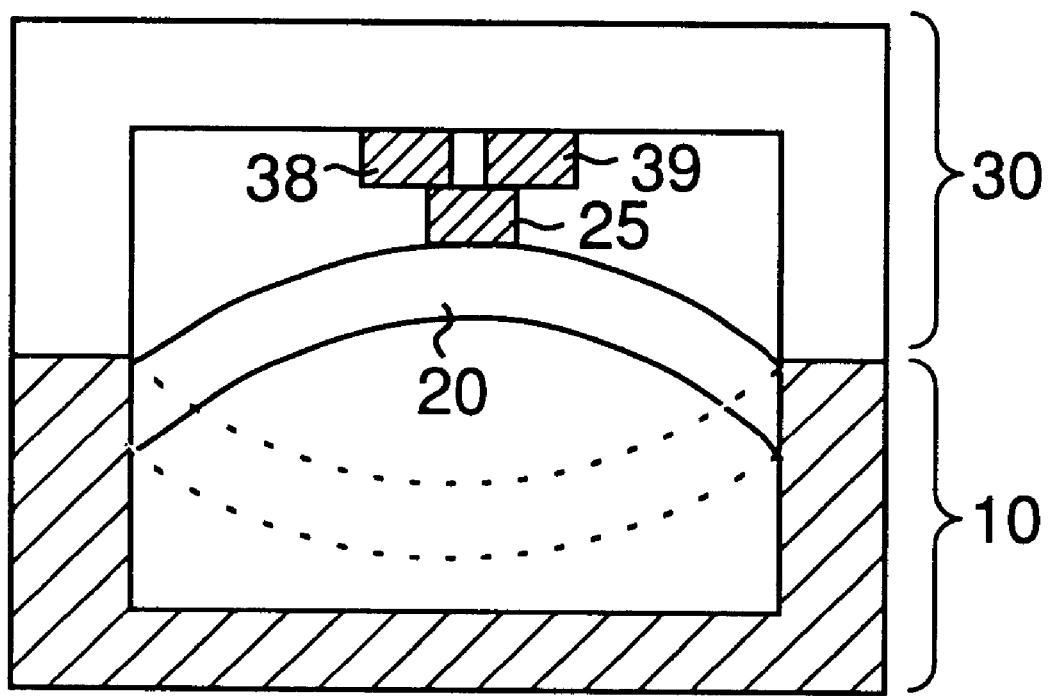
FIG. 35 is a sectional view showing a micro-relay according to a twelfth embodiment of the present invention.

As shown in FIG. 35, the twelfth embodiment is almost similar to the aforementioned first embodiment. A point of difference is that the movable contact 25 is brought in contact with the fixed contacts 38 and 39 by previously curving the movable piece 20 toward the fixed contacts 38 and 39 side, for the provision of a normally-closed micro-relay.

With this arrangement, the movable contact 25 is always put in contact with the pair of fixed contacts 38 and 39 in the restored state. If the driving means is driven as in the aforementioned embodiment, then the movable piece 20 is reversely buckled against the urging force and separated from the fixed contacts 38 and 39. If the driving of the driving means is stopped, the movable piece 20 is reversely buckled by the urging force of the movable piece 20 itself, so that the movable contact 25 is restored into the original state while being brought in contact with the fixed contacts 38 and 39.

According to the present embodiment, the movable contact 25 is put in contact with the fixed contacts 38 and 39 even in an unoperated state, and therefore, an energy-saving type micro-relay having a small consumption power can be obtained.

It is also acceptable to provide the movable contact 25 on the front and rear surfaces of the movable piece 20, thereby alternately making and breaking a plurality of electric circuits.

Figure 36:
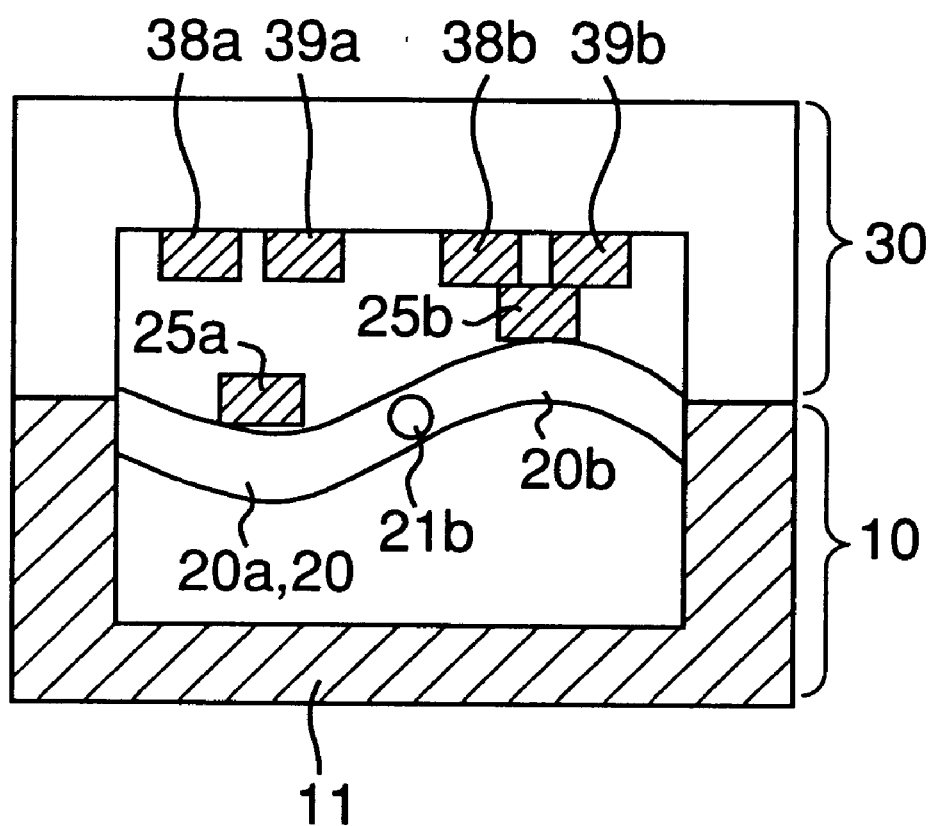
FIG. 36 is a sectional view showing a micro-relay according to a thirteenth embodiment of the present invention.

As shown in FIG. 36, the thirteenth embodiment is constructed so that different electric circuits are alternately opened and closed by two movable contacts 25a and 25b provided on the surface of the base material 20.

That is, pivot axes 21b and 21b are coaxially provided projecting roughly from the center portion of both end portions of the thin plate-shaped substrate 21 constituting the movable piece 20, and the pivot axes 21b and 21b are integrated with the base 11.

Then, one side half 20a of the movable piece 20 is previously curved and urged so as to have a downward convex shape, while the remaining one side half 20b is previously curved and urged so as to have an upward convex shape.

Therefore, before the driving of the driving means, the movable contact 25a is separated from a pair of fixed contacts 38a and 39a, while the movable contact 25b is put in contact with a pair of fixed contacts 38b and 39b.

If the driving means is driven, then the one side half 20a of the movable piece 20 is reversely buckled so as to have an upward convex shape, so that the movable contact 25a comes in contact with the fixed contacts 38a and 39a. At the same time, the one side half 20b of the movable piece 20 is reversely buckled so as to have a downward convex shape, so that the movable contact 25b is separated from the pair of fixed contacts 38b and 39b.

Further, if the driving of the driving means is stopped, then the movable piece 20 is restored into the original state by its own spring force. By this operation, the movable contact 25a is separated from the pair of fixed contacts 38a and 39a. On the other hand, the movable contact 25b comes in contact with the fixed contacts 38b and 39b.

Although the two movable contacts 25a and 25b are arranged on the upper surface of the movable piece 20 in the present embodiment, the present invention is not always limited to this. It is also acceptable to simultaneously make and break four electric circuits by providing two movable contacts on each of the front and rear surfaces of the movable piece 20.

For the driving means of the aforementioned first embodiment through thirteenth embodiment, it is, of course, possible to select at need either the combination of the normal piezoelectric element, the shape memory piezoelectric element, the single body of the heater layer, the driving layer constructed of the heater layer and the metal material or the heater section constructed of the diffused resistor.

Furthermore, according to the aforementioned embodiments, there is no need for providing the printed wiring for the movable contact, and it is only required to form the printed wiring only for the fixed contact. For this reason, a micro-relay that has a small number of manufacturing processes and a high productivity can be obtained.

Furthermore, according to the aforementioned embodiment, there is no need for providing the printed wiring for the movable piece. Even if warp occurs in the movable piece, no disconnection of the printed wiring line occurs, ensuring a long operating life.

Then, according to the aforementioned embodiments, the contact structure becomes so-called the double-break, and this carries the advantage that the insulating property is good.

Furthermore, it is acceptable to prevent the generation of an insulating substance at the time of opening and closing the contacts by driving the movable piece in a vacuum or an environment filled with an inert gas such as neon or argon.

FIRST EXAMPLE

A micro-relay constructed of a movable piece that was obtained by successively laminating an oxide film having a thickness of 1.4 $\mu$m, a lower electrode having a thickness of 0.3 $\mu$m, a piezoelectric element having a thickness of 2 $\mu$m and an upper electrode having a thickness of 0.3 $\mu$m on the upper surface of the thin plate-shaped substrate having a thickness of 20 $\mu$m constructed of a silicon wafer constituting the movable piece so as to have a total thickness of 24 $\mu$m, a span of 4 mm and a width of 0.8 mm was subjected to calculation of a contact load and the amount of deformation with respect to an applied voltage. The results of calculation are shown in FIG. 37A and FIG. 37B.

Figure 37A:
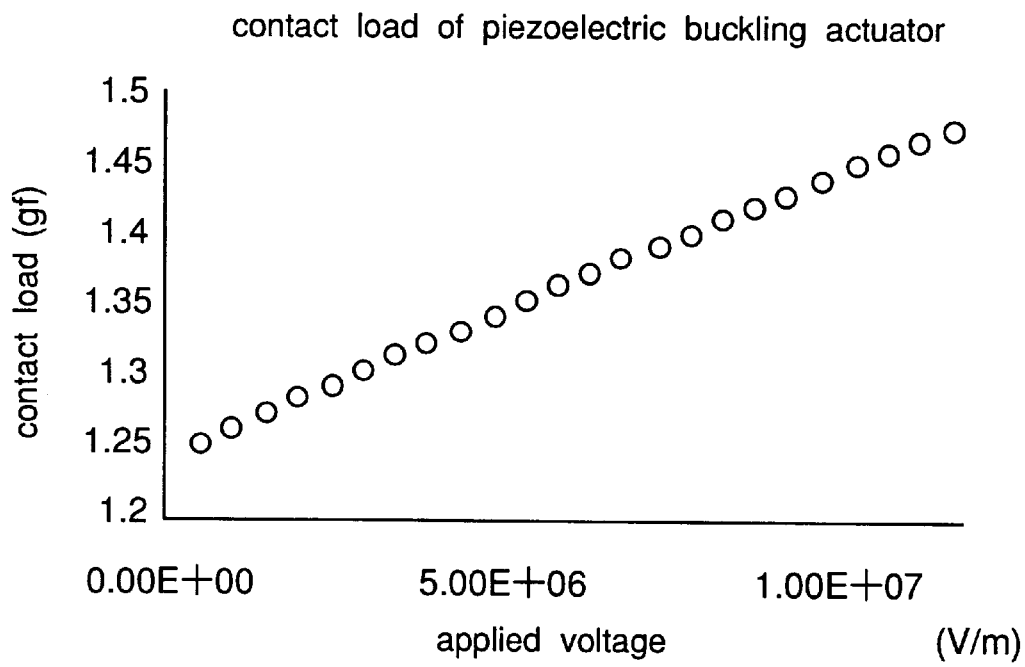
FIG. 37A is a graph showing the theoretical operating characteristics of a micro-relay that utilizes a piezoelectric element, and in particular, a relation between an application voltage and a contact load.
Figure 37B:
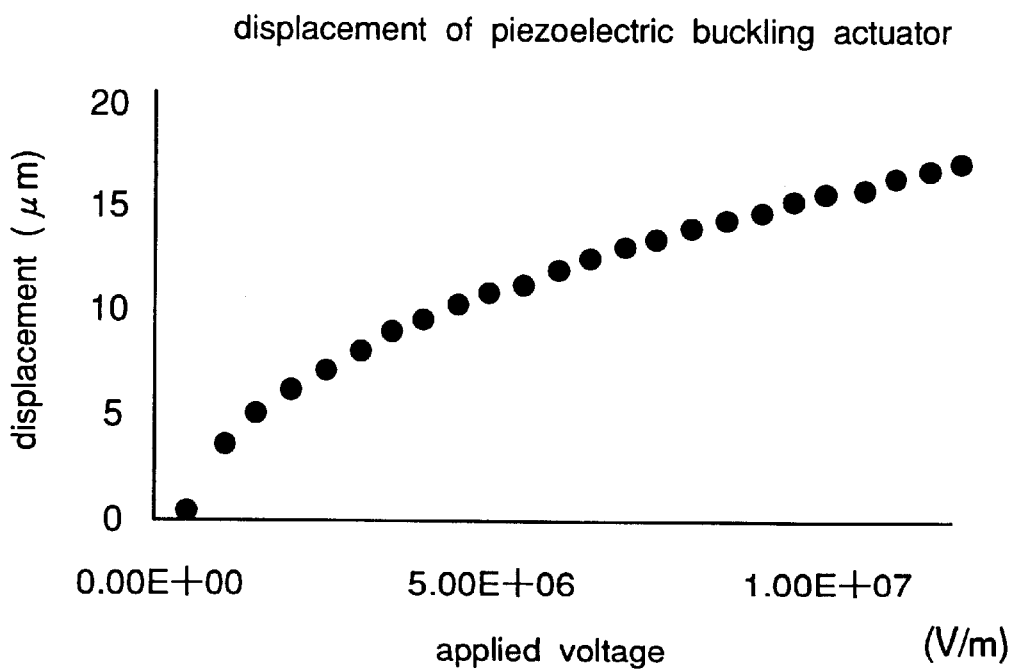
FIG. 37B is a graph showing a relation between the application voltage and a displacement.

According to FIG. 37A and FIG. 37B, it can be appreciated that specified contact pressure and displacement can be obtained by merely controlling the applied voltage to the piezoelectric element.

SECOND EXAMPLE

A micro-relay constructed of a movable piece that was obtained by forming a heater layer having a depth of 3 $\mu$m inside the surface layer portion of the thin plate-shaped substrate having a thickness of 20 $\mu$m constructed of a silicon wafer constituting the movable piece, forming an insulative oxide film having a thickness of 1.1 $\mu$m on the upper surface of this heater layer so as to have a total thickness of 21.1 $\mu$m, a span of 4 mm and a width of 0.8 mm was subjected to calculation of a contact load and the amount of deformation with respect to an applied voltage. The results of calculation are shown in FIG. 38A and FIG. 38B.

Figure 38A:
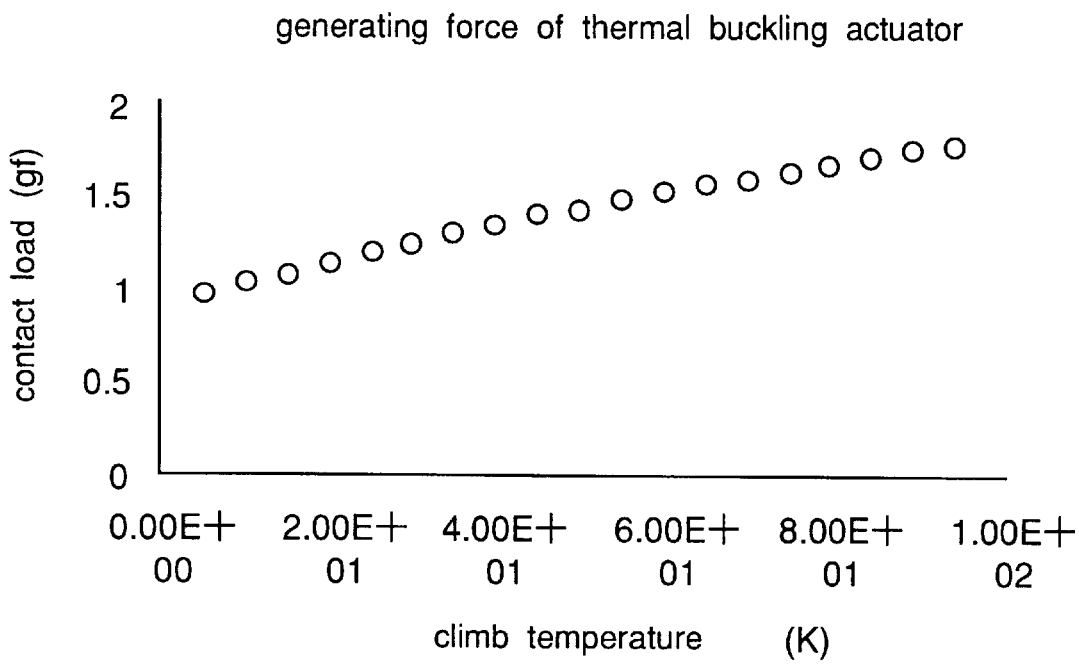
FIG. 38A is a graph showing the theoretical operating characteristics of a micro-relay that concurrently uses a heater layer for a driving layer, and in particular, a relation between a temperature rise and the contact load.
Figure 38B:
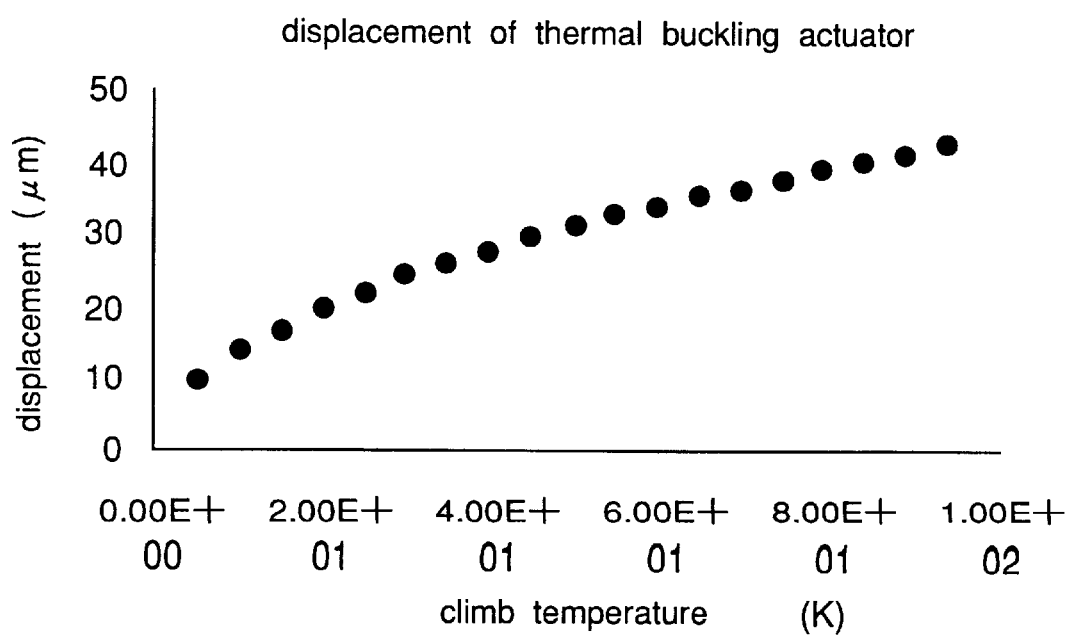
FIG. 38B is a graph showing a relation between the temperature rise and the displacement.

According to FIG. 38A and FIG. 38B, it can be appreciated that specified displacement and contact pressure can be obtained by merely controlling the applied voltage for adjusting the heat generation of the heater layer.

The matrix relays of the fourteenth through seventeenth embodiments for achieving the second object will be described next with reference to the accompanying drawings of FIG. 39A through FIG. 45.

Figure 39A:
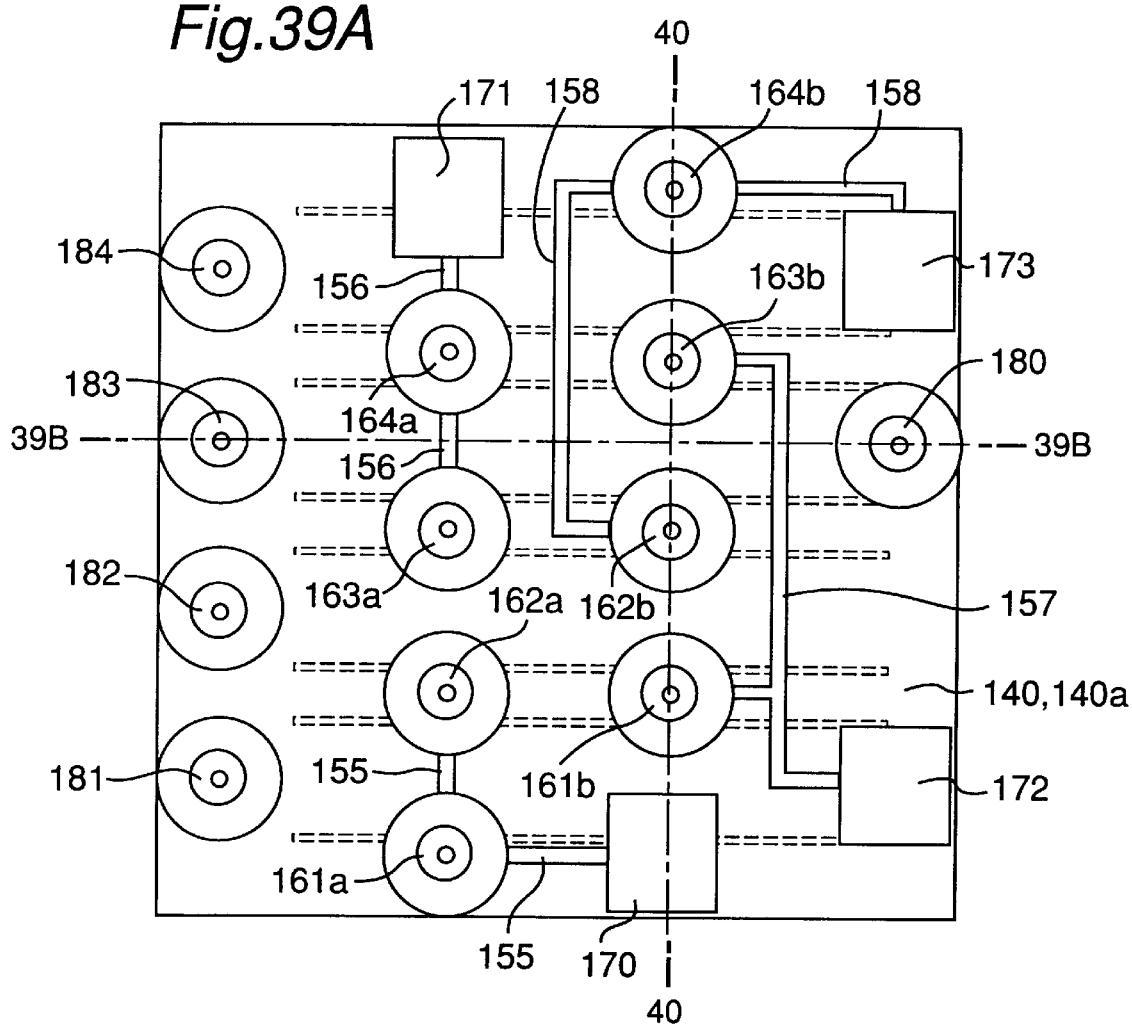
FIG. 39A is a plan view showing the micro-relay of a fourteenth embodiment that is a matrix relay.
Figure 41A:
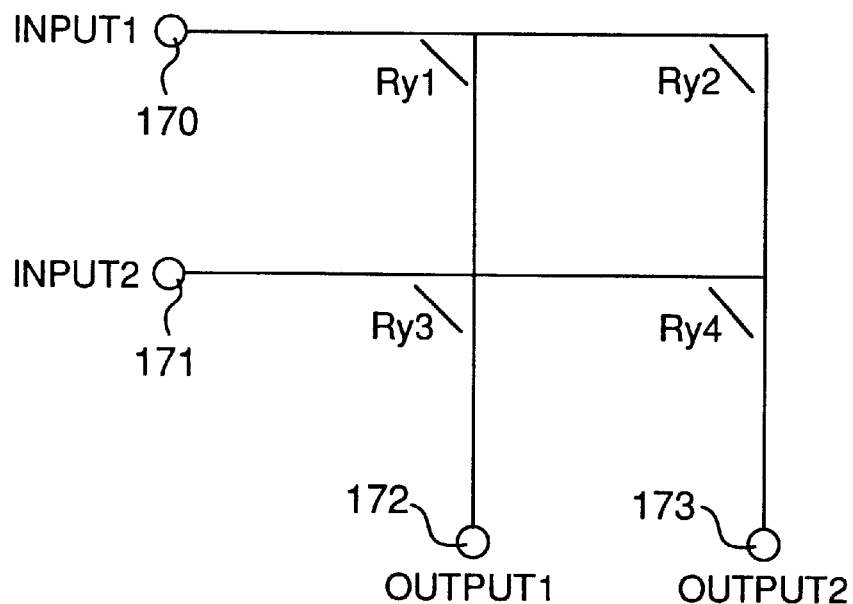
FIG. 41A is a matrix circuit diagram showing the circuit of the matrix relay of FIG. 39A and FIG. 39B.
Figure 41B:
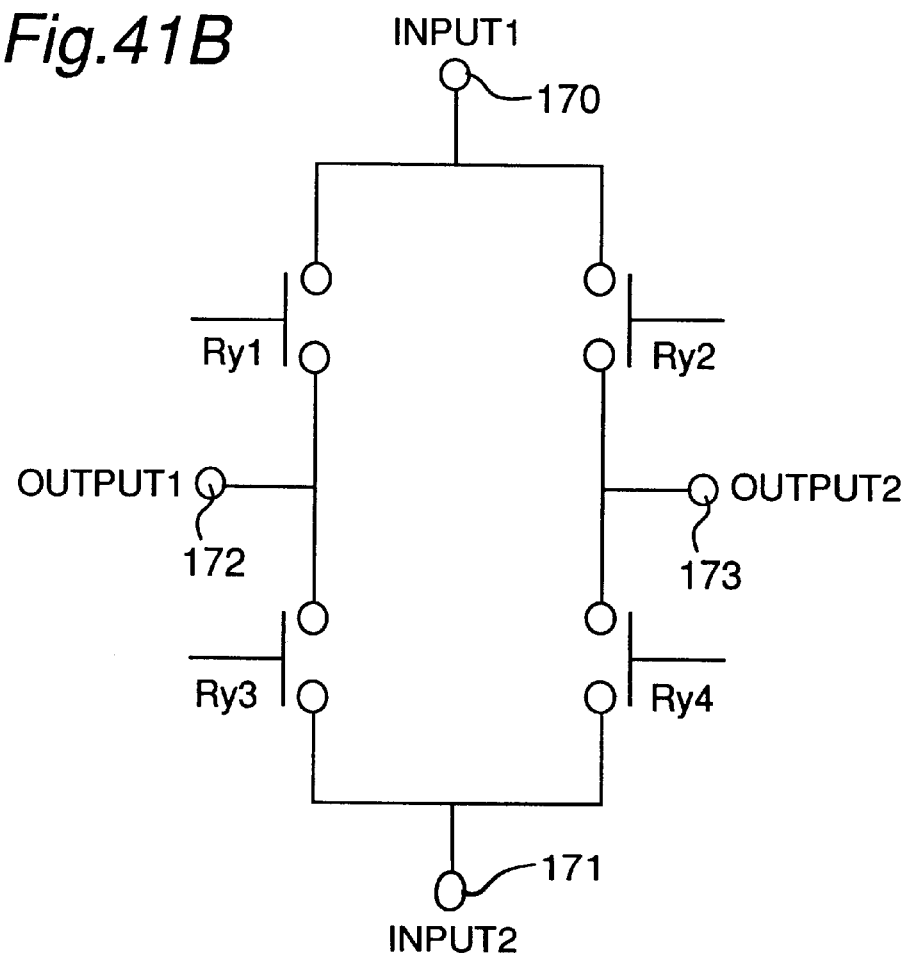
FIG. 41B is a circuit diagram redrawn for providing a better view of FIG. 41A.

As shown in FIG. 39A and FIG. 41B, the fourteenth embodiment is a matrix relay formed by successively laminating a movable piece unit 120 and a cover 140 on a base 110 and connecting and integrating them with one another.

The base 110 is obtained by arranging parallel four shallow grooves 111, 112, 113 and 114 at a specified pitch on the upper surface of a silicon wafer 110a.

The movable piece unit 120 is obtained by arranging in an insulated state parallel first, second, third and fourth movable pieces 121, 122, 123 and 124 extended over a rectangular frame-shaped silicon wafer 120a. The first, second, third and fourth movable pieces 121, 122, 123 and 124 are formed by laminating an insulating film 126 on the upper surface of a monocrystal thin plate-shaped substrate 125 and further successively laminating a lower electrode 127, a piezoelectric element 128 and an upper electrode 129. In the center portion of the insulating film 126 is arranged a movable contact 130 in an insulated state.

Then, by stacking the movable piece unit 120 on the base 110 and connecting and integrating them with each other, the first, second, third and fourth movable pieces 121, 122, 123 and 124 are positioned above the shallow grooves 111, 112, 113 and 114, and their both ends are fixed and supported to the opening edge portions of the base 110.

Figure 39B:
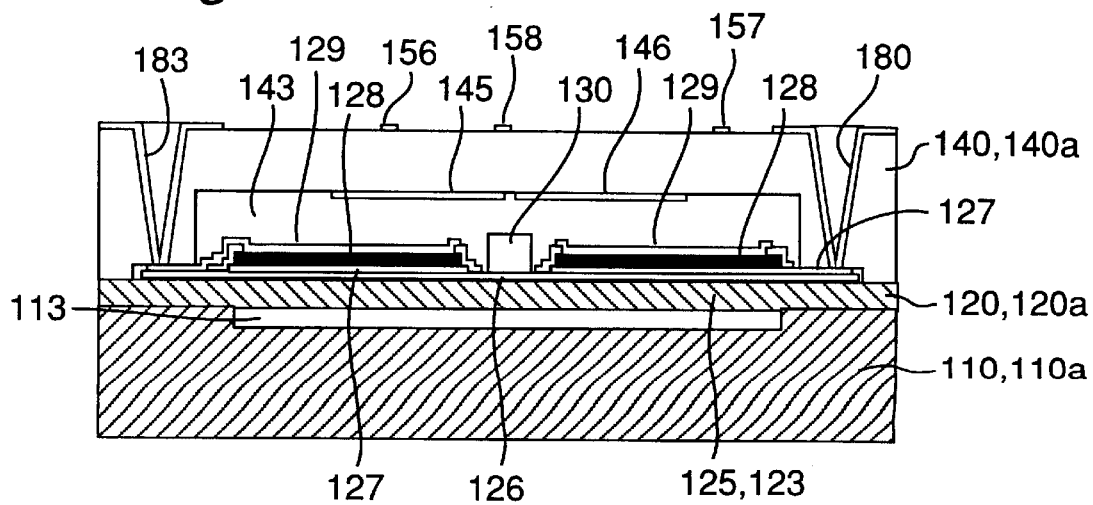
FIG. 39B is a sectional view taken along the line 39B—39B in FIG. 39A.
Figure 40:
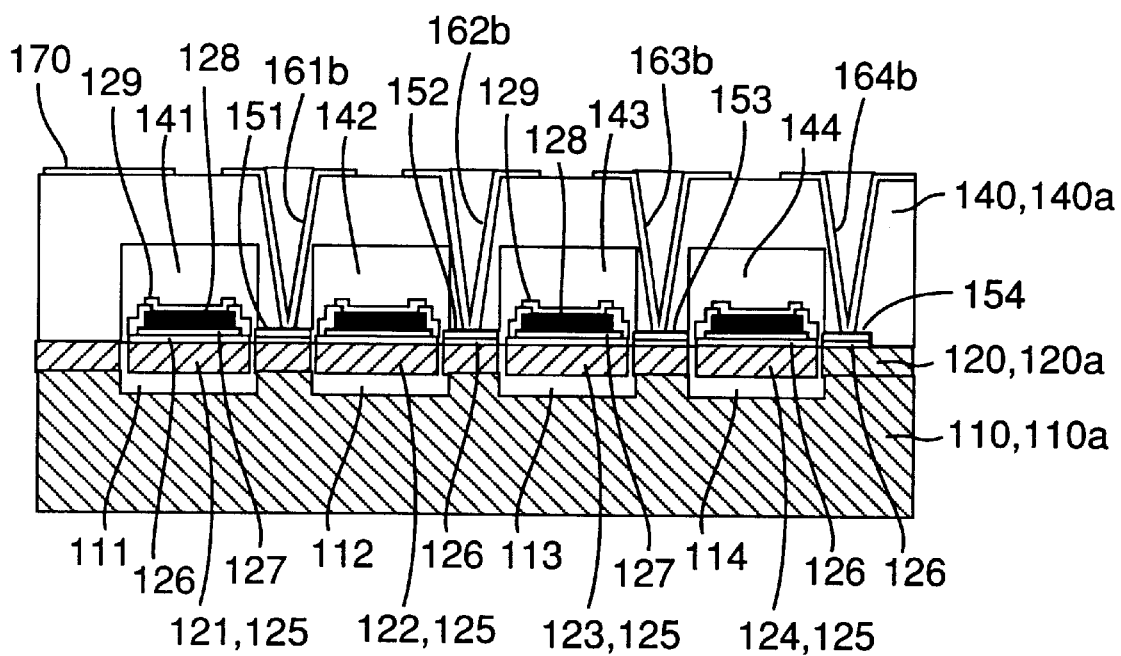
FIG. 40 is a sectional view taken along the line 40—40 in FIG. 39A.

The lower electrode 127, the piezoelectric element 128 and the upper electrode 129 are illustrated as if they were separated apart by the movable contact 130 in FIG. 39B, however, the lower electrodes 127, piezoelectric elements 128 and upper electrodes 129 located on the left-hand and right-hand sides are electrically connected to the respective counterparts.

The cover 140 is formed by arranging at a specified pitch parallel deep grooves 141, 142, 143 and 144 that become the inner spaces, on the lower surface of a glass wafer 140a and providing a pair of fixed contacts 145 and 146 on the ceiling surfaces of the deep grooves 141, 142, 143 and 144 in positions corresponding to the movable contacts 130.

The fixed contacts 145 are connected to the respective through holes 161a, 162a, 163a and 164a provided on the glass wafer 140a via printed wiring lines (not shown) along the lower surface of the glass wafer 140a and led to the surface of the cover 140.

Likewise, the fixed contacts 146 are connected to the respective through holes 161b, 162b, 163b and 164b provided on the glass wafer 140a via printed wiring lines 151, 152, 153 and 154 formed along the lower surface of the glass wafer 140a and made to be electrically connectable on the surface of the cover 140.

Then, the through holes 161a and 162a are electrically connected to an input use first connecting pad 170 via a printed wiring line 155, while the through holes 163a and 164a are electrically connected to an input use second connecting pad 171 via a printed wiring line 156. Further, the through holes 161b and 163b are electrically connected to an output use first connecting pad 172 via a printed wiring line 157. The through holes 162b and 164b are electrically connected to an output use second connecting pad 173 via a printed wiring line 158.

The four lower electrodes 127 are electrically connected to a driving use common through hole 180 provided at the cover 140. On the other hand, the four upper electrodes 129 are electrically connected to driving use through holes 181, 182, 183 and 184 provided at the cover 140.

Therefore, inputs 1 and 2 and outputs 1 and 2 in the circuit diagrams of FIGS. 41A and 41B correspond to the connecting pads 170 and 171 and the connecting pads 172 and 173, respectively.

Ry 1, 2, 3 and 4 in FIGS. 41A and 41B correspond to the relays constructed of the aforementioned first, second, third and fourth movable pieces 121, 122, 123 and 124, respectively.

The operation of the matrix relay having the above-mentioned construction will be described next.

First, if no voltage is applied to the lower electrode 127 of the first movable piece 121 and the upper electrode 129, then the piezoelectric element 128 is not excited, when the first movable piece 121 remains flat and the movable contact 130 is separated from the fixed contacts 145 and 146.

If a voltage is applied via the driving use common through hole 180 and the driving use through hole 181 so that the piezoelectric element 128 curves upward, then the first movable piece 121 curves upward against the spring force of the thin plate-shaped substrate 125. By this operation, the movable contact 130 comes in contact with the fixed contacts 145 and 146, and the connecting pads 170 and 172 continue each other from the through holes 161a and 161b via the printed wiring line 155 and 157.

Further, if the aforementioned voltage application is released, then the first movable piece 121 is restored into the original state by the spring force of the thin plate-shaped substrate 125, and the movable contact 130 separates from the fixed contacts 145 and 146.

Subsequently, if a voltage is applied similarly via the through holes 180 and 182 so that the piezoelectric element 128 of the second movable piece 122 curves upward, then the second movable piece 122 curves upward. By this operation, the movable contact 130 comes in contact with the fixed contacts 145 and 146, and the connecting pads 170 and 173 continue each other from the through holes 162a and 162b via the printed wiring line 155 and 158.

If a voltage is applied via the through holes 180 and 183 so that the piezoelectric element 128 of the third movable piece 123 curves upward, then the third movable piece 123 curves upward. By this operation, the movable contact 130 comes in contact with the fixed contacts 145 and 146, and the connecting pads 171 and 172 continue each other from the through holes 163a and 163b via the printed wiring line 156 and 157.

Further, if a voltage is applied via the through holes 180 and 184 so that the piezoelectric element 128 of the fourth movable piece curves upward, then the fourth movable piece 124 curves upward. By this operation, the movable contact 130 comes in contact with the fixed contacts 145 and 146, and the connecting pads 171 and 173 continue each other from the through holes 164a and 164b via the printed wiring line 156 and 158.

Although the aforementioned fourteenth embodiment has been described on the basis of the use of the normal piezoelectric element 128 that is restored into the original state upon the release of the application voltage. However, the present invention is not always limited to this, and it is acceptable to use a shape memory piezoelectric element that retains the deformed state even when the application voltage is released and is restored into the original state when a voltage is applied in the opposite direction, for the provision of the so-called latching type matrix relay.

Figure 42A:
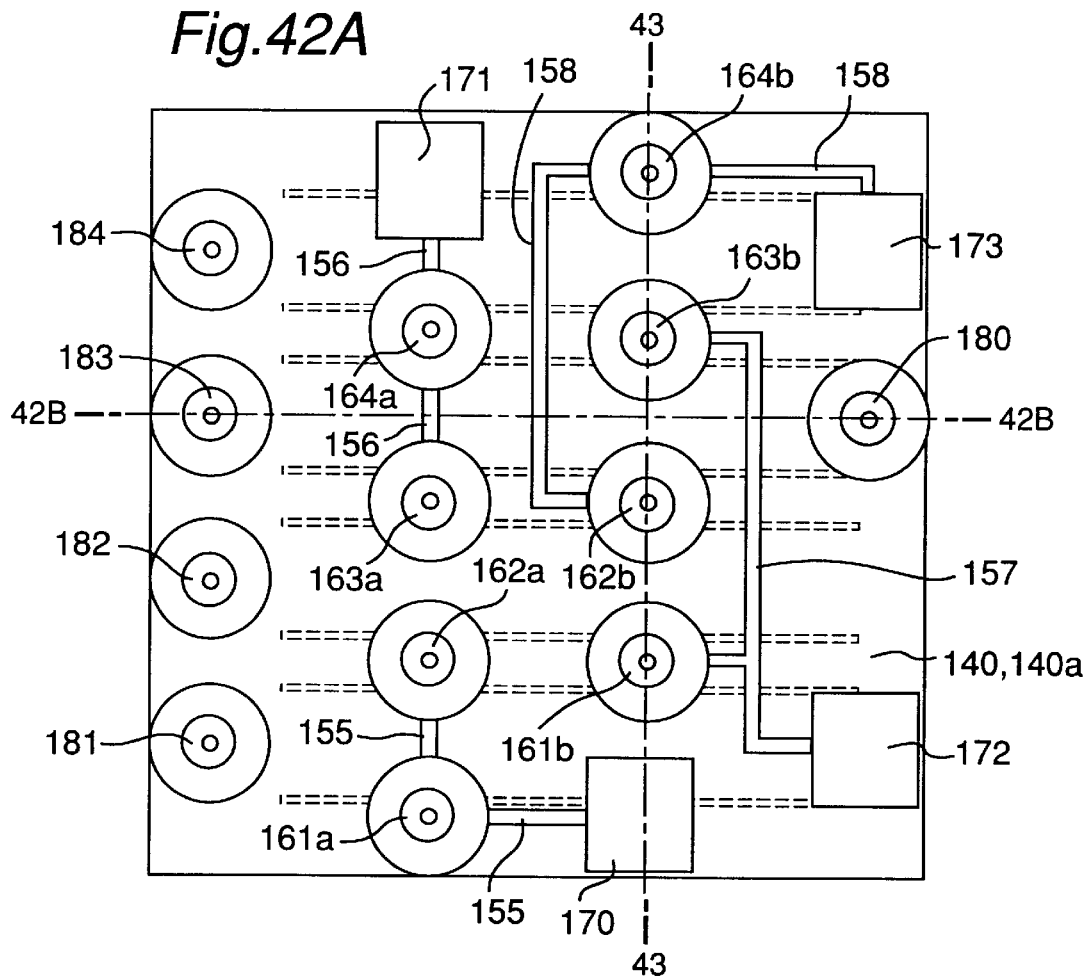
FIG. 42A is a plan view showing a matrix relay according to a fifteenth embodiment of the present invention.
Figure 42B:
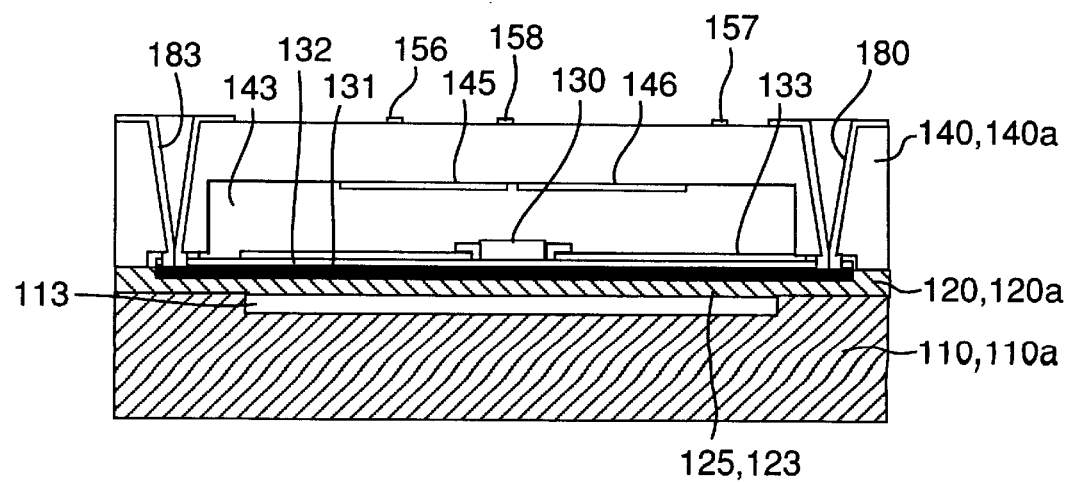
FIG. 42B is a sectional view taken along the line 42B—42B in FIG. 42A.
Figure 43:
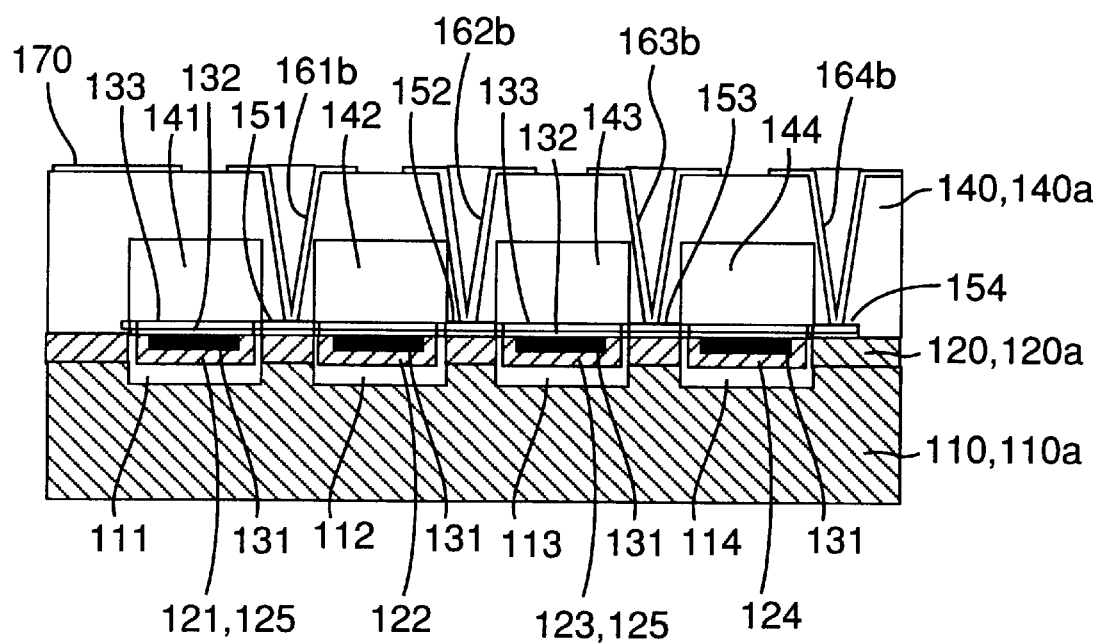
FIG. 43 is a sectional view taken along the line 43—43 in FIG. 42A.

As shown in FIG. 42A, FIG. 42B and FIG. 43, the fifteenth embodiment is almost similar to the aforementioned first embodiment, and a point of difference is that a deformation by virtue of the thermal expansion of the first, second, third and fourth movable pieces 121, 122, 123 and 124 is utilized in contrast to the first embodiment that utilizes the deformation of the piezoelectric element 28.

That is, the first, second, third and fourth movable pieces 121, 122, 123 and 124 are constructed of a heater layer 131 whose electrical resistance is increased by injecting boron or the like into the surface of the thin plate-shaped substrate 125 made of a monocrystal and a driving layer 133 that is formed by laminating a metal material via an insulating film 132. Then, a movable contact 130 is arranged in an insulated state in the center portion of the insulating film 132.

The operation of the matrix relay of the fifteenth embodiment will be described next.

For example, as shown in FIGS. 42A and 42B, if no current is flowing through the heater layer 131 of the third movable piece 123, then the heater layer 131 does not generate heat, and therefore, the driving layer 133 does not expand. For this reason, the first movable piece 121 remains flat, and the movable contact 130 thereof is separated from the fixed contacts 145 and 146.

If a current is made to flow through the heater layer 131 via the driving use common through hole 180 and the driving use through hole 183, then the heater layer 131 generates heat, thereby heating the thin plate-shaped substrate 125 and the driving layer 133. However, the coefficient of thermal expansion of the driving layer 133 is much larger than the coefficient of thermal expansion of the thin plate-shaped substrate 125, and therefore, the third movable piece 123 curves upward against the spring force of the thin plate-shaped substrate 125. By this operation, the movable contact 130 comes in contact with the fixed contacts 145 and 146. Consequently, the connecting pads 170 and 172 continue each other from the through holes 163a and 163b via the printed wiring lines 156 and 157.

Further, if the aforementioned voltage application is released, then the third movable piece 123 is restored into the original state against the spring force of the thin plate-shaped substrate 125, and the movable contact 130 separates from the fixed contacts 145 and 146.

It is to be noted that the operations of the other first, second and fourth movable pieces 121, 122 and 124 are similar to those of the fourteenth embodiment, and therefore, no description is provided for them.

Each movable piece may be formed of only the heater layer as the driving means. Furthermore, the heater layer may be formed by laminating a metal material of platinum, titanium or the like or a polysilicon on the surface of the thin plate-shaped substrate.

Figure 44:
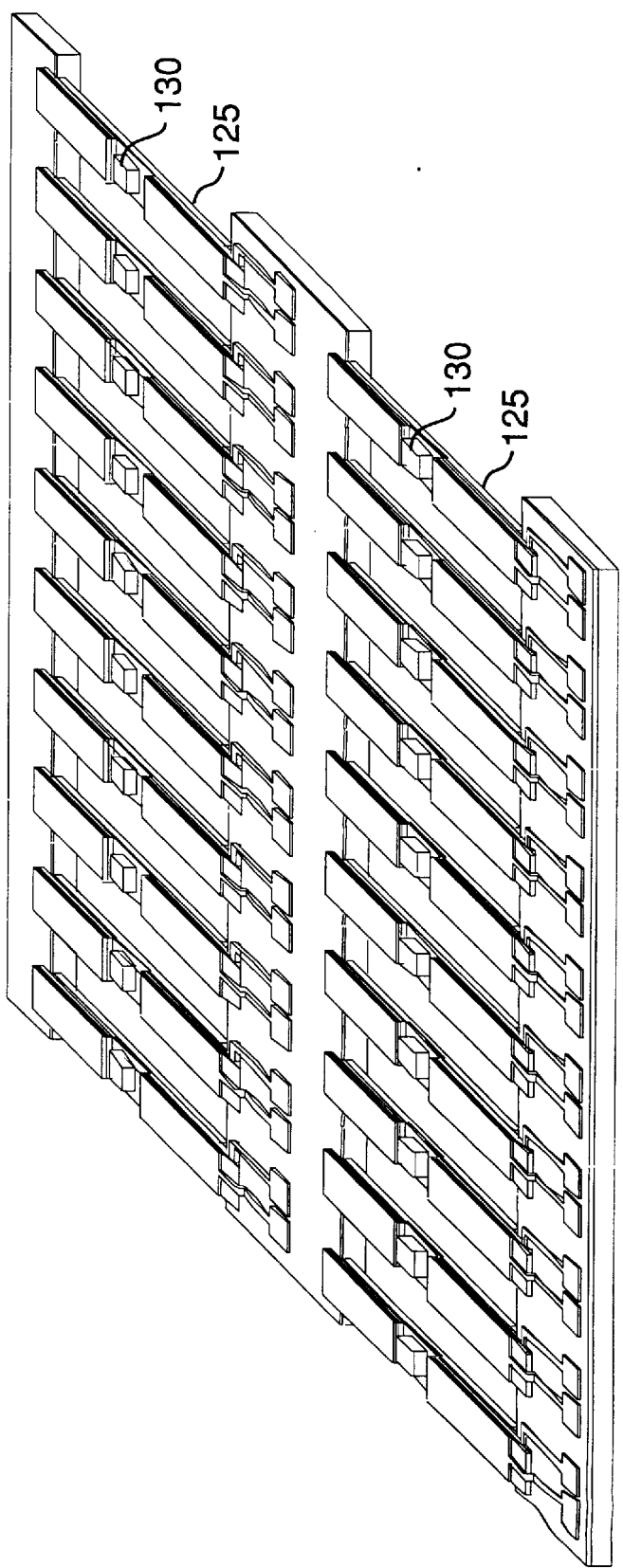
FIG. 44 is a perspective view of a sixteenth embodiment showing a number of movable pieces arranged parallel for constituting a matrix relay.
Figure 45:
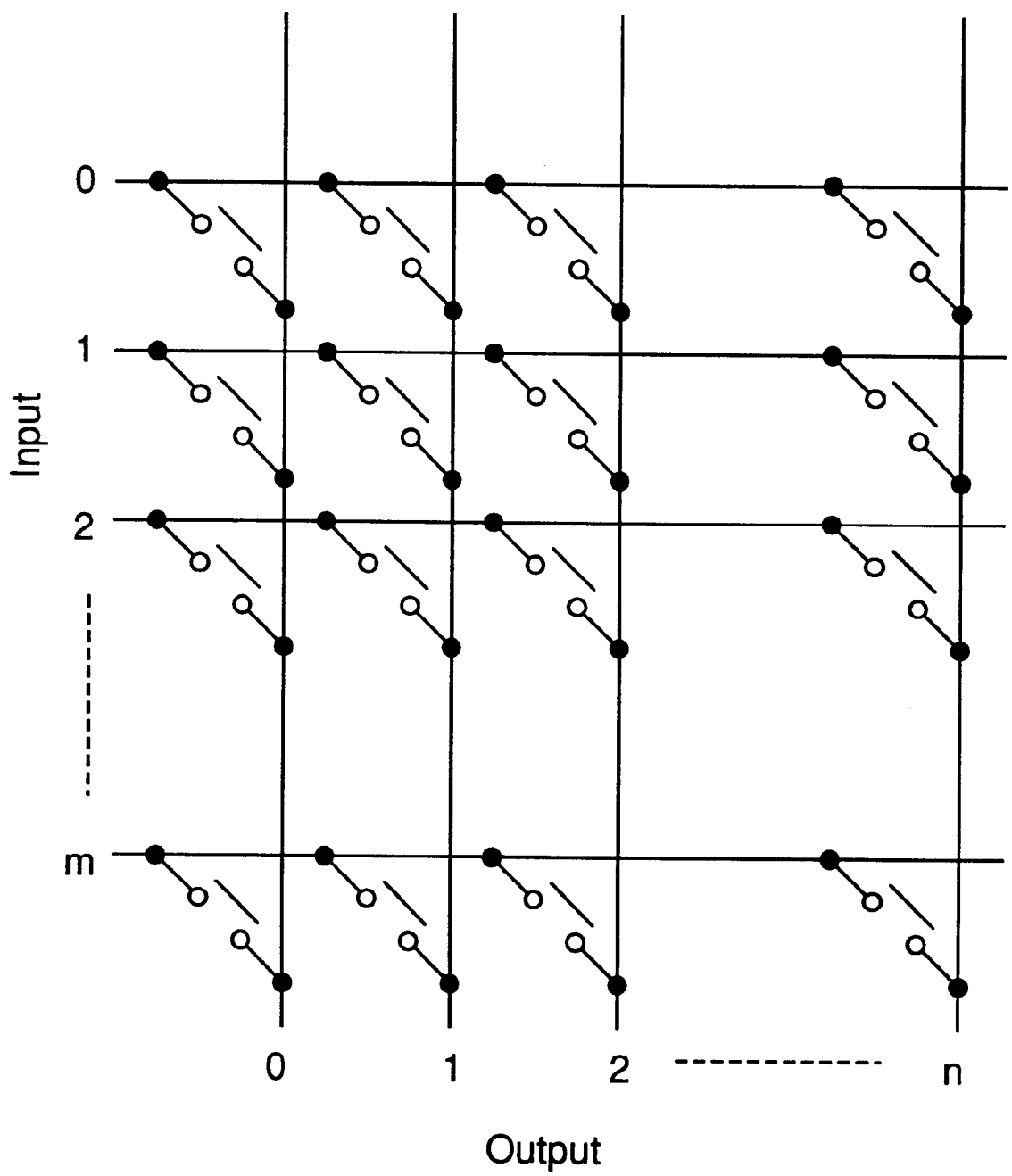
FIG. 45 is a circuit diagram of a matrix relay according to a seventeenth embodiment, constructed of a number of relay elements.

Although the aforementioned embodiment has been described on the basis of the matrix relay in which the four movable pieces are arranged parallel, the present invention is not always limited to this. As shown in FIG. 44 of the sixteenth embodiment or FIG. 45 of the seventeenth embodiment, it is, of course, acceptable to apply the present invention to a matrix relay in which more than four movable pieces are arranged parallel. As a connecting method of the fixed contacts in this case, there is, for example, a connection method with a print wiring of a multi-layer structure formed on the surface of the cover via through holes provided at the cover.

An electronic component according to the eighteenth embodiment for achieving the third object will be described next with reference to the accompanying drawings of FIG. 46 and FIG. 47.

The present embodiment is the application thereof to a micro-relay, which is constructed of a micro-relay chip 210, a box-shaped substructure 230 and a heat sink 240.

The micro-relay chip 210 has built-in five contact mechanisms arranged parallel and is constructed of a base 211 made of a silicon monocrystal whose one surface is formed with a recess 212, a movable piece 213 whose both ends are fixed and supported to the opening edge portion of this base 211 and a cover 220 constructed of a glass wafer 221 integrated by anodic bonding with the base 211.

The movable piece 213 is formed by laminating a driving layer 217 made of a metal material via an insulating film 216 on a heater layer 215 whose electrical resistance is increased by injecting boron or the like into the one side surface layer of a thin plate-shaped substrate 214 made of silicon monocrystal. Further, in the center portion of the insulating film 216 is arranged a movable contact 218 in an insulated state.

The cover 220 is obtained by forming a pair of fixed contacts 223 and 224 on the bottom surface of the recess portion 222 provided on one side of the glass wafer 221.

Figure 46:
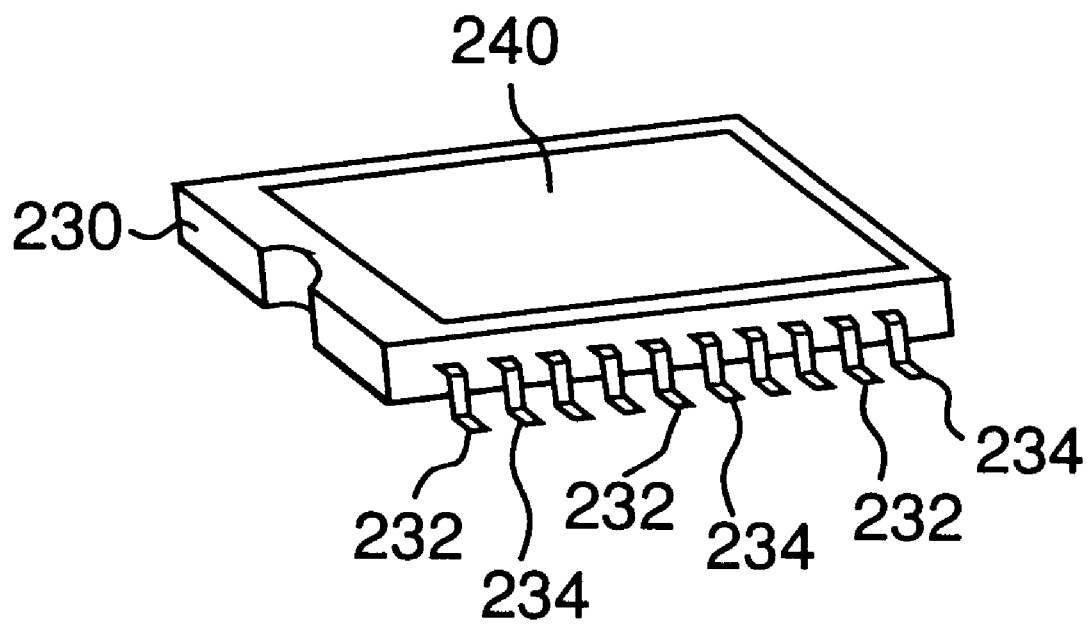
FIG. 46 is a perspective view of an electronic component according to an eighteenth embodiment of the present invention.
Figure 47:
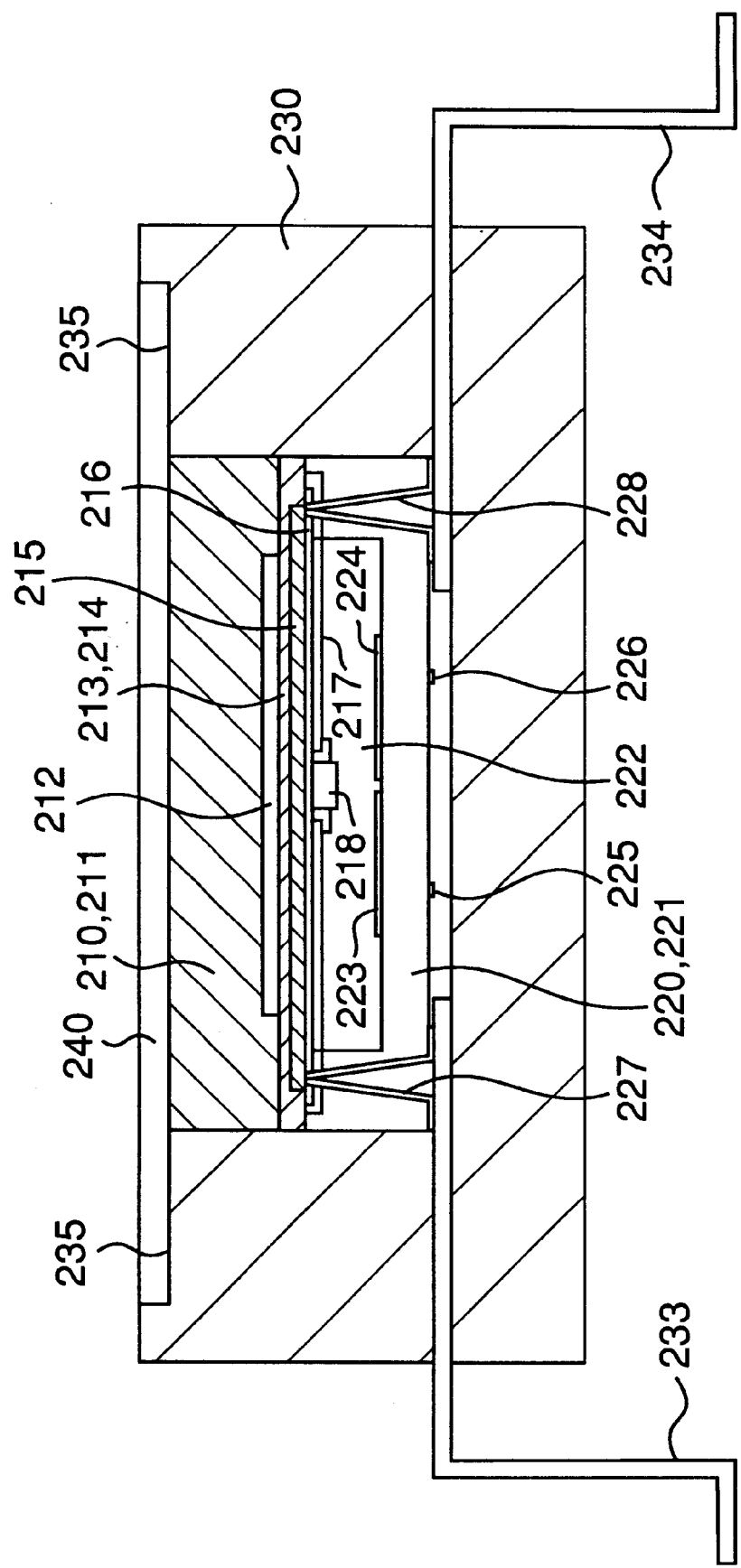
FIG. 47 is a cross sectional view of the electronic component shown in FIG. 46.

The fixed contacts 223 and 224 are led to the surface of the glass wafer 221 via an input/output use through hole (not shown) and electrically connected to input/output use external terminals 231 and 232 (the external terminal 231 located on the rear side is not shown in FIG. 46) of the substructure 230 via print wiring lines 225 and 226.

Further, the glass wafer 221 is formed with through holes 227 and 228 for electrical connection to the heater layer 215 of the movable piece 213. The through holes 227 and 228 are electrically connected to driving use input terminals 233 and 234, which will be described later.

A method for assembling the micro-relay of the present embodiment will be described next.

First, a lead frame (not shown) is subjected to press processing so as to alternately punching the input/output use external terminals 231 and the driving use external terminals 233 in a comb-like shape and form the input/output use external terminals 232 and the driving use external terminals 234 in a similar manner. Then, an input/output use through hole (not shown) and the driving use through holes 227 and 228 of the microchip 210 are each positioned and electrically connected to the free end portions of the external terminals 231 and 234.

Subsequently, the micro-relay chip 210 is held between a pair of metal molds, and the substructure 230 is integrally formed so that the bottom surface of the base 211 is exposed.

Further, a plate-shaped heat sink 240 made of copper, aluminum, brass or the like having a great heat conductivity is fit in an annular stepped portion 235 formed on the upper surface of the substructure 230, and thereafter the external terminals 231 through 234 are cut from the lead frame. Thereafter, by bending the tip portions of the terminals, the assembling work is completed.

The operation of the micro-relay having the above-mentioned construction will be described.

If no current is flowing from the driving use external terminals 233 and 234 through the heater layer 215 of the movable piece 213, then the movable piece 213 remains flat, and the movable contact 218 is separated from the pair of fixed contacts 223 and 224.

Subsequently, if a current flows through the heater layer 215 from the driving use through holes 227 and 228 via the driving use external terminals 233 and 234, then the heater layer 215 generates heat to thermally expand the thin plate-shaped substrate 214 and the driving layer 217. Then, the coefficient of thermal expansion of the driving layer 217 is much greater than the coefficient of thermal expansion of the thin plate-shaped substrate 214, and therefore, the movable piece 213 is curved toward the fixed contacts 223 and 224 side. Subsequently, the movable contact 218 comes in contact with the pair of fixed contacts 223 and 224, thereby making an electric circuit.

If the aforementioned current is interrupted to stop the heat generation of the heater layer 215, then the thin plate-shaped substrate 214 and the driving layer 217 are cooled to contract. By this operation, the movable piece 213 is restored into the original state, and the movable contact 218 separates from the fixed contacts 223 and 224.

Although the above-mentioned embodiment has been described on the basis of the external terminals 231, 232, 233 and 234 and the heat sink 240 constructed of members. However, the present invention is not always limited to this, and it is acceptable to simultaneously punch and bend the external terminals and the heat sink from the lead frame, position the micro-relay chip between the external terminals and the heat sink and thereafter mold them with resin.

The above-mentioned embodiment has been described on the basis of the application to the micro-relay chip. However, the present invention is not always limited to this, and it is of course acceptable to apply the present invention to another electronic component chips whose internal component generates heat.

INDUSTRIAL APPLICABILITY

The micro-relay of the present invention can be applied not only to the aforementioned embodiments but also to other electronic components such as matrix relays and micro-relay chips.

What is claimed is:

1. A micro-relay characterized by providing a thin plate-shaped substrate comprised of a monocrystal with a driving means, supporting on a base both ends of a movable piece at least one surface of which is provided with at least one movable-contact and curving the movable piece via the driving means, thereby bringing the movable contact in and out of contact with a fixed contact that faces the movable contact, for making and breaking an electric circuit, wherein said movable contact is pivotally supported via a pair of hinge portions.

2. A micro-relay as claimed in claim 1, wherein said thin plate-shaped substrate is connected and integrated with an opening edge portion of a box-shaped base comprised of a handle wafer via an insulating film, and the movable piece is formed by cutting a pair of slits through said thin plate-shaped substrate.

3. A micro-relay as claimed in claim 2, wherein said thin plate-shaped substrate is formed with a connecting use opening portion in a position to a connecting pad of the fixed contact provided on a bottom surface of the handle wafer.

4. A micro-relay as claimed in claim 3, wherein an inside surface of the connecting use opening portion is covered with an insulating film.

5. A micro-relay as claimed in any one of claims 2 through 4, wherein a cooling fin is formed on an upper surface of said thin plate-shaped substrate.

6. A micro-relay as claimed in claim 1 wherein a pair of pivot axes that are coaxially provided projecting roughly from a center portion between both side edge portions of the movable contact are supported on the base, one side of the thin plate-shaped substrate is previously curved and urged upward, the remaining side is previously curved and urged downward and the one side and the remaining side are simultaneously reversely buckled via the driving means, thereby alternately making and breaking two electric circuits.

7. A micro-relay as claimed in claim 1, wherein the driving means is a piezoelectric element laminated on one surface of the thin plate-shaped substrate.

8. The micro-relay as claimed in anyone of claim 2, wherein a root portion of the movable piece is provided with a radius for alleviating stress concentration.

9. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein the driving means is a heater layer formed on one surface of the thin plate-shaped substrate.

10. The micro-relay of claim 9, further comprising a driving layer formed by laminating a metal material on the heater layer via an insulating film.

11. The micro-relay of claim 9, wherein the heater layer of the driving means is comprised of a metal material selected from the group consisting of platinum, titanium, and polysilicon laminated on the one surface of the thin plate-shaped substrate via an insulating film.

12. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein the driving means is a heater section comprised of a diffused resistor formed inside the thin plate-shaped substrate.

13. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein an insulating film is formed on at least one of a front surface or a rear surface of the movable piece, the surface being formed with the movable contact.

14. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein silicon compound films that are made of a silicon oxide film, a silicon nitride film or the like and have different thickness values are formed on the front and rear surfaces of the movable piece.

15. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein a silicon compound films selected from the group consisting of that are made of a silicon oxide film, a silicon nitride film or the like give at least one side of the movable piece a compressive stress in proximity to a critical value at which driving starts.

16. A micro-relay as claimed in claim 15, wherein at least one adiabatic slit is formed near both end portions of the movable piece.

17. A micro-relay as claimed in claim 16, wherein the adiabatic slit is filled with a polymer material having low heat conductivity.

18. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein the movable piece is extended across the base via an adiabatic silicon compound portion formed in both end portions of the movable piece.

19. A micro-relay as claimed in claim 18, wherein the movable piece is provided with a slit in the vicinity of the movable contact, and a pair of hinge portions for pivotally supporting the movable contact are coaxially formed.

20. A micro-relay characterized by providing a thin plate-shaped substrate comprised of a monocrystal with a driving means, supporting on a base both ends of a movable piece at least one surface of which is provided with at least one movable contact and curving the movable piece via the driving means, thereby bringing the movable contact in and out of contact with a fixed contact that faces the movable contact, for making and breaking an electric circuit, wherein the movable piece is previously curved and urged so as to bring a movable contact provided on its one surface in contact with a fixed contact that faces the movable contact.

21. A matrix relay characterized by providing a thin plate-shaped substrate comprised of a monocrystal with a driving means, arranging in parallel a plurality of movable pieces in an insulated state whose one surface is provided with a movable contact, fixing and supporting on an base both ends of the movable pieces, and individually curving the movable pieces via the driving means, thereby bringing the movable contact in and out of contact with a fixed contact formed on a ceiling surface of a cover positioned above the base, for making and breaking an electric circuit, wherein an upper portion of the through hole exposed to the surface of the cover is electrically connected to a connecting pad provided on the surface of the cover via a printed wiring line formed on the surface of the cover.

22. A matrix relay characterized by providing a thin plate-shaped substrate comprised of a monocrystal with a driving means, arranging in parallel a plurality of movable pieces in an insulated state whose one surface is provided with a movable contact, fixing and supporting on an base both ends of the movable pieces, and individually curving the movable pieces via the driving means, thereby bringing the movable contact in and out of contact with a fixed contact formed on a ceiling surface of a cover positioned above the base, for making and breaking an electric circuit, wherein said movable contact is pivotally supported via a pair of hinge portions.

23. A matrix relay as claimed in claim 22, wherein the driving means is a piezoelectric element laminated on one surface of the thin plate-shaped substrate.

24. A matrix relay characterized by providing a thin plate-shaped substrate comprised of a monocrystal with a driving means, arranging in parallel a plurality of movable pieces in an insulated state whose one surface is provided with a movable contact, fixing and supporting on an base both ends of the movable pieces, and individually curving the movable pieces via the driving means, thereby bringing the movable contact in and out of contact with a fixed contact formed on a ceiling surface of a cover positioned above the base, for making and breaking an electric circuit, wherein the driving means is comprised of a heater layer formed on one surface of the thin plate-shaped substrate.

25. The matrix relay of claim 24, further comprising a driving layer formed by laminating a metal material on the heater layer via an insulating film.

26. A matrix relay characterized by providing a thin plate-shaped substrate comprised of a monocrystal with a driving means, arranging in parallel a plurality of movable pieces in an insulated state whose one surface is provided with a movable contact, fixing and supporting on an base both ends of the movable pieces, and individually curving the movable pieces via the driving means, thereby bringing the movable contact in and out of contact with a fixed contact formed on a ceiling surface of a cover positioned above the base, for making and breaking an electric circuit, wherein the driving means is made electrically connectable on a surface of the cover via a through hole provided at the cover.

27. A matrix relay characterized by providing a thin plate-shaped substrate comprised of a monocrystal with a driving means, arranging in parallel a plurality of movable pieces in an insulated state whose one surface is provided with a movable contact, fixing and supporting on an base both ends of the movable pieces, and individually curving the movable pieces via the driving means, thereby bringing the movable contact in and out of contact with a fixed contact formed on a ceiling surface of a cover positioned above the base, for making and breaking an electric circuit, wherein the fixed contact is made electrically connectable on a front surface of the cover via a through hole provided at the cover.

* * * * *

UNITED STATES PATENT AND TRADEMARK OFFICE
CERTIFICATE OF CORRECTION

PATENT NO.    : 6,407,482 B2
DATED         : June 18, 2002
INVENTOR(S)   : Minoru Sakata et al.

It is certified that error appears in the above-identified patent and that said Letters Patent is hereby corrected as shown below:

Column 2,
Line 32, change "is hard to receive" to -- is resistant to --
Line 50, change "by the semiconductor" to -- by semiconductor --

Column 3,
Line 8, change "is not interfered by" to -- is not interfered with --

Column 5,
Line 3, change "heat is hard to be" to -- less heat will be --
Line 64, change "the fatigue failure is hard to occur" to -- fatigue failure is reduced --

Column 6,
Line 1, change "relay that is hard to receive" to -- relay resistant to --
Line 38, change "that is easy to radiate heat and able to" to -- that radiates heat well and is able to --
Line 39, change "and a variation" to -- and variation --
Line 50, change "makes simple connecting work" to -- makes connecting work simple --
Line 54, change "and the productivity" to -- and productivity --
Line 58, change "feature, the heat" to -- feature, heat --
Line 60, change "preventing the malfunction" to -- preventing malfunction --

Column 9,
Line 4, change "parallel for constituting" to -- parallel constituting --
Line 64, change "that the connection" to -- that connection --

Column 11,
Line 14, change "a movable" to -- movable --

Column 13,
Line 2, change "the process to the" to -- the process of the --

Column 14,
Line 12, change "then the driving" to -- the driving --

UNITED STATES PATENT AND TRADEMARK OFFICE
CERTIFICATE OF CORRECTION

PATENT NO. : 6,407,482 B2
DATED : June 18, 2002
INVENTOR(S) : Minoru Sakata et al.

It is certified that error appears in the above-identified patent and that said Letters Patent is hereby corrected as shown below:

Column 17,
Line 5, change "is inputted" to -- is applied --
Line 21, change "small power" to -- low power --
Line 33, change "is prevented for the prevention of the occurrence of a variation" to
-- is eliminated for the prevention of variation --
Line 35, change "arranged parallel" to -- arranged in parallel --
Line 66, change "heats, the silicon" to -- heat, the silicon --

Column 21,
Line 49, change "wiring line" to -- wiring lines --

Column 22,
Lines 3 and 11, change "wiring line" to -- wiring lines --

Signed and Sealed this

Fifteenth Day of April, 2003

JAMES E. ROGAN
*Director of the United States Patent and Trademark Office*